US012804889B2

(12) United States Patent
Lee et al.

(10) Patent No.: US 12,804,889 B2
(45) Date of Patent: Nov. 17, 2026

(54) SEMICONDUCTOR DEVICES

(71) Applicant: SAMSUNG ELECTRONICS CO., LTD., Suwon-si (KR)

(72) Inventors: Kiseok Lee, Suwon-si (KR); Chansic Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 327 days.

(21) Appl. No.: 18/405,026

(22) Filed: Jan. 5, 2024

(65) Prior Publication Data

US 2024/0324186 A1 Sep. 26, 2024

(30) Foreign Application Priority Data

Mar. 21, 2023 (KR) ........................ 10-2023-0036327

(51) Int. Cl.
*H10B 12/00* (2023.01)

(52) U.S. Cl.
CPC ....... *H10B 12/485* (2023.02); *H10B 12/0335* (2023.02); *H10B 12/053* (2023.02); *H10B 12/315* (2023.02); *H10B 12/34* (2023.02)

(58) Field of Classification Search
CPC .............. H10B 12/485; H10B 12/0335; H10B 12/053; H10B 12/315; H10B 12/34; H10B 12/482; H10B 12/02; H10B 12/36
USPC .......................................................... 257/296
See application file for complete search history.

(56) References Cited

U.S. PATENT DOCUMENTS 8,319,264 B2 11/2012 Kim
9,230,612 B2 1/2016 Park
9,871,045 B2 1/2018 Yeom et al.
2008/0197392 A1* 8/2008 Sakoh .................... H10D 89/10 257/296

(Continued)

FOREIGN PATENT DOCUMENTS

KR 10-0825814 B1 4/2008
KR 10-1140093 B1 4/2012

(Continued)

OTHER PUBLICATIONS

Office Action in Taiwanese Appln. No. 113101140, mailed on Nov. 27, 2024, 14 pages (with Machine translation).

(Continued)

*Primary Examiner* — Tong-Ho Kim
(74) *Attorney, Agent, or Firm* — Fish & Richardson P.C.

(57) ABSTRACT

A semiconductor device includes active patterns on a substrate, gate structures in recesses of the active patterns and extending in the first direction, first contact plugs electrically connected to opposite edge portions of each of the active patterns, respectively, the first contact plugs being spaced apart from each other in each of the first and second directions and aligned in each of the first and second directions, first insulation spacers surrounding sidewalls of the first contact plugs, the first insulation spacers filling spaces between the first contact plugs in the second direction, a bit line structure filling an opening extending in the second direction between the first insulation spacers, the bit line structure contacting central portions of the active patterns, and a capacitor electrically connected to each of the first contact plugs.

19 Claims, 52 Drawing Sheets

(56) References Cited

U.S. PATENT DOCUMENTS

| | | | | |
|---|---|---|---|---|
| 2016/0035731 A1* | 2/2016 | Lee | H10B 12/315 257/334 |
| 2016/0056159 A1* | 2/2016 | Kim | H10B 12/315 257/532 |
| 2022/0173107 A1* | 6/2022 | Moon | H10B 12/315 |
| 2022/0189966 A1* | 6/2022 | Jang | H10B 12/0335 |

FOREIGN PATENT DOCUMENTS

| | | | |
|---|---|---|---|
| KR | 10-2013-0022872 | A | 3/2013 |
| KR | 10-1888964 | B1 | 8/2018 |
| KR | 10-1928310 | B1 | 12/2018 |
| KR | 10-2022-0144265 | A | 10/2022 |

OTHER PUBLICATIONS

Office Action in Korean Appln. No. 10-2023-0036327, mailed on Sep. 8, 2026, 14 pages (with English translation).

* cited by examiner

SEMICONDUCTOR DEVICES

CROSS-REFERENCE TO RELATED APPLICATION

This application claims priority under 35 USC § 119 to Korean Patent Application No. 10-2023-0036327, filed on Mar. 21, 2023, in the Korean Intellectual Property Office (KIPO), the contents of which are incorporated by reference herein in their entirety.

BACKGROUND

1. Field

Example embodiments relate to semiconductor devices. Particularly, example embodiments relate to Dynamic Random Access Memory (DRAM) devices.

2. Description of the Related Art

A DRAM device may include gate structures extending in a first direction through upper portions of active patterns, bit line structures extending in a second direction perpendicular to the first direction while contacting portions of upper surfaces of the active patterns, contact plugs on edges of the active patterns, and capacitors electrically connected to the contact plugs, respectively. In order to increase integration of the DRAM device, an optimization of arrangements of the gate structures, the bit line structures, the contact plugs, and the capacitors on the active patterns may be required.

SUMMARY

According to example embodiments, there is provided a semiconductor device. The semiconductor device may include an active array including a plurality active pattern row on a substrate, each of the active pattern rows having active patterns spaced apart from each other in a first direction parallel to an upper surface of the substrate, and the active pattern rows spaced apart from each other in a second direction perpendicular to the first direction, wherein the active patterns extend in a third direction oblique to the first direction and disposed to be aligned in the third direction; gate structures in recesses of each of the active patterns, and each of the gate structures extending in the first direction; first contact plugs electrically connected to both edge portions of each of the active patterns, respectively, and the first contact plugs spaced apart from each other in each of the first and second directions and disposed to be aligned in each of the first and second directions; first insulation spacers surrounding sidewalls of the first contact plugs, and the first insulation spacers filling spaces between the first contact plugs arranged in the second direction; a bit line structure filling an opening extending in the second direction between the first insulation spacers, and the bit line structure contacting central portions of the active patterns; and a capacitor electrically connected to each of the first contact plugs.

According to example embodiments, there is provided a semiconductor device. The semiconductor device may include an active array including a plurality active pattern row on a substrate, each of the active pattern rows having active patterns spaced apart from each other in a first direction parallel to an upper surface of the substrate, and the active pattern rows spaced apart from each other in a second direction perpendicular to the first direction, wherein central portions of active patterns included in different active pattern rows are arranged to be aligned in the second direction; gate structures in recesses of each of the active patterns, and each of the gate structures extending in the first direction; first contact plugs electrically connected to both edge portions of each of the active patterns, respectively, and the first contact plugs spaced apart from each other in each of the first and second directions and disposed to be aligned in each of the first and second directions; first insulation spacers surrounding sidewalls of the first contact plugs, and the first insulation spacers filling spaces between the first contact plugs arranged in the second direction; a bit line structure filling an opening extending in the second direction between the first insulation spacers, and the bit line structure contacting the central portions of the active patterns; a landing pad pattern on an upper surface of each of the first contact structures; and a capacitor on the landing pad pattern. The bit line structure includes first portions having a first width and second portions having a width greater than the first width, and the first portion and the second portion are alternately and repeatedly disposed.

According to example embodiments, there is provided a semiconductor device. The semiconductor device may include active patterns on a substrate; first contact structures electrically connected to at least portions of both edge portions of each of the active patterns, respectively, and the first contact plugs spaced apart from each other in each of the first and second directions and disposed to be aligned in each of the first and second directions; first insulation spacers surrounding sidewalls of the first contact structures, and the first insulation spacers filling spaces between the first contact structures arranged in the second direction; a bit line structure filling an opening extending in the second direction between the first insulation spacers, the bit line structure including first portions having a first width and second portions having a width greater than the first width, the first portion and the second portion being alternately and repeatedly disposed, and the second portions of the bit line structure contacting central portions of the active patterns; and a capacitor electrically connected to the first contact structure.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described in detail with reference to the accompanying drawings.

Figure 1:
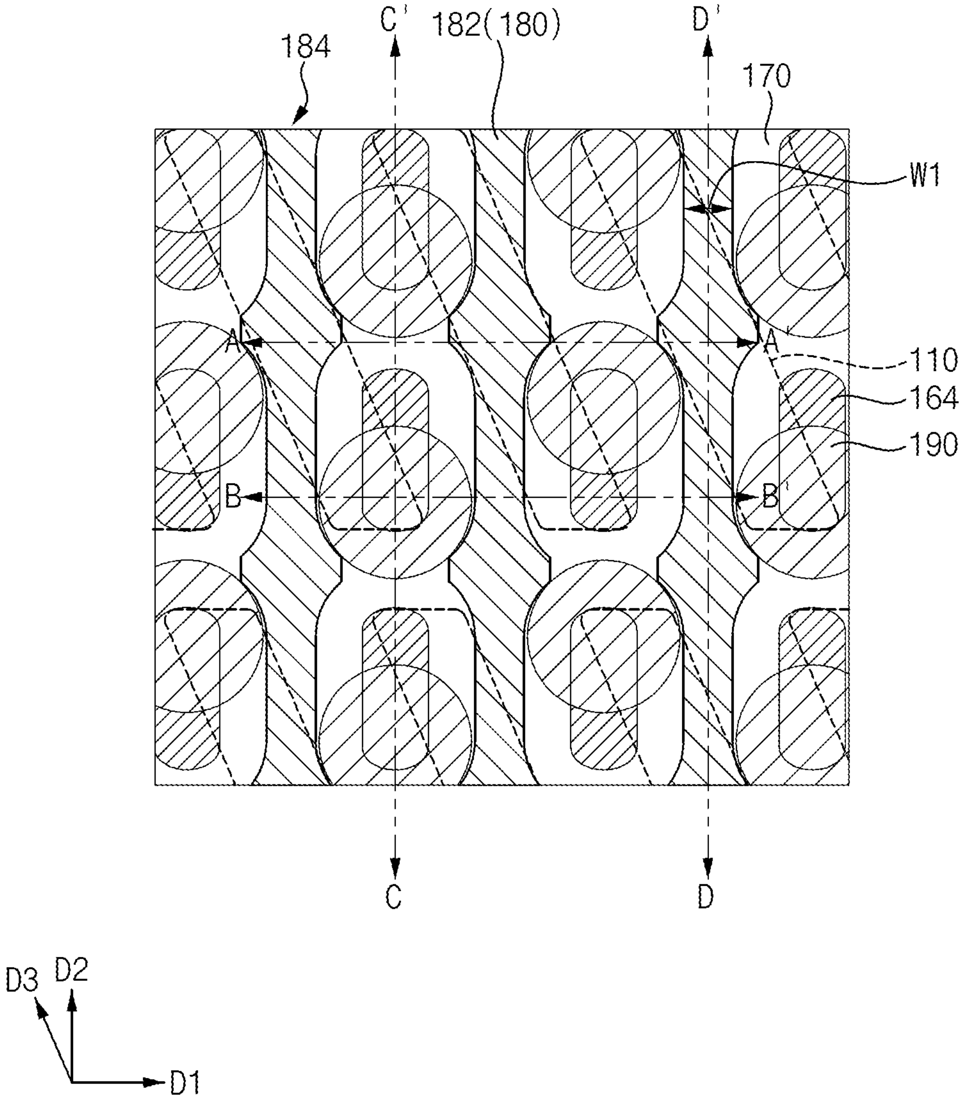
FIGS. 1 to 3 are a plan view and cross-sectional views illustrating a semiconductor device according to example embodiments.
Figure 2:
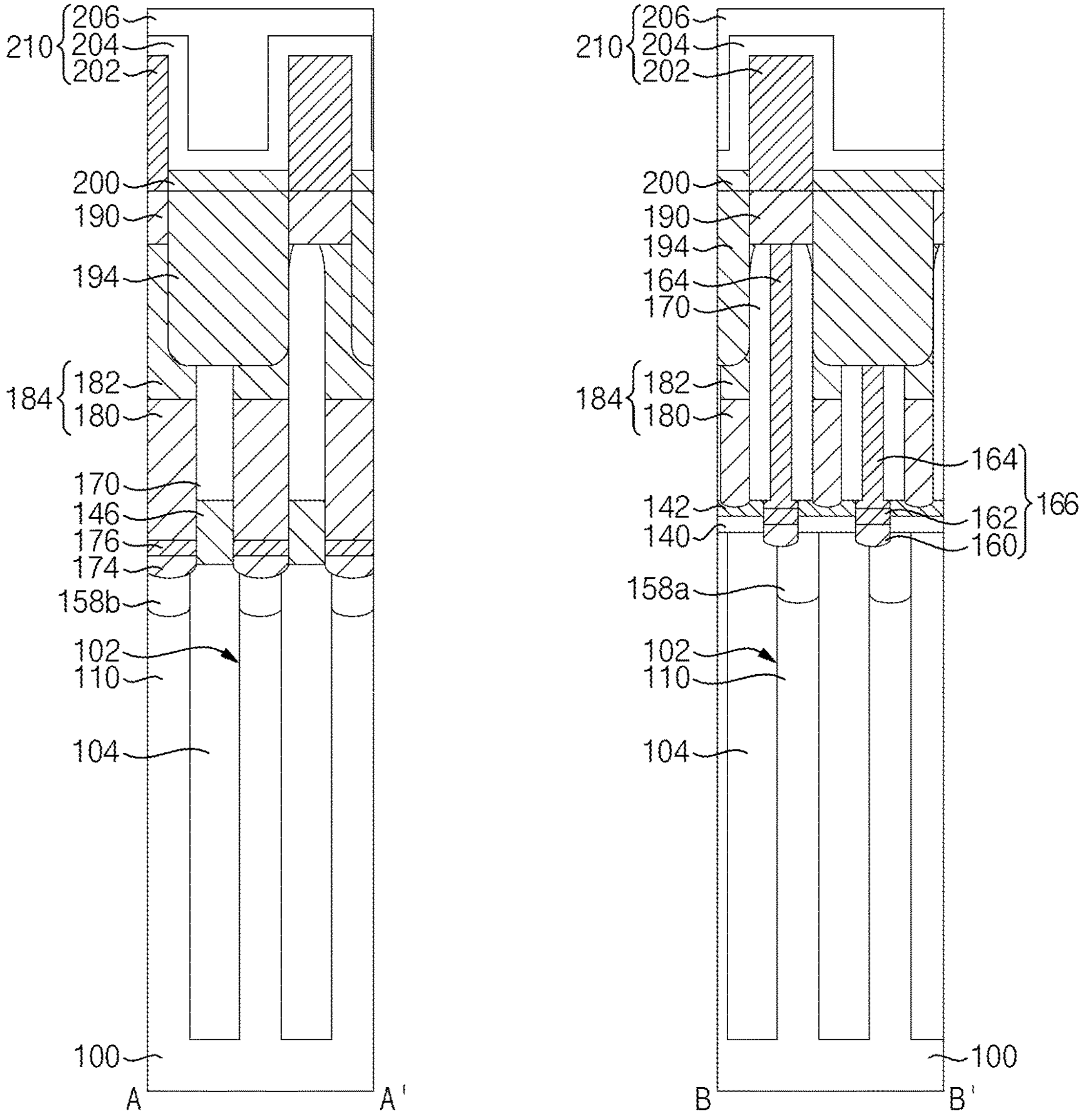
Figure 3:
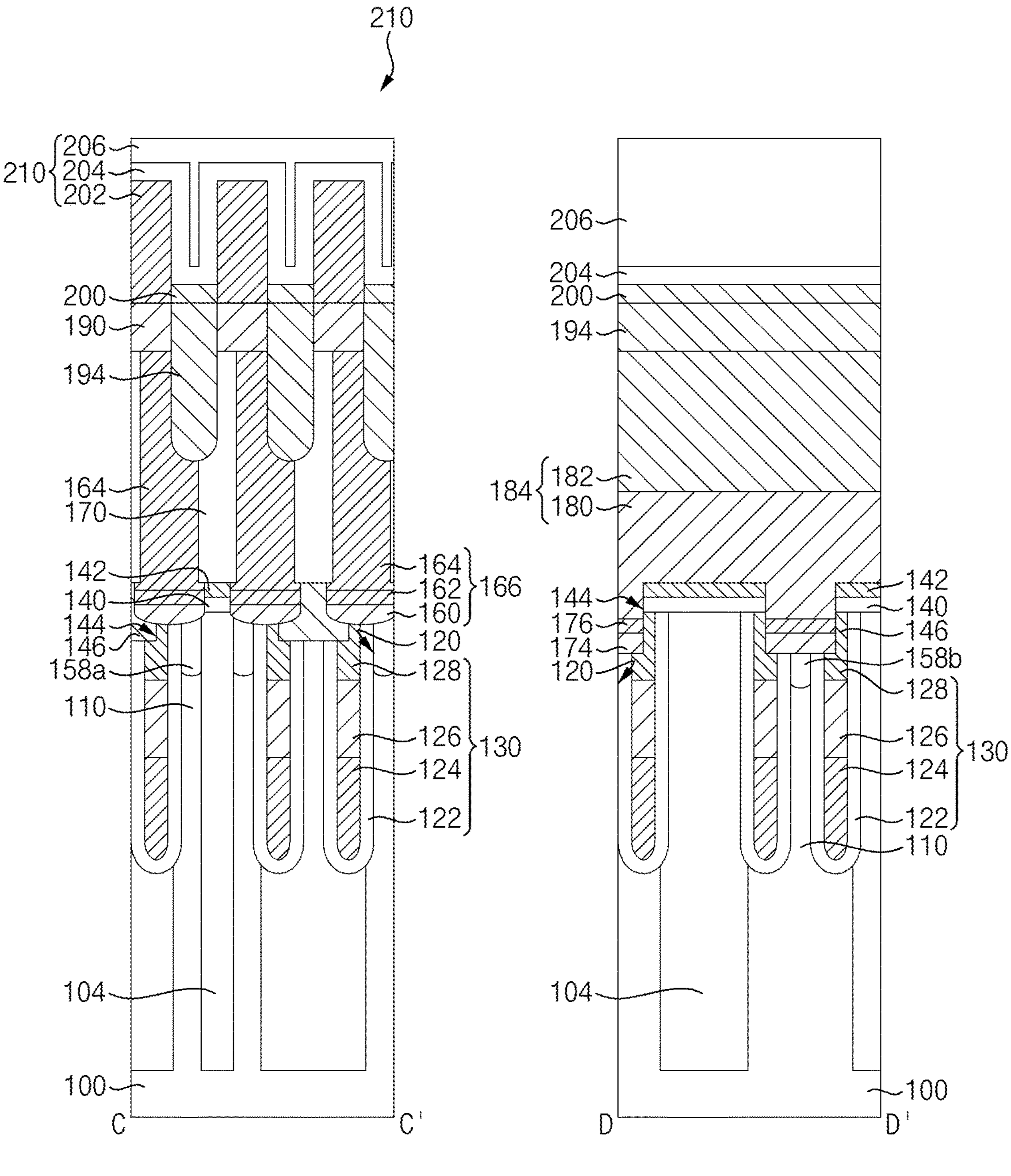
Figure 4:
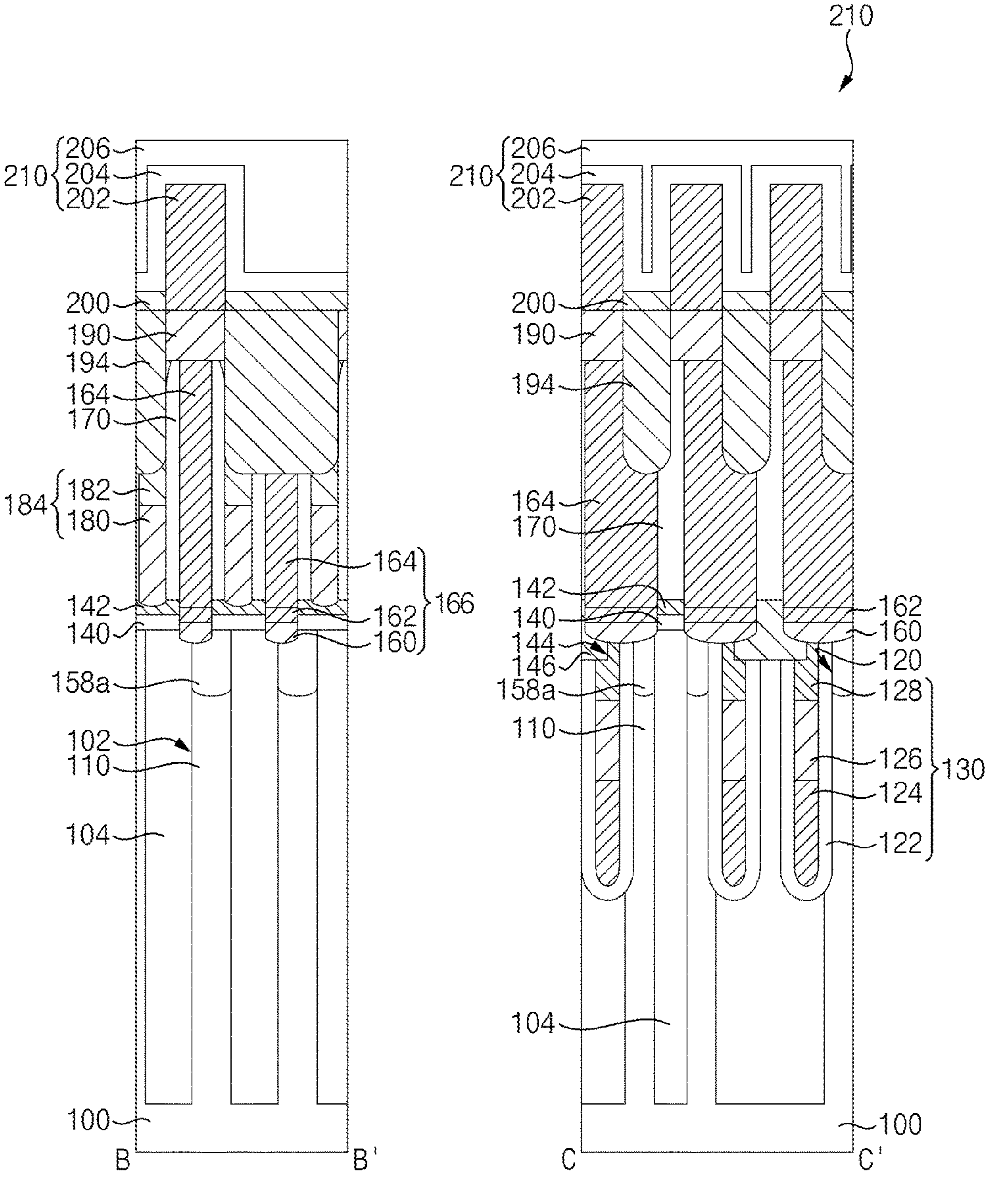
FIG. 4 is a cross-sectional view illustrating a semiconductor device according to some example embodiments.
Figure 5:
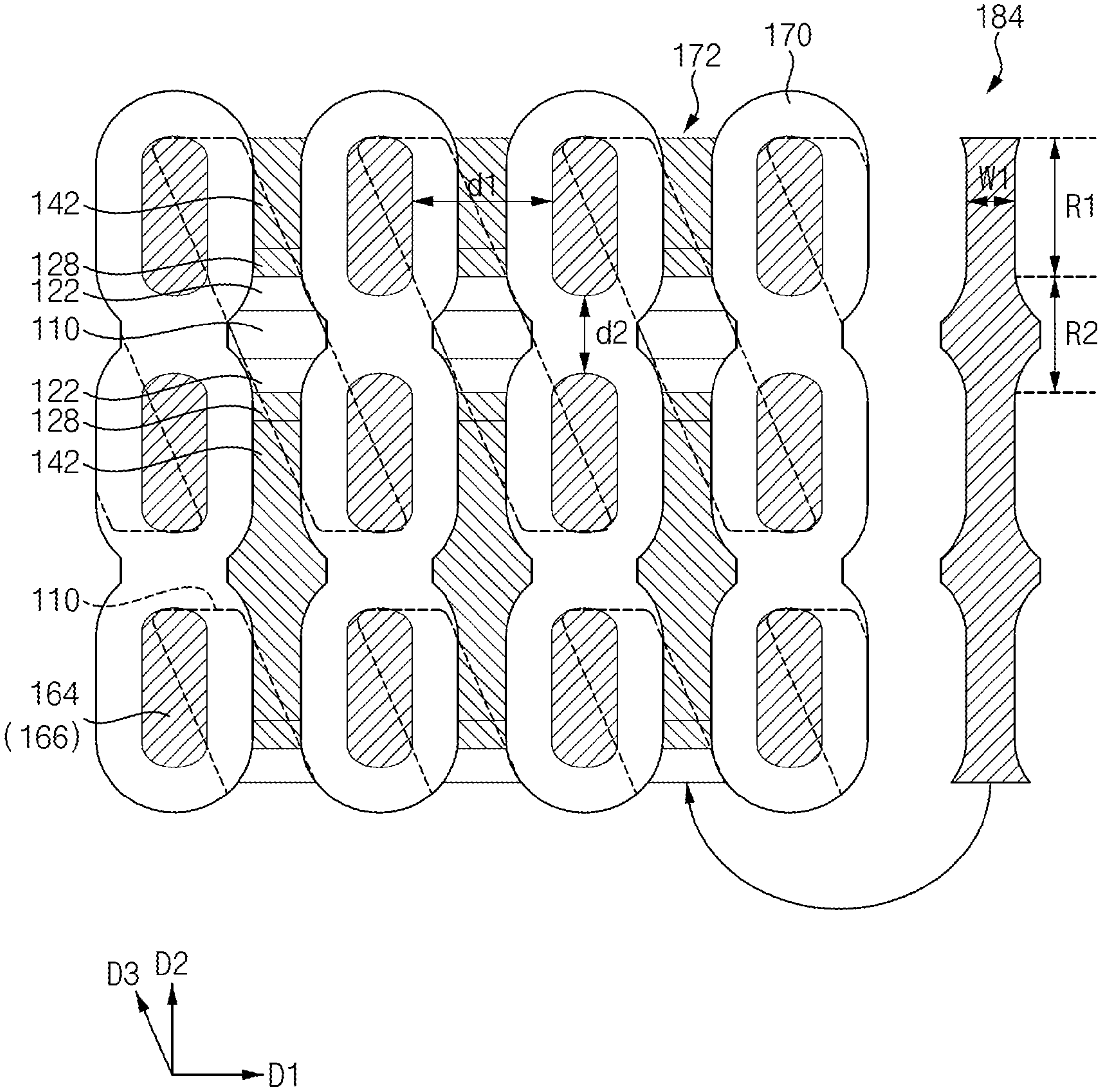
FIG. 5 is a plan view illustrating shapes of a first opening and a bit line structure in a semiconductor device according to example embodiments.
Figure 6:
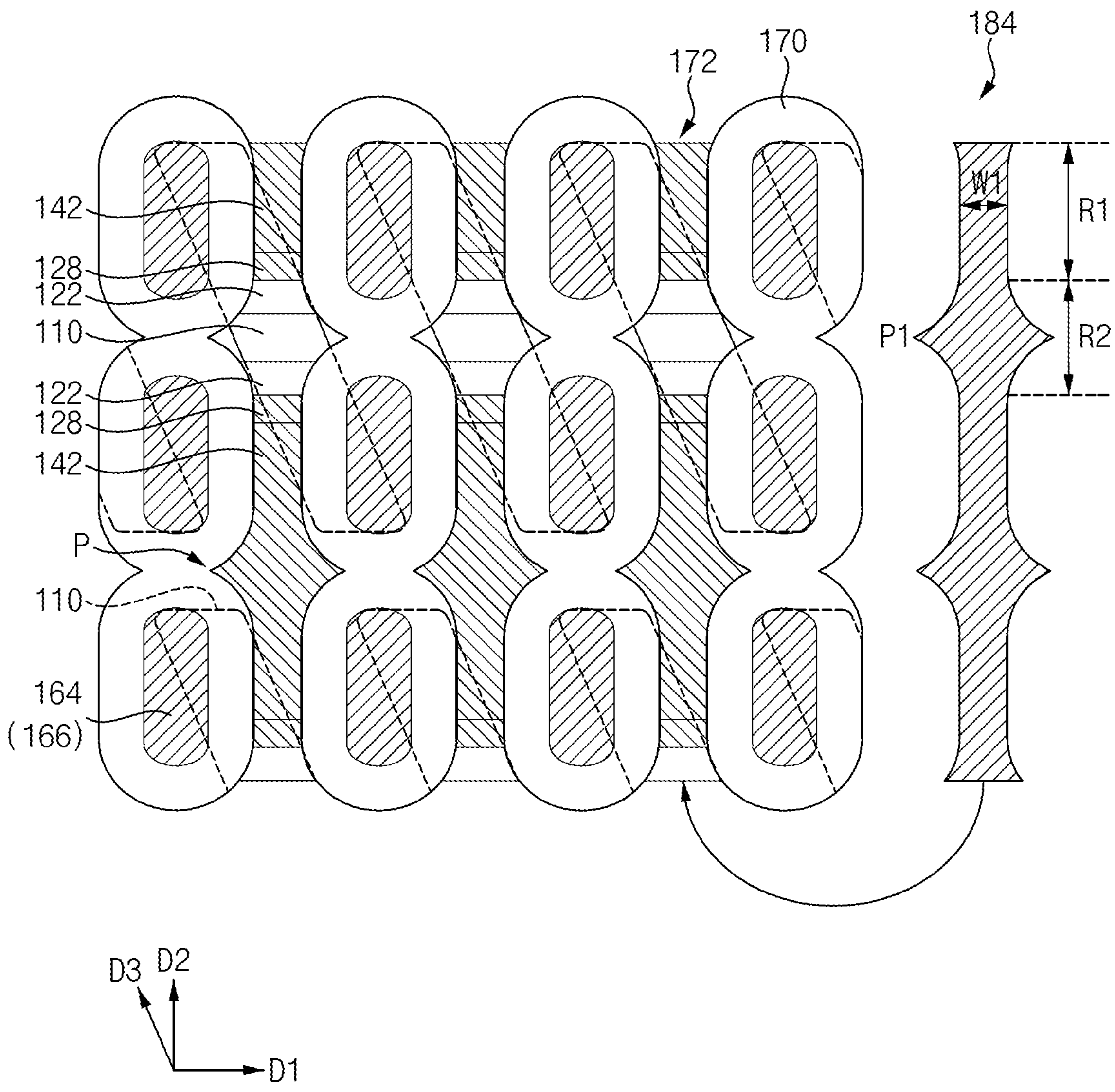
FIG. 6 is a plan view illustrating shapes of a first opening and a bit line structure in a semiconductor device according to some example embodiments.

FIGS. 1 to 3 are a plan view and cross-sectional views illustrating a semiconductor device according to example embodiments. FIG. 4 is a cross-sectional view illustrating a semiconductor device according to some example embodiments. FIG. 5 is a plan view illustrating shapes of a first opening and a bit line structure in a semiconductor device according to example embodiments. FIG. 6 is a plan view illustrating shapes of a first opening and a bit line structure in a semiconductor device according to some example embodiments.

In detail, FIG. 2 illustrates cross-sectional views taken along lines A-A' and B-B' of FIG. 1 FIG. 3 illustrates cross-sectional views taken along lines C-C' and D-D' of FIG. 1. FIG. 4 illustrates cross-sectional view taken along lines B-B' and C-C' of FIG. 1. FIGS. 5 and 6, illustrate enlarged plan views of bit line structure formed in the first openings (right portions of figures). In order to avoid drawing complexity, some components (e.g., gate structures and capacitors) are omitted from FIGS. 1, 5, and 6.

In the description below, two directions parallel to an upper surface of a substrate and perpendicular to each other are defined as first and second directions D1 and D2, respectively. In addition, a direction parallel to the upper surface of the substrate and oblique with respect to the first direction D1 is defined as a third direction D3 (e.g., an oblique direction).

Referring to FIGS. 1 to 3, an isolation trench 102 and active patterns 110 may be formed on a substrate 100. An isolation layer 104 may be formed in the isolation trench 102. The isolation layer 104 may cover sidewalls of the active patterns 110.

For example, the substrate 100 may include a semiconductor material, e.g., silicon, germanium, or silicon-germanium, or a III-V compound, e.g., GaP, GaAs, or GaSb. In some example embodiments, the substrate 100 may be a Silicon On Insulator (SOI) substrate or a Germanium On Insulator (GOI) substrate.

A protruding portion of the substrate 100 between the isolation trenches 102 is defined as the active pattern 110, and the active pattern 110 may include substantially the same material as the substrate 100. The isolation layer 104 may include an insulation material, e.g., silicon oxide.

The active pattern 110 may have an isolated shape extending in the third direction D3. The active patterns 110 may be spaced apart from each other in the first direction D1 to form an active pattern row. The active pattern rows may be spaced apart from each other in the second direction D2 to form an active pattern array. The active patterns 110 included in the active pattern row may be aligned in the first direction D1. Both ends (e.g., opposite ends) of the active patterns 110 included in the active pattern row may be arranged in the first direction D1 to be aligned in the first direction D1. In addition, the active patterns 110 may be disposed to be aligned in the third direction D3, and may be spaced apart from each other in the third direction D3. For example, each of the active patterns 110 included in neighboring active pattern rows may be aligned in the third direction D3.

For example, in a plan view (e.g., FIG. 1), a lower end of the active pattern 110 is referred to as a first end, and an upper end is referred to as a second end. Accordingly, the first ends of the active patterns 110 may be aligned in the first direction D1, and the second ends of the active patterns 110 may be aligned in the first direction D1. In addition, the central portions (i.e., central portions in the third direction) of the active patterns 110 included in different active pattern rows may be aligned in the second direction D2.

In example embodiments, the active patterns 110 may have a shape in which active lines extending in the third direction D3 are cut along the first direction D1. Each of the first and second ends of the active pattern 110 may have a straight line shape in the first direction D1. In some example embodiments, each of the first and second ends of the active pattern 110 may have a rounded shape.

A first recess 120 extending in the first direction D1 may be at upper portions of the active pattern 110 and the isolation layer 104. A gate structure 130 may be formed in the first recess 120. The gate structure 130 may be formed through the upper portions of the active pattern 110 and the isolation layer 104.

The gate structure 130 may extend in the first direction D1 while crossing the plurality of active patterns 110. Two gate structures 130 spaced apart from each other may be disposed on each of the active patterns 110.

Accordingly, an upper surface of each of the active patterns 110 may be divided into a central portion between the two gate structures 130, and first and second edge portions adjacent to outer portions of each of gate structures 130. Hereinafter, in the plan view, a lower edge of the active pattern 110 is referred to as a first edge portion, and an upper edge of the active pattern 110 is referred to as a second edge portion.

First impurity regions 158*a* may be formed at upper portions of the first and second edge portions of the active pattern 110, respectively. A second impurity region 158*b* may be formed at an upper portion of the central portion of the active pattern 110. The first and second impurity regions 158*a* and 158*b* may be doped with, e.g., n-type impurities.

In example embodiments, a first spacing a1 (FIG. 15) in the second direction D2 between the two gate structures 130 on the same active pattern 110 may be different from a second distance a2 (FIG. 15) in the second direction D2 between two neighboring gate structures 130 on neighboring different active patterns 110. For example, the first spacing a1 in the second direction D2 may be less than the second spacing a2 in the second direction D2.

In example embodiments, the gate structure 130 may include a gate insulation pattern 122, a first gate pattern 124, a second gate pattern 126, and a gate mask 128.

For example, the gate insulation pattern 122 may include an oxide, e.g., silicon oxide. The first gate pattern 124 may include a metal, and the second gate pattern 126 may include polysilicon. The metal of the first gate pattern 124 may include, e.g., tungsten. The gate mask 128 may include a nitride, e.g., silicon nitride.

Figure 16:
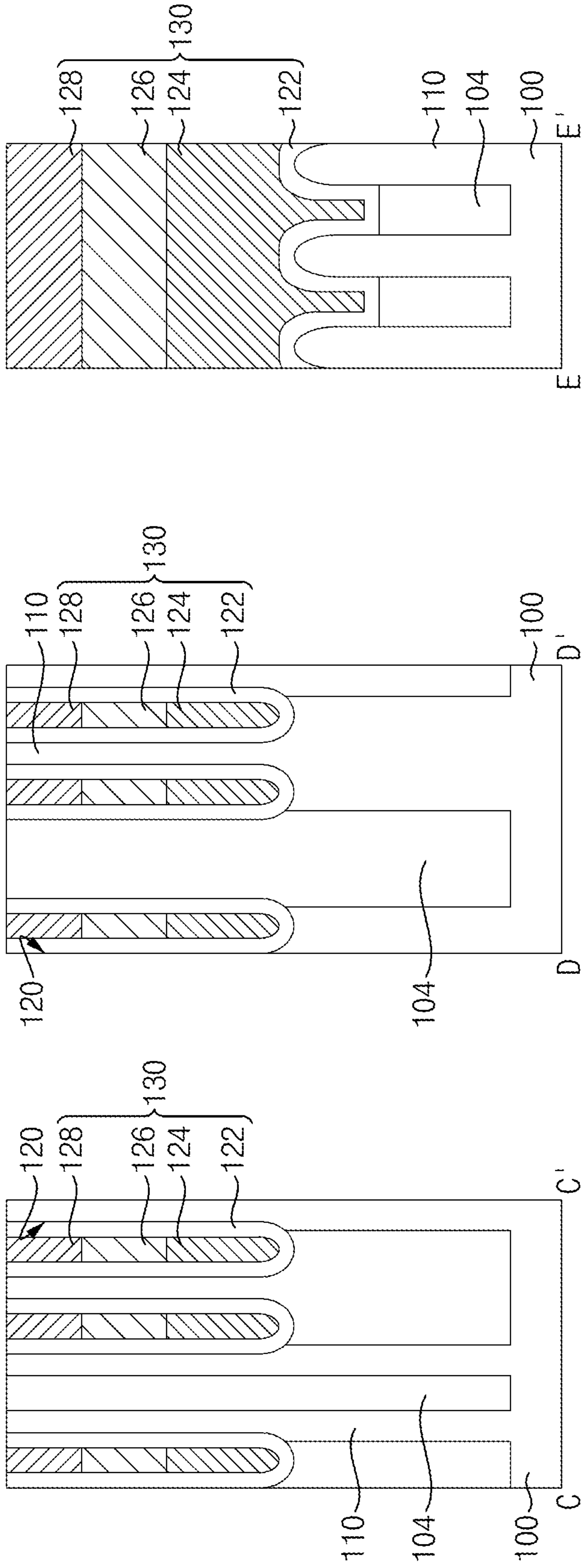

In example embodiments, as shown in FIG. 16, the gate insulation pattern 122 may be further formed on the upper surface and sidewalls of the active pattern 110 below the first recess 120. Accordingly, the gate structure 130 may serve as a gate of a fin field effect transistor (fin-FET).

A first buffer layer 140 and a second buffer layer 142 may be stacked on the active pattern 110, the isolation layer 104, and the gate structure 130. A first sacrificial mold layer pattern 146 may be formed on a portion of the isolation layer 104.

The first buffer layer 140 and the second buffer layer 142 may include insulation materials. The first buffer layer 140 may include a material having a high etching selectivity with respect to a material of the second buffer layer 142. In example embodiments, the first buffer layer 140 may include silicon oxide, and the second buffer layer 142 may include silicon nitride. The first sacrificial mold layer pattern 146 may include a material that may be selectively etched with respect to the second buffer layer 142. The first sacrificial mold layer pattern 146 may include, e.g., SiOC.

Referring to FIG. 5 together, a first contact structure 166 may be formed on each of the first and second edge portions of the active pattern 110. The first contact structures 166 may contact a portion of the first edge portion of the active pattern 110 and a portion of the second edge portion of the active pattern 110, respectively. Accordingly, the first contact structures 166 may be electrically connected to the first and second edge portions of the active pattern 110, respectively. The first contact structure 166 may pass through the first and second buffer layers 140 and 142 and the first sacrificial mold layer pattern 146.

First one of the first contact structures 166 may contact the first edge portion of the active pattern 110 and an upper surface of the gate structure 130 adjacent thereto. Second one of the first contact structures 166 may contact the second edge portion of the active pattern 110 and the upper surface of the gate structure 130 adjacent thereto.

In example embodiments, the first contact structures 166 aligned in the second direction D2 may contact edges of different active patterns 110, respectively. In example embodiments, the first one of the first contact structures 166 contacting the first edge portion of the active pattern 110 and the second one of the first contact structures 166 contacting the second edge portion of the active pattern 110 may be alternately and repeatedly arranged in the second direction D2.

The first contact structure 166 may include metal.

In example embodiments, the first contact structure 166 may include a first silicon layer 160, a first metal silicide pattern 162 on the first silicon layer 160, and a first contact plug 164 on the first metal silicide pattern 162. The first metal silicide pattern 162 may serve as a pattern for forming an ohmic contact structure. The first contact plug 164 may be electrically connected to the first impurity region **158*a* through the first metal silicide pattern 162 and the first silicon layer 160**.

In example embodiments, a stacked structure of the first silicon layer 160 and the first metal silicide pattern 162 may be positioned lower than an upper surface of the second buffer layer 142, e.g., an upper surface of the first silicon layer 160 may be lower than an upper surface of the second buffer layer 142 relative to the bottom of the substrate 100. Accordingly, only the first contact plug 164 in the first contact structure 166 may be positioned at a portion higher than the upper surface of the second buffer layer 142.

In example embodiments, the first silicon layer 160 may include silicon or polysilicon doped with impurities. The first metal silicide pattern 162 may include a metal silicide, e.g., cobalt silicide, nickel silicide, or titanium silicide. The first contact plug 164 may include metal, e.g., tungsten, niobium, copper, or aluminum.

For example, as illustrated in FIG. 2, a lower portion and an upper portion of the first contact plug 164 may have different widths. A sidewall of the first contact plug 164 may have a bent shape (e.g., a step profile) at a level of the upper surface of the second buffer layer 142. In the first contact plug 164, a portion higher than the upper surface of the second buffer layer 142 may have a width (e.g., in the first direction D1) less than a portion lower than the upper surface of the second buffer layer 142.

In another example, as illustrated in FIG. 4, upper and lower portions of the first contact plug 164 may have substantially the same width. In this case, the sidewall of the first contact plug 164 may not include the bent portion. The first contact plugs 164 may be aligned in the first direction D1, and may be aligned in the second direction D2.

As illustrated in FIG. 5, a space between the first contact plugs 164 in the first direction D1 may have a first distance d1, and a space between the first contact plugs 164 in the second direction D2 may have a second distance d2 less than the first distance d1. In example embodiments, a width in the second direction D2 of an upper surface of each of the first contact plugs 164 may be greater than a width in the first direction D1 of the upper surface of each of the first contact plugs 164.

An insulation spacer 170 may be formed on a sidewall of the first contact plug 164. Referring to FIG. 5, the insulation spacer 170 may not completely fill the space having the first distance d1 between the first contact plugs 164 spaced apart in the first direction D1. The insulation spacer 170 may completely fill the space having the second distance d2 between the first contact plugs 164 spaced apart in the second direction D2.

The insulation spacer 170 may surround the sidewalls of the first contact plugs 164, e.g., the insulation spacer 170 may surround an entire perimeter of each first contact plug 164, and may fill the space between the first contact plugs 164 in the second direction D2. The insulation spacer 170 may be connected in the second direction D2, e.g., the insulation spacer 170 may extend continuously in the second direction D2 to surround each of the first contact plugs 164 and between adjacent ones of the first contact plugs 164. In addition, a first opening 172 extending in the second direction D2 and having a line shape may be formed by the insulation spacer 170 between the first contact plugs 164 in the first direction D1, e.g., the first opening 172 may extend continuously in the second direction D2 between two columns of the first contact plugs 164 that are adjacent to each other in the first direction D1.

In example embodiments, the insulation spacer 170 may include one insulation material. In some example embodiments, the insulation spacer 170 may include a plurality insulation materials laterally stacked on the sidewall of the first contact plugs 164. In some example embodiments, the insulation spacer 170 may include air. In example embodiments, the insulation spacer 170 may include silicon oxide, SiOCN, SiN, or the like.

The central portion of the active pattern 110, the second buffer layer 142, and the first sacrificial mold layer pattern 146 may be exposed by the first opening 172.

A second silicon layer 174 may be on the upper surface of the active pattern 110 exposed by a bottom of the first opening 172. The second silicon layer 174 may contact the central portion of the active pattern 110. A second metal silicide pattern 176 may be formed on the second silicon layer 174. The second metal silicide pattern 176 may serve as a pattern for forming an ohmic contact structure.

A bit line structure 184 filling the first opening 172 may be formed on the second metal silicide pattern 176 and the second buffer layer 142. The bit line structure 184 may include a bit line pattern 180 and a first capping layer pattern 182. The bit line pattern 180 may be electrically connected to the second impurity region **158*b* through the second metal silicide pattern 176 and the second silicon layer 174**.

In example embodiments, the bit line pattern 180 may include a metal material, e.g., tungsten, niobium, copper, or aluminum. For example, the bit line pattern 180 may include tungsten. The first capping layer pattern 182 may include, e.g., silicon nitride.

In the plan view, as illustrated in FIG. 5, both sidewalls of the bit line structure 184 may not have a straight line shape, e.g., may include non-linear or curved portions. In the plan view, both sides (e.g., opposite sidewalls) of the bit line structure 184 may have, e.g., a wave shape.

A sidewall profile of the bit line structure 184 may be substantially the same as a sidewall profile of the first opening 172. The bit line structure 184 may include first portions R1 having a first width W1 (e.g., in the first direction D1) and second portions R2 having a second width greater than the first width W1. In the bit line structure 184, the first portion R1 and the second portion R2 may be alternately and repeatedly disposed, e.g., along the second direction D2. The central portions of the active patterns 110 may contact the second portions R2 of the bit line structure 184.

In the plan view, each of the second portions R2 of the bit line structure 184 may include a portion having a gradually increasing width, a portion having a widest width, and a portion having a gradually decreasing width.

For example, as shown in FIG. 5, the portion having the widest width in the second portion of the first opening 172 may not include a cusp. As the bit line structure 184 may be formed in the first opening 172, both sides of the portions having the widest width in the second portion R2 of the bit line structure 184 may have a straight line shape extending in the second direction D2.

In another example, as shown in FIG. 6, a portion having the widest width in the second portion of the first opening 172 may include a cusp P. Therefore, both sides of the portions having the widest width in the second portion R2 of the bit line structure 184 may have cusps P1.

An uppermost surface of the first contact plug 164 may be coplanar with an uppermost surface of the bit line structure 184, as illustrated in FIG. 3.

Landing pad patterns 190 may be formed on upper surfaces of the first contact plugs 164, respectively. A second opening 192 may be disposed between the landing pad patterns 190. An upper insulation pattern 194 may be formed in the second opening 192.

The landing pad pattern 190 may include a metal, e.g., tungsten. The upper insulation pattern 194 may include nitride, e.g., silicon nitride.

In example embodiments, a bottom of the second opening 192 may be lower than at least the uppermost surface of the first contact plug 164, e.g., relative to the bottom of the substrate 100. Accordingly, an upper portion of the first contact plug 164 may have a recessed portion formed by an etching process. In the first contact plug 164, a width (e.g., an upper width) of a portion of the first contact plug 164 including the recessed portion may be less than a width (e.g., a lower width) of a portion of the first contact plug 164 below the recessed portion (e.g., in the second direction D2).

As the bottom of the second opening 192 is lower than the uppermost surface of the first contact plug 164, a bridge defect, in which the landing pad pattern 190 and the first contact plug 164 adjacent to the landing pad pattern 190 in a lateral direction are electrically connected to each other, may be decreased.

In example embodiments, the landing pad patterns 190 may be arranged in a honeycomb structure in which the landing pad patterns 190 are disposed at each vertex of the connected hexagon and at a center of the hexagon.

An etch stop layer 200 may be formed on the landing pad pattern 190 and the upper insulation pattern 194. The etch stop layer 200 may include silicon nitride.

A capacitor 210 may be disposed on the landing pad pattern 190 through the etch stop layer 200. The capacitor 210 may include a lower electrode 202, a dielectric layer 204, and an upper electrode 206. The lower electrode 202 may contact the landing pad pattern 190. Accordingly, the lower electrode 202 may be disposed in the honeycomb structure. In example embodiments, the lower electrode 202 may have a pillar shape or a cylinder shape.

Figure 7:
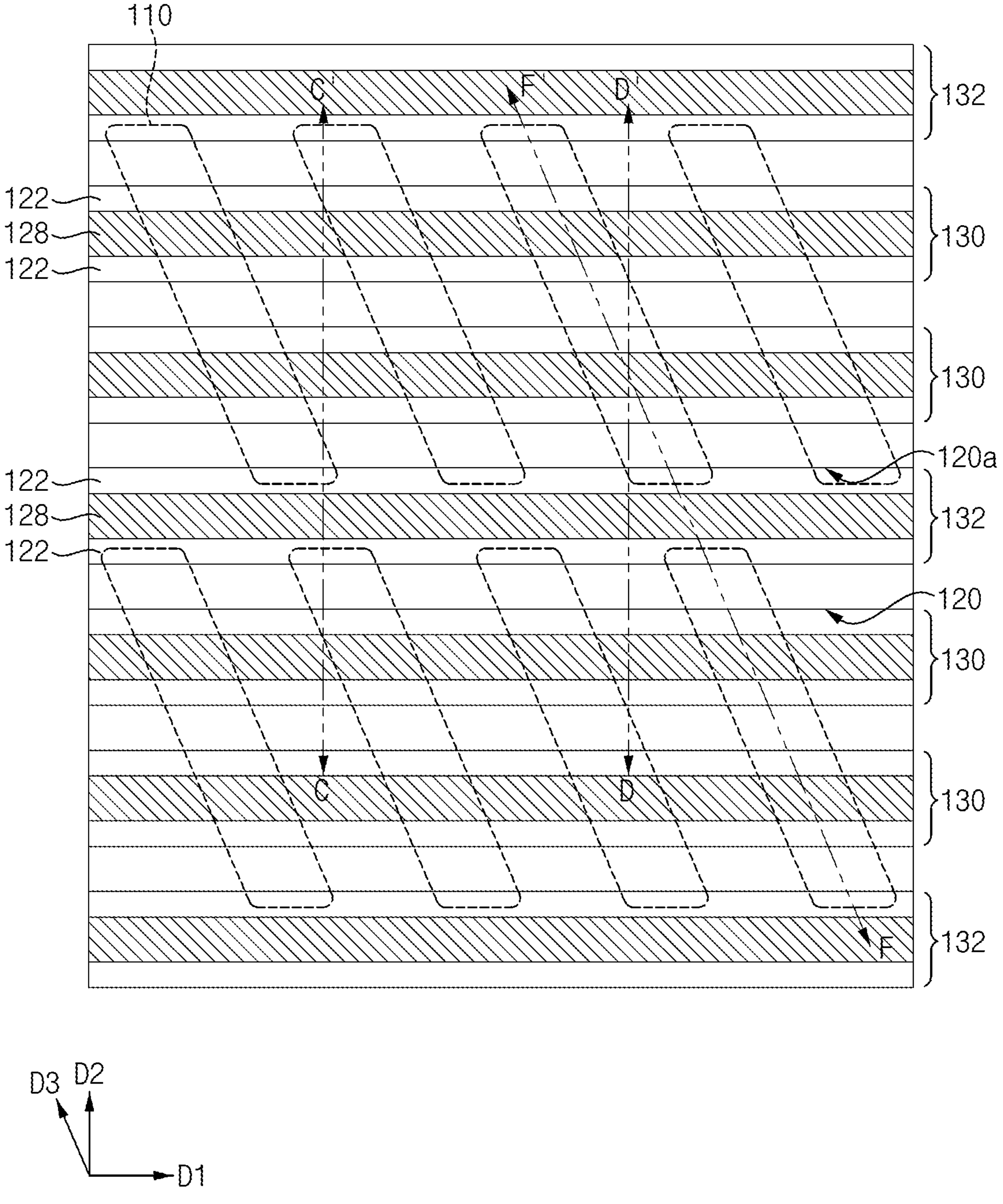
FIGS. 7 to 9 are plan views and cross-sectional views illustrating a semiconductor device according to example embodiments.
Figure 8:
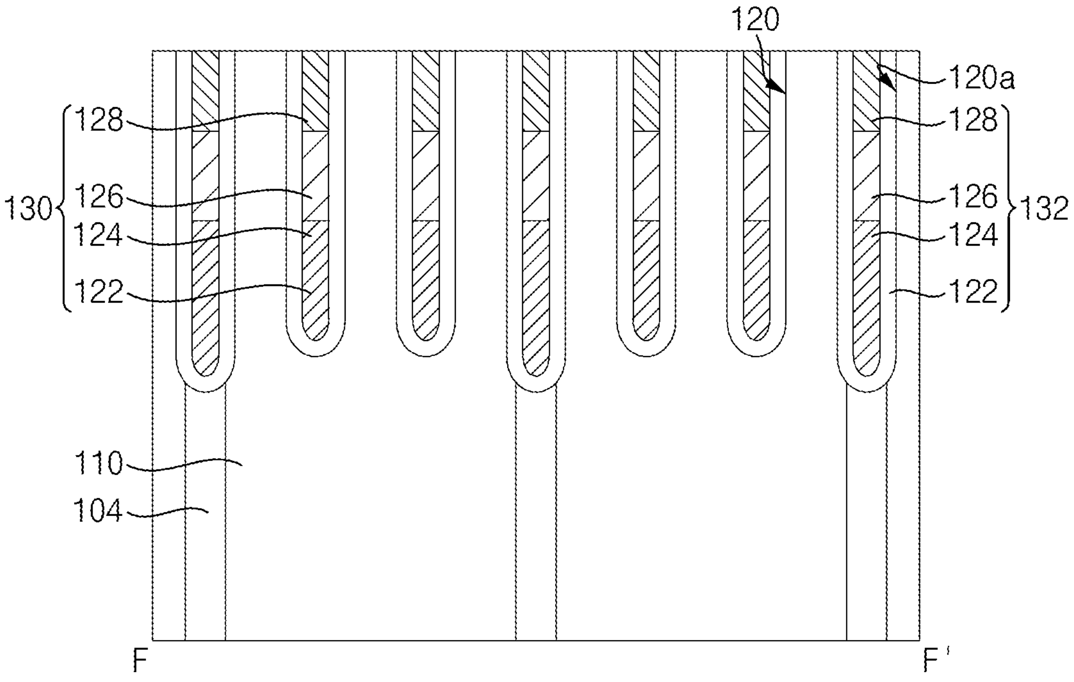
Figure 9:
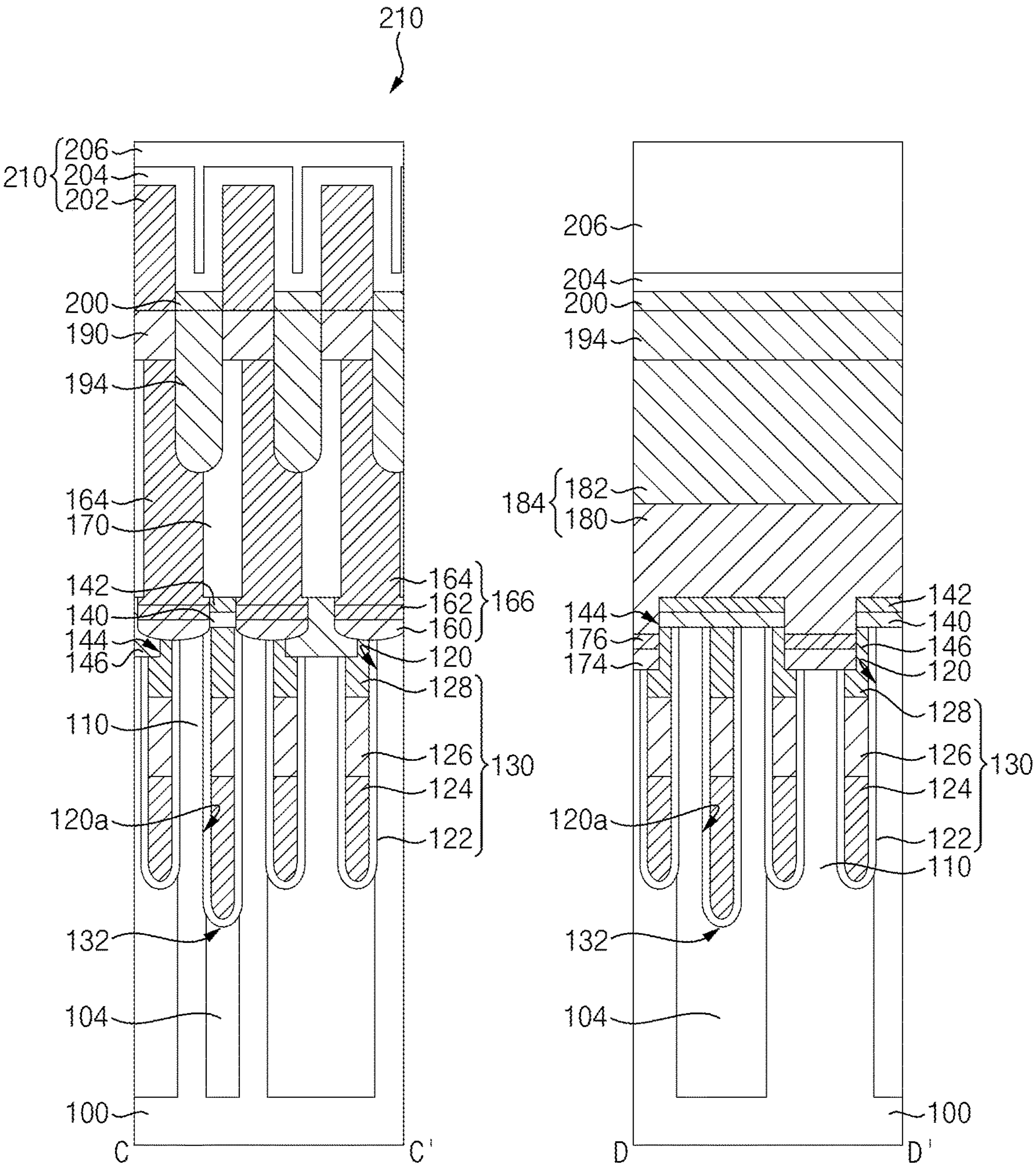

FIGS. 7 to 9 are plan views and cross-sectional views illustrating a semiconductor device according to example embodiments. In detail, FIG. 8 illustrates a cross-sectional view along line F-F' of FIG. 7, and FIG. 9 illustrates cross-sectional views along lines C-C' and D-D' of FIG. 7. In order to avoid drawing complexity, only active patterns and gate structures are illustrated in FIGS. 7 and 8.

The semiconductor device in FIGS. 7-9 may be the same as the semiconductor device described with reference to FIGS. 1 to 3, except for further including a dummy gate structure.

Referring to FIGS. 7 to 9, a second recess 120*a* extending in the first direction D1 may be formed at an upper portion of the isolation layer 104 between the active pattern rows. A dummy gate structure 132 may be formed in the second recess 120*a*.

In example embodiments, the dummy gate structure 132 may contact end portions of active patterns 110 adjacent to each other in the third direction D3. The dummy gate structure 132 extending in the second direction D2 may be disposed between the active patterns 110 spaced apart from each other in the third direction D3.

The dummy gate structure 132 may have a same stacked structure as the stacked structure of the gate structure 130. In example embodiments, the dummy gate structure 132 may have the stacked structure in which a gate insulation pattern 122, a first gate pattern 124, a second gate pattern 126, and a gate mask 128 are stacked. In example embodiments, the dummy gate structure 132 may have a same width as the width of the gate structure 130.

In example embodiments, a distance between the gate structures 130 in the second direction D2 and a distance between the gate structure 130 and the dummy gate structure 132 in the second direction D2 may be substantially the same. As the dummy gate structure 132 may be further formed, an arrangement density of gates including the gate structures 130 and the dummy gate structures 132 may be uniform. Accordingly, patterning defects due to a difference of the distances between the gate structures may be decreased.

FIGS. 10 to 50 are plan views and cross-sectional views illustrating stages in a method of manufacturing a semiconductor device according to example embodiments.

Particularly, FIGS. 10, 13, 15, 19, 22, 25, 30, 33, 38, 43 and 46 are plan views. FIGS. 11, 17, 20, 23, 26, 28, 31, 34, 36, 39, 41, 44, 47 and 49 illustrate cross-sectional views taken along line A-A' and line B-B' of respective plan views. FIGS. 12, 18, 21, 24, 27, 29, 32, 35, 37, 40, 42, 45, 48 and 50 illustrate cross-sectional views taken along line C-C' and line D-D' of respective plan views. FIGS. 14 and 16 illustrate cross-sectional views taken along lines C-C', D-D', and E-E of respective plan views.

Figure 10:
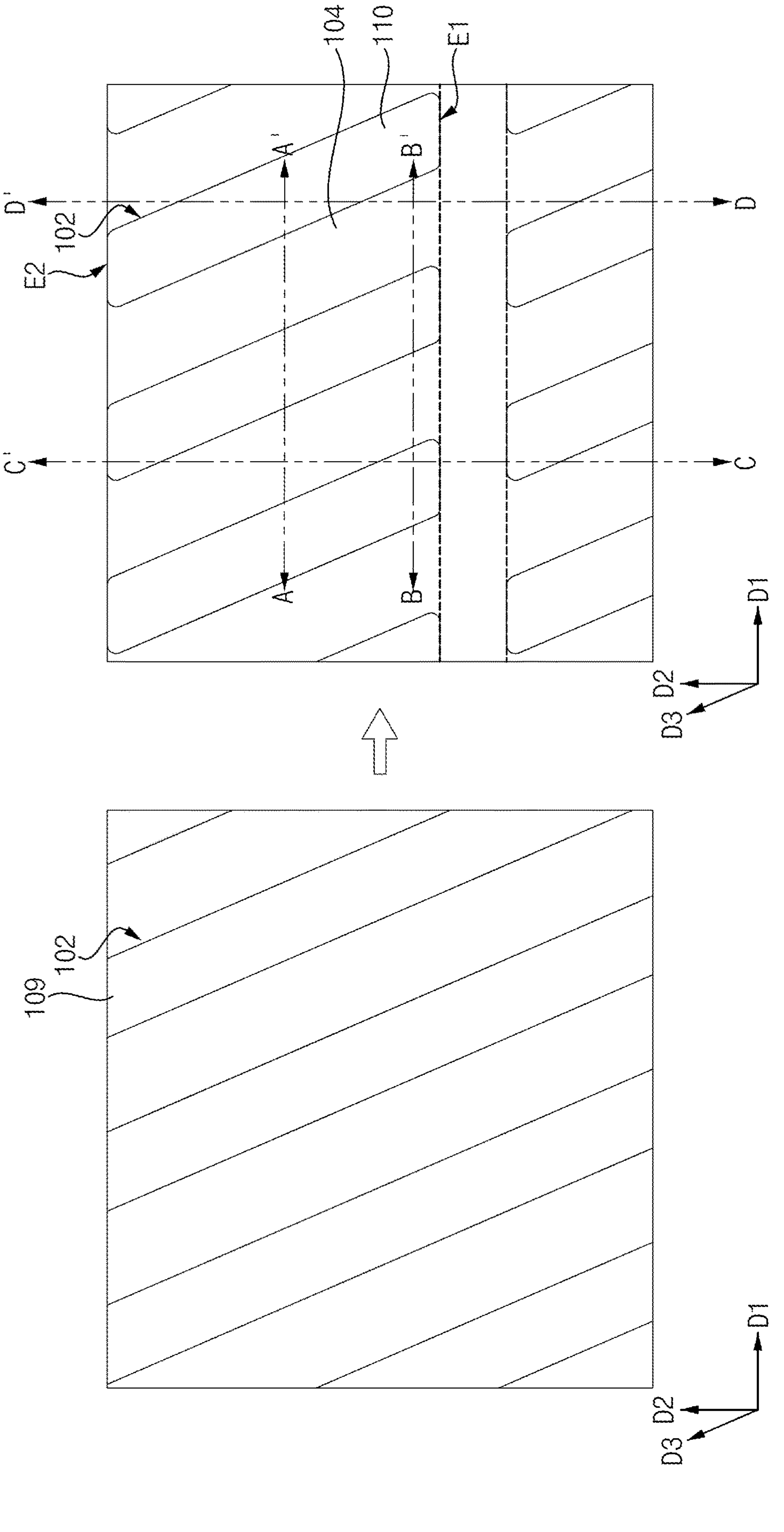
FIGS. 10 to 50 are plan views and cross-sectional views illustrating stages in a method of manufacturing a semiconductor device according to example embodiments.
Figure 11:
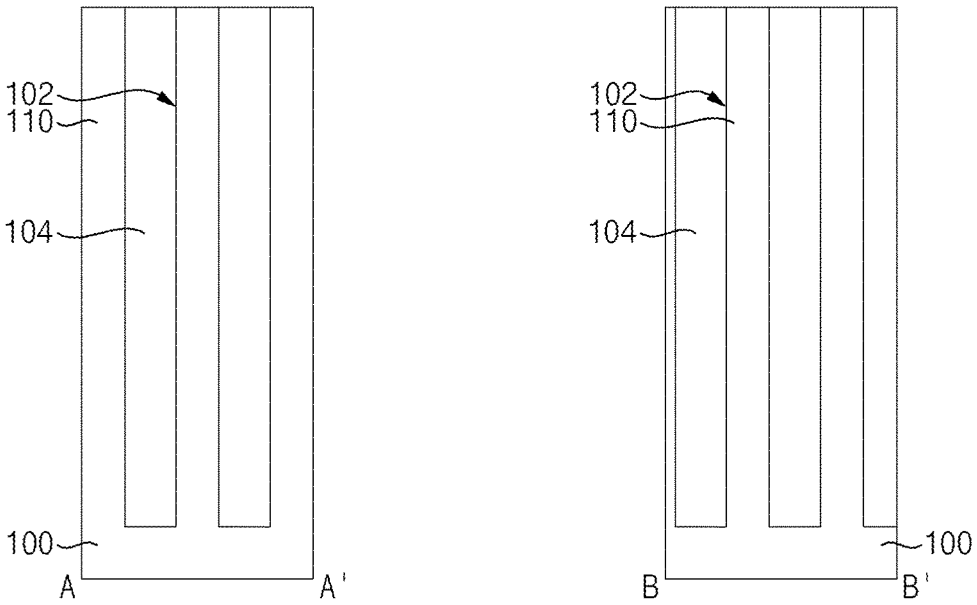
Figure 12:
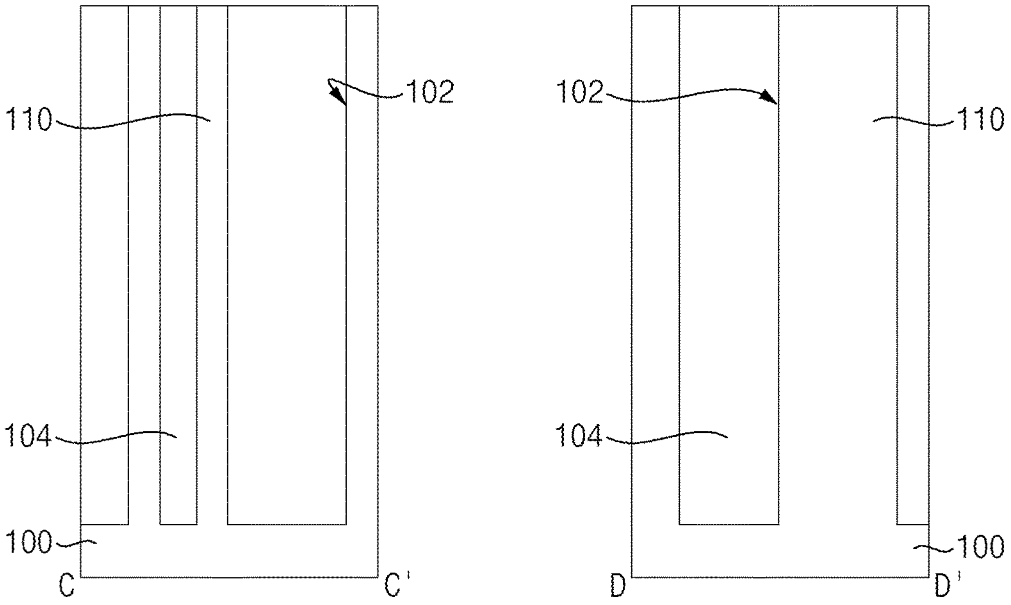

Referring to FIGS. 10 to 12, a portion of the substrate 100 may be etched to form the isolation trench 102 and the active patterns 110.

Each of the active patterns 110 may have an isolated shape having the third direction D3 as a longitudinal direction. In the plan view, a lower end of the active pattern 110 is referred to as a first end E1, and the upper end is referred to as a second end E2. The first ends E1 of the active patterns 110 may be disposed to be aligned in the first direction D1, and the second ends E2 of the active patterns 110 may be disposed to be aligned in the first direction D1.

In example embodiments, a photolithography process may be performed to form preliminary active patterns 109 to have a line shape extending in the third direction D3, and then the preliminary active patterns 109 may cut in the first direction D1 to form the active patterns 110 having isolated shapes. In this case, each of the first and second ends E1 and E2 of the active pattern 110 may have a straight line shape.

In some example embodiments, an isolated mask pattern may be formed on the substrate 100, and then the substrate 100 may be etched using the isolated mask pattern as an etching mask to form the active pattern 110. In this case, each of the first and second ends of the active pattern 110 may have a rounded shape.

The active patterns 110 may be arranged to be aligned in the first direction D1, and the active patterns 110 may be aligned in the third direction D3. Therefore, the patterning process for forming the active patterns 110 may be easily performed.

The isolation layer 104 may be formed to fill the isolation trench 102. The isolation layer 104 may include, e.g., silicon oxide.

In the process for forming the isolation layer 104, an insulation layer may be formed on the active pattern 110 to fill the isolation trench 102. The insulation layer may be planarized until an upper surface of the active pattern 110 may be exposed. The planarization process may include, e.g., a CMP (chemical mechanical polishing) process.

Figure 13:
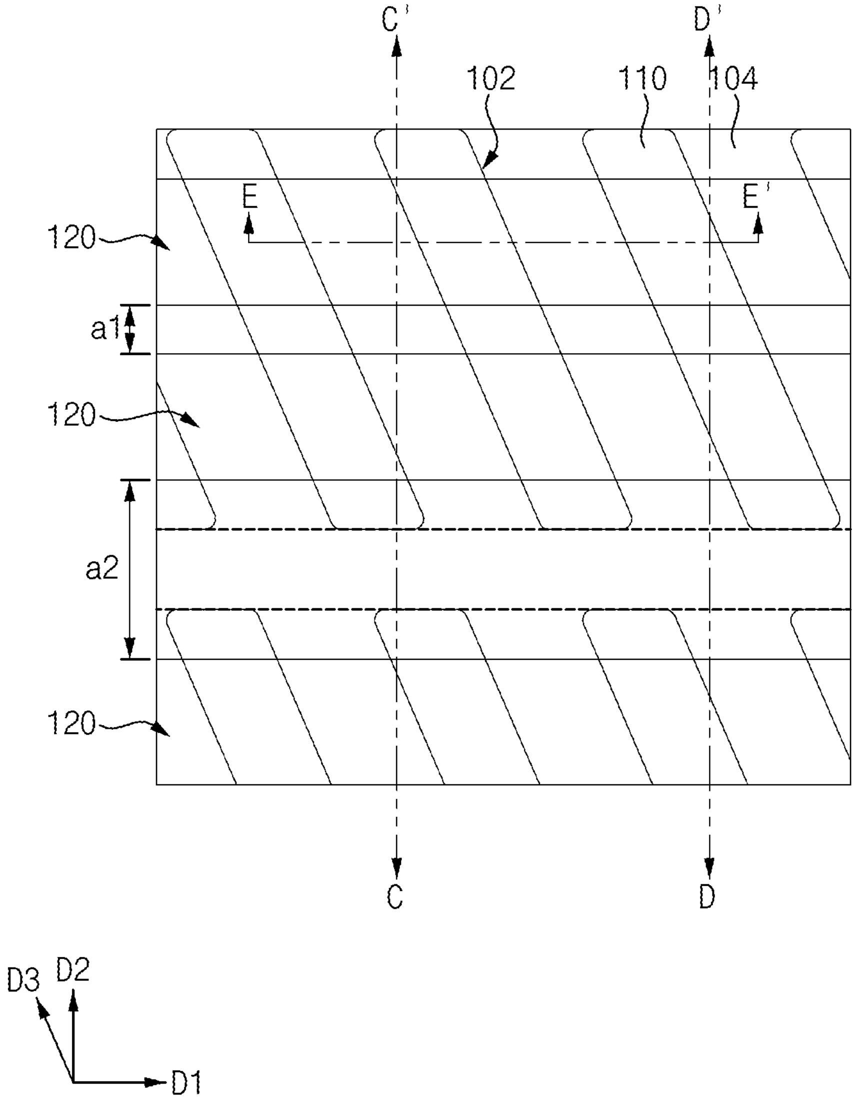
Figure 14:
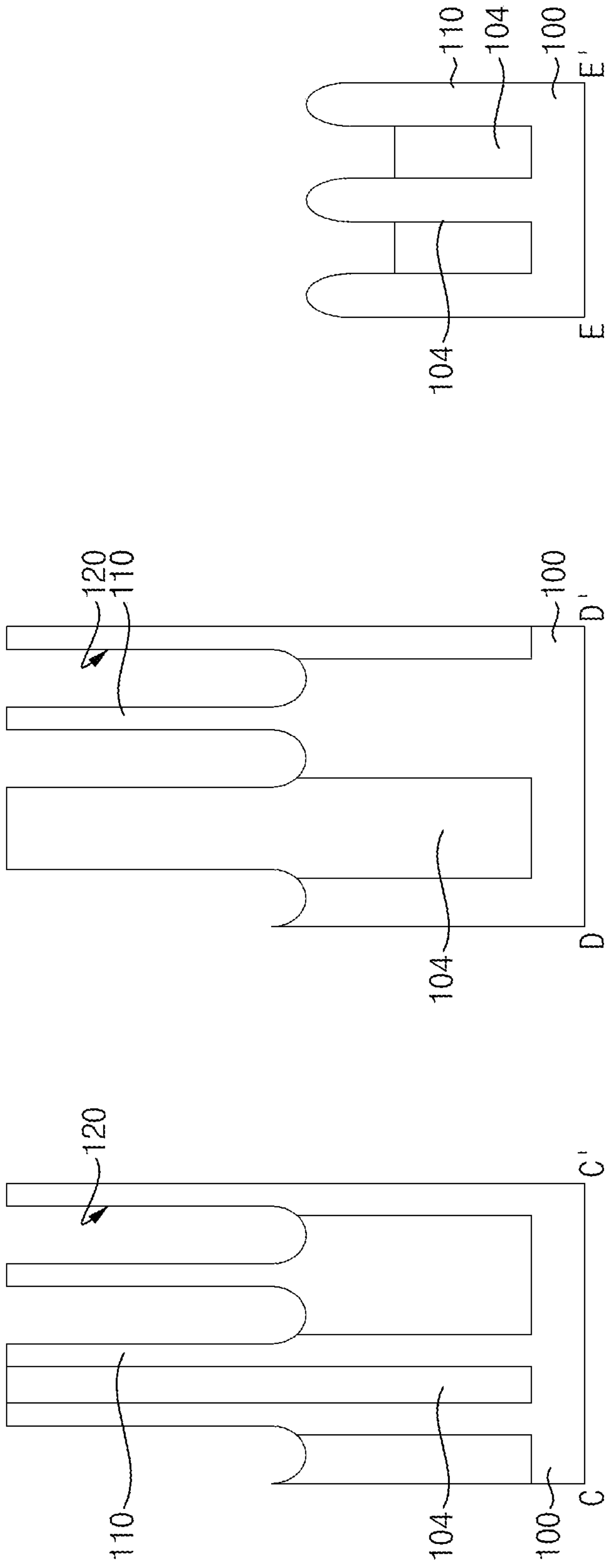

Referring to FIGS. 13 and 14, the active pattern 110 and the isolation layer 104 may be partially etched to form the first recess 120 extending in the first direction D1. Two first recesses 120 spaced apart from each other may be formed on each of the active patterns 110. Accordingly, one active pattern 110 may be divided into one central portion and first and second edge portions by the two first recesses 120.

Each of the first recesses 120 may extend to cross the plurality of active patterns 110 arranged in the first direction D1. In this case, central portions of the plurality of active patterns 110 included in an active pattern row may be aligned in the first direction D1. The first edge portions of the plurality of active patterns 110 included in the active pattern row may be aligned in the first direction D1, and the second edge portions of the plurality of active patterns 110 included in the active pattern row may be aligned in the first direction D1.

In example embodiments, the first spacing a1 in the second direction D2 between the two first recesses 120 on the same active patterns 110 may be different from the second spacing a2 in the second direction D2 between two neighboring first recesses 120 on different neighboring active patterns. For example, the first spacing a1 in the second direction D2 may be less than the second spacing a2 in the second direction D2.

In example embodiments, as shown in FIG. 14, an upper surface of the isolation layer 104 exposed by a bottom of the first recess 120 may be lower than an upper surface of the active pattern 110 exposed by the bottom of the first recess 120. Therefore, a sidewall of the active pattern 110 positioned higher than the upper surface of the isolation layer 104 may be exposed by the bottom of the first recess 120. Accordingly, the upper surface and the sidewall of the active pattern 110 exposed by the first recess 120 may serve as an active fin for forming a fin field effect transistor.

In some example embodiments, in the etching process, an upper portion of the isolation layer 104 between the active pattern rows in the second direction D2 may be etched to form a second recess extending in the first direction D1. When the second recess is formed, a spacing between the first and second recesses may be substantially the same as the spacing between the first recesses.

Figure 15:
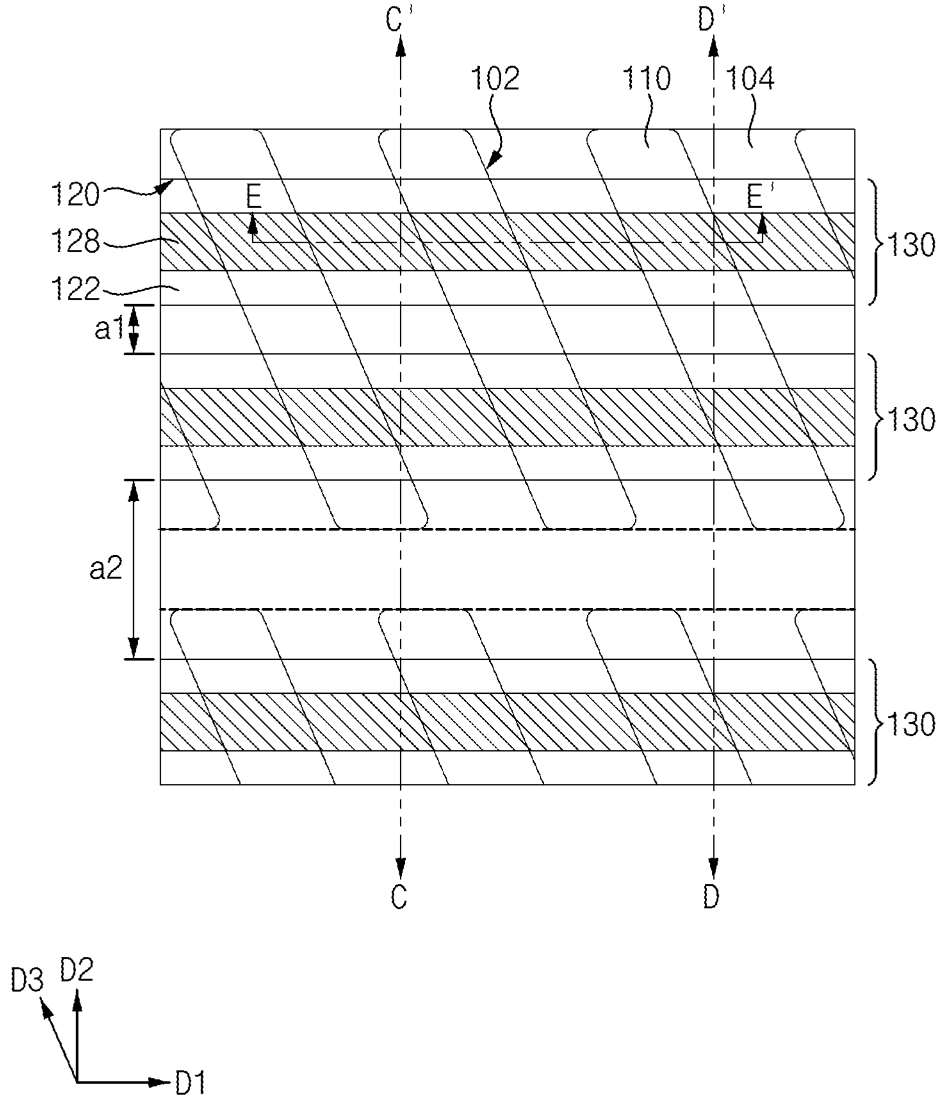

Referring to FIGS. 15 and 16, the gate structure 130 may be formed in the first recess 120.

Particularly, a gate insulation layer may be formed on the bottom and sidewalls of the first recess 120. After forming a first gate electrode layer on the gate insulation layer, an upper portion of the first gate electrode layer may be removed to form the first gate pattern 124. After forming a second gate electrode layer on the first gate pattern 124 and the gate insulation layer, an upper portion of the second gate electrode layer may be removed to form the second gate pattern 126. After forming a gate mask layer on the gate insulation layer and the second gate pattern 126, the gate mask layer may be planarized until upper surfaces of the active pattern 110 and the isolation layer 104 may be exposed to form a gate structure in the first recess 120. The gate structure 130 may include the gate insulation pattern 122, the first gate pattern 124, the second gate pattern 126, and the gate mask 128 stacked.

The gate structure 130 may extend in the first direction D1. A plurality of gate structures 130 may be spaced apart from each other in the second direction D2.

In example embodiments, as shown in FIG. 16, the gate insulation pattern 122 may be further formed on the upper surface and sidewalls of the active pattern 110 exposed by the first recess 120. Accordingly, the gate structure 130 may serve as a gate of a fin field effect transistor.

In some example embodiments, when the second recess is formed in previous processes, as shown in FIGS. 7 and 8, the dummy gate structure 132 may be further formed in the second recess 120*a*. The dummy gate structure 132 may be formed together with the gate structure 130 by the process for forming the gate structure 130.

Figure 17:
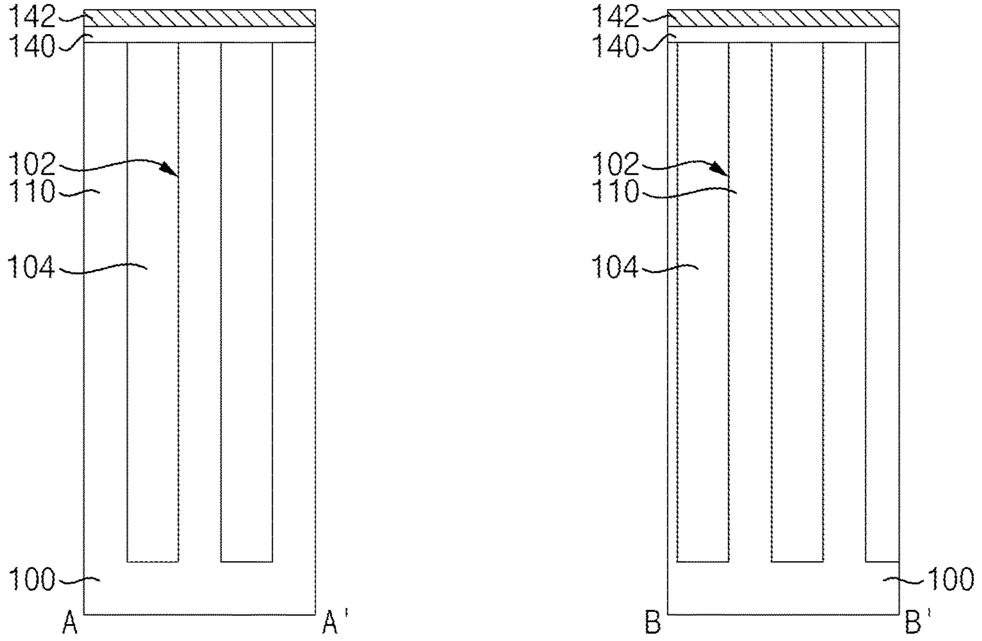
Figure 18:
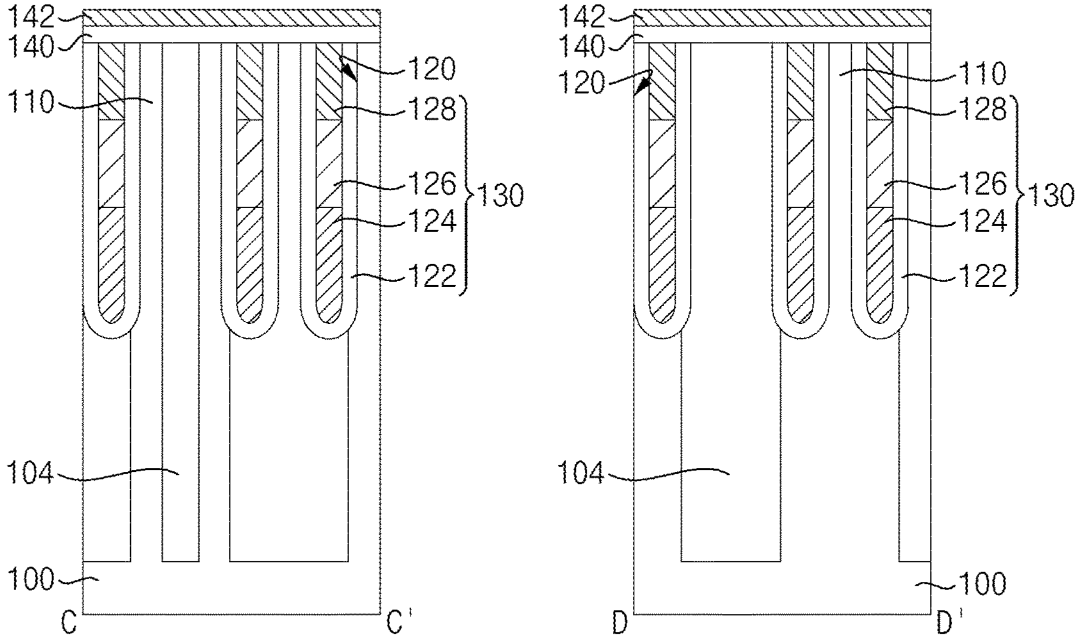

Referring to FIGS. 17 and 18, the first buffer layer 140 and the second buffer layer 142 may be sequentially formed on the upper surfaces of the active pattern 110, the isolation layer 104, and the gate structure 130. The first and second buffer layers 140 and 142 may include insulation materials. The first buffer layers 140 may include a material having a high etch selectivity with respect to a material of the second buffer layer 143. In example embodiments, the first buffer layer 140 may include, e.g., silicon oxide, and the second buffer layer 142 may include, e.g., silicon nitride.

Figure 19:
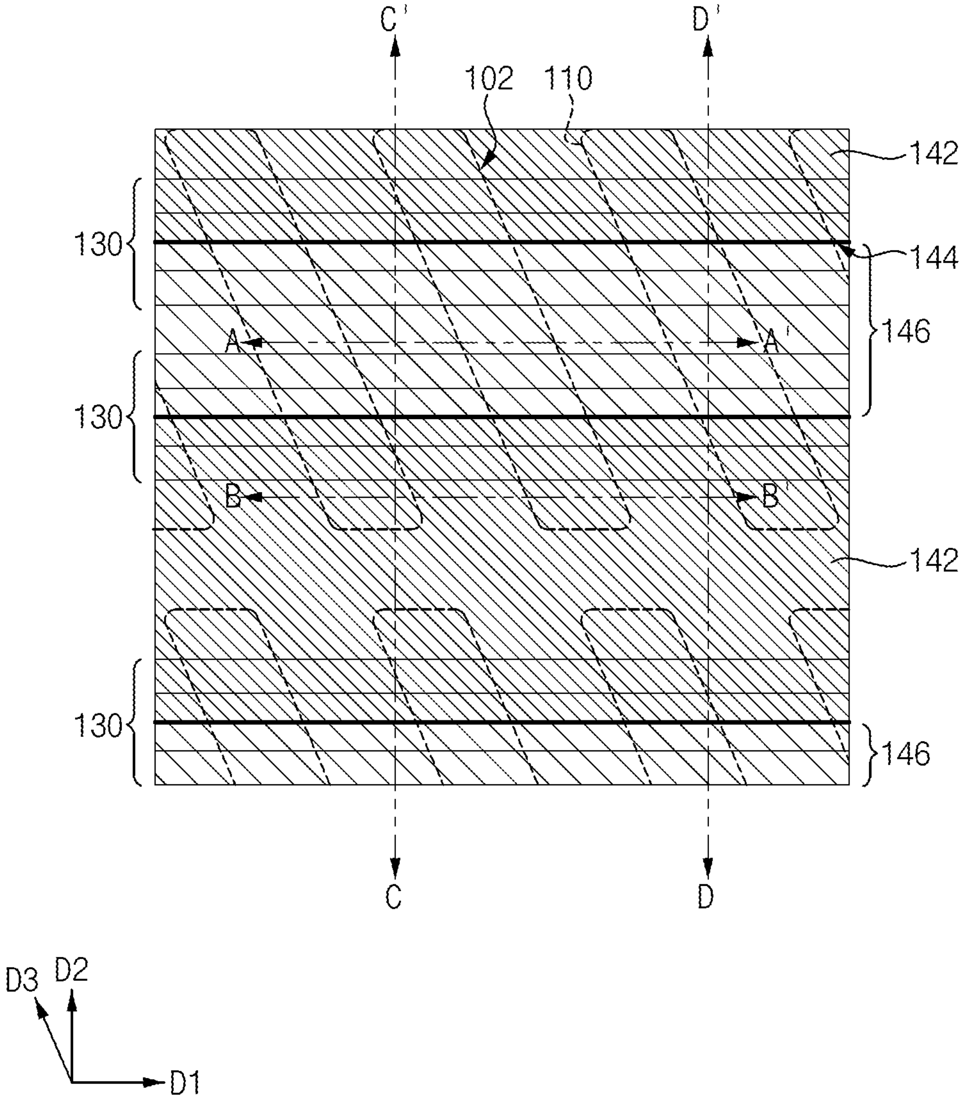
Figure 20:
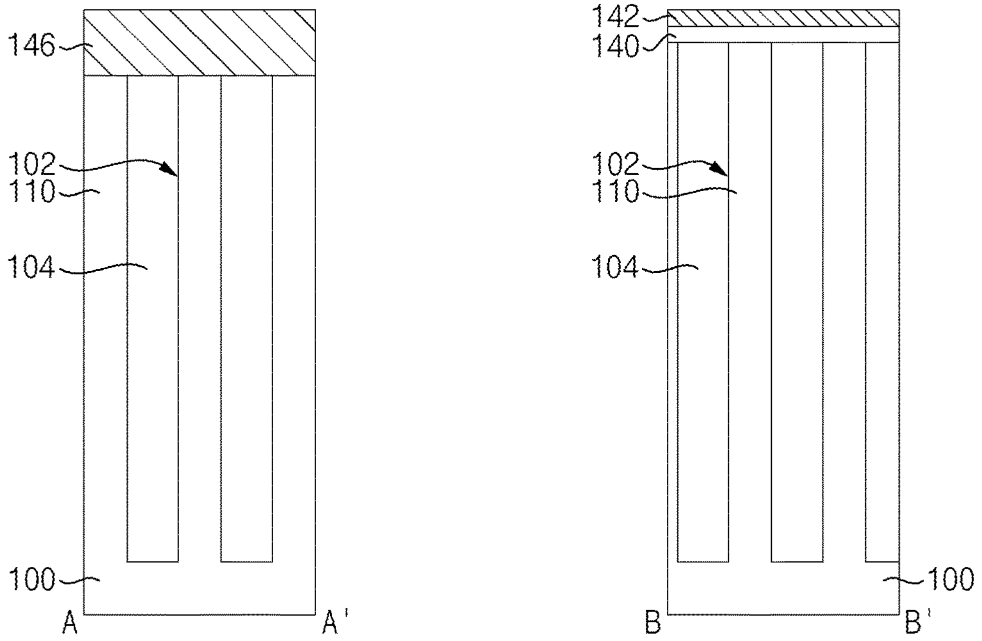
Figure 21:
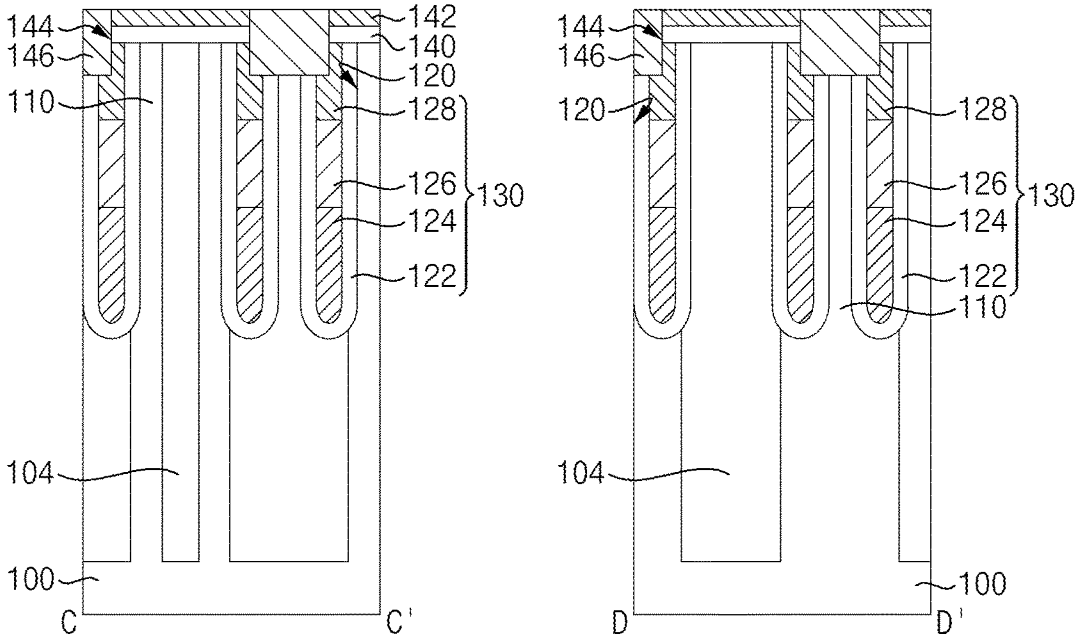

Referring to FIGS. 19 to 21, upper portions of the second buffer layer 142 and the first buffer layer 140, the isolation layer 104, and the active pattern 110 may be etched by a photolithography process to form a first trench 144 extending in the first direction D1 and exposing the central portions of the active patterns 110.

In example embodiments, the first trench 144 may extend in the first direction D1 while exposing the central portions between two gate structures 130 on the active pattern 110. In the etching process, upper portions of the gate mask 128 and the gate insulation pattern 122 in the gate structure 130 may also be partially etched.

A first sacrificial mold layer may be formed on the second buffer layer 142 to fill the first trench 144. The first sacrificial mold layer may be planarized until an upper surface of the second buffer layer 142 may be exposed to form the first sacrificial mold layer pattern 146. The first sacrificial mold layer pattern 146 may extend in the first direction D1 to cover the central portions of the plurality of active patterns 110 included in the active pattern row. Regions of the first sacrificial mold layer pattern 146 covering the central portions of the plurality of active patterns 110 may serve as regions for forming bit line structures in subsequent processes.

The first sacrificial mold layer pattern 146 may include an insulation material. The first sacrificial mold layer pattern 146 may include a material having an etching selectivity with respect the second buffer layer 142, so that the first sacrificial mold layer pattern 146 may be selectively etched with respect to the second buffer layer 142. The first sacrificial mold layer pattern 146 may include, e.g., SiOC.

Figure 22:
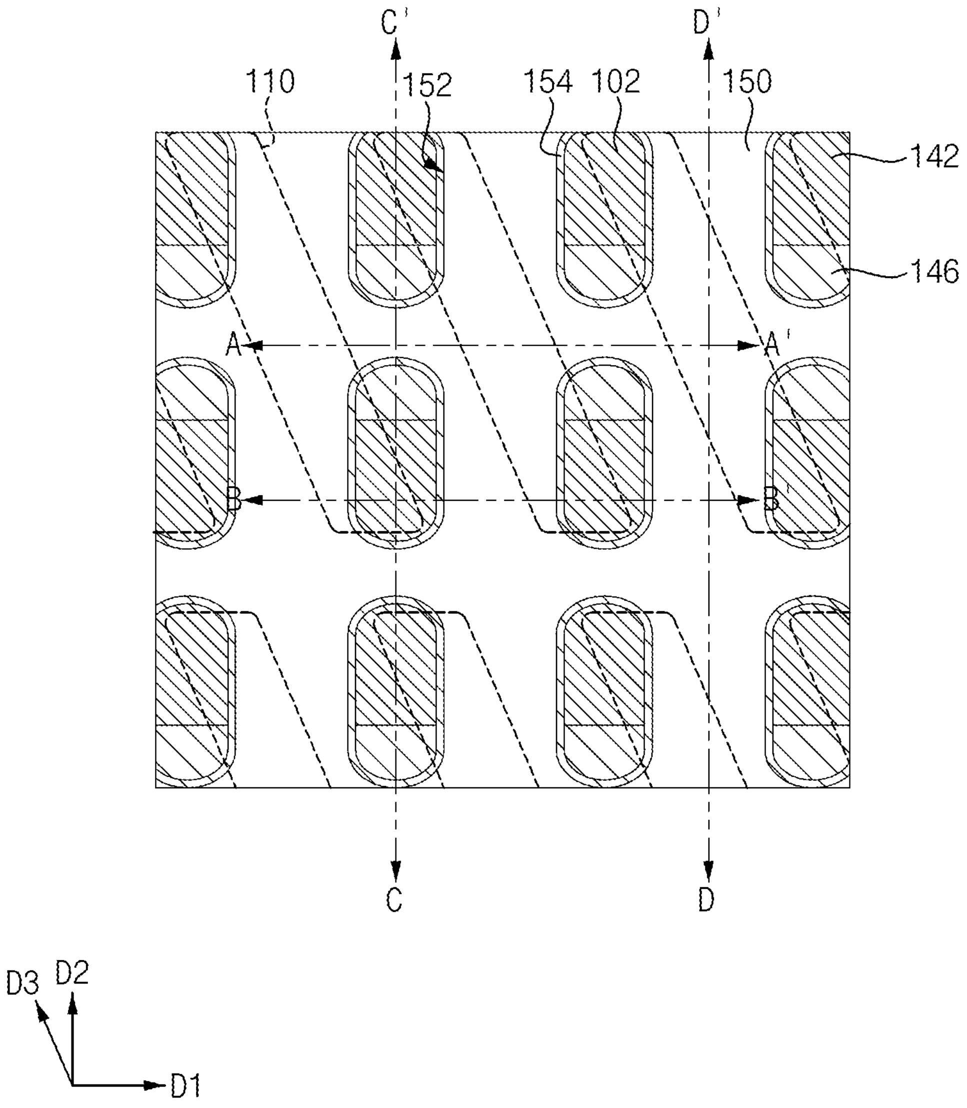
Figure 23:
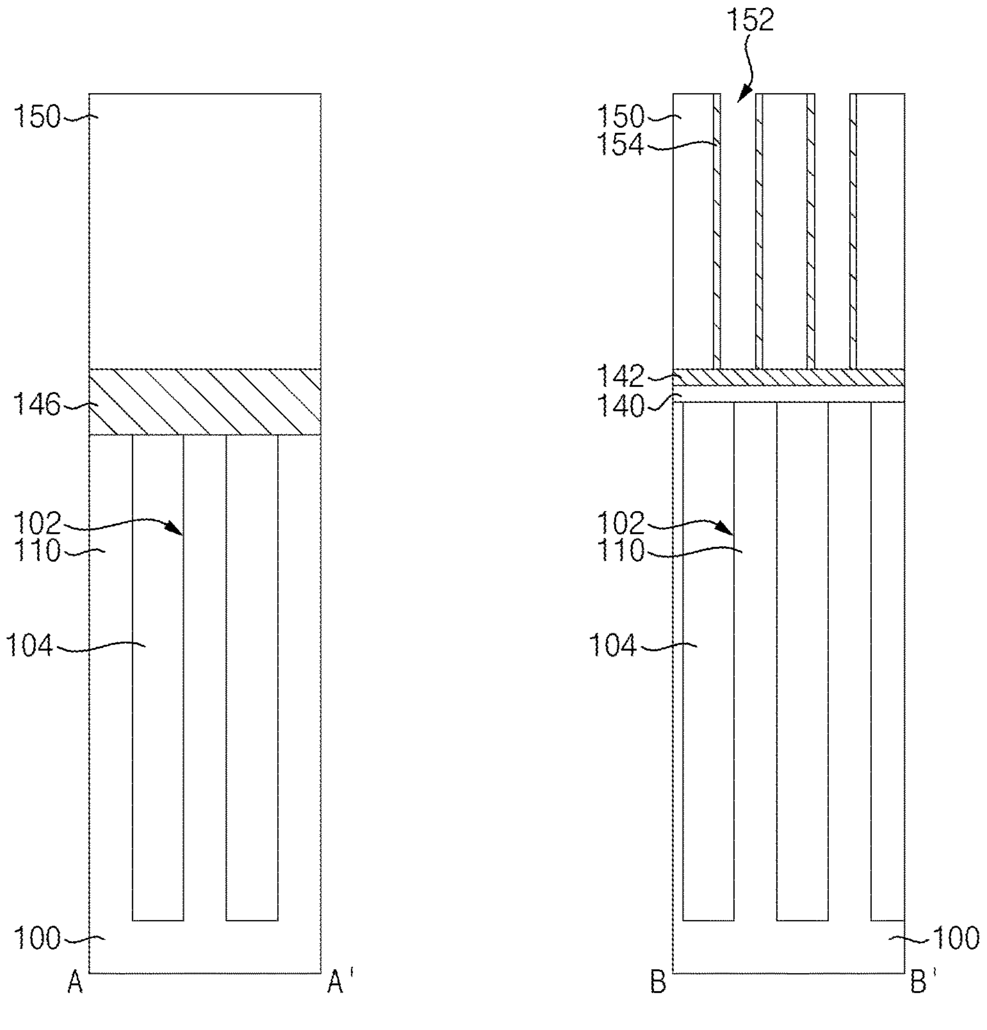
Figure 24:
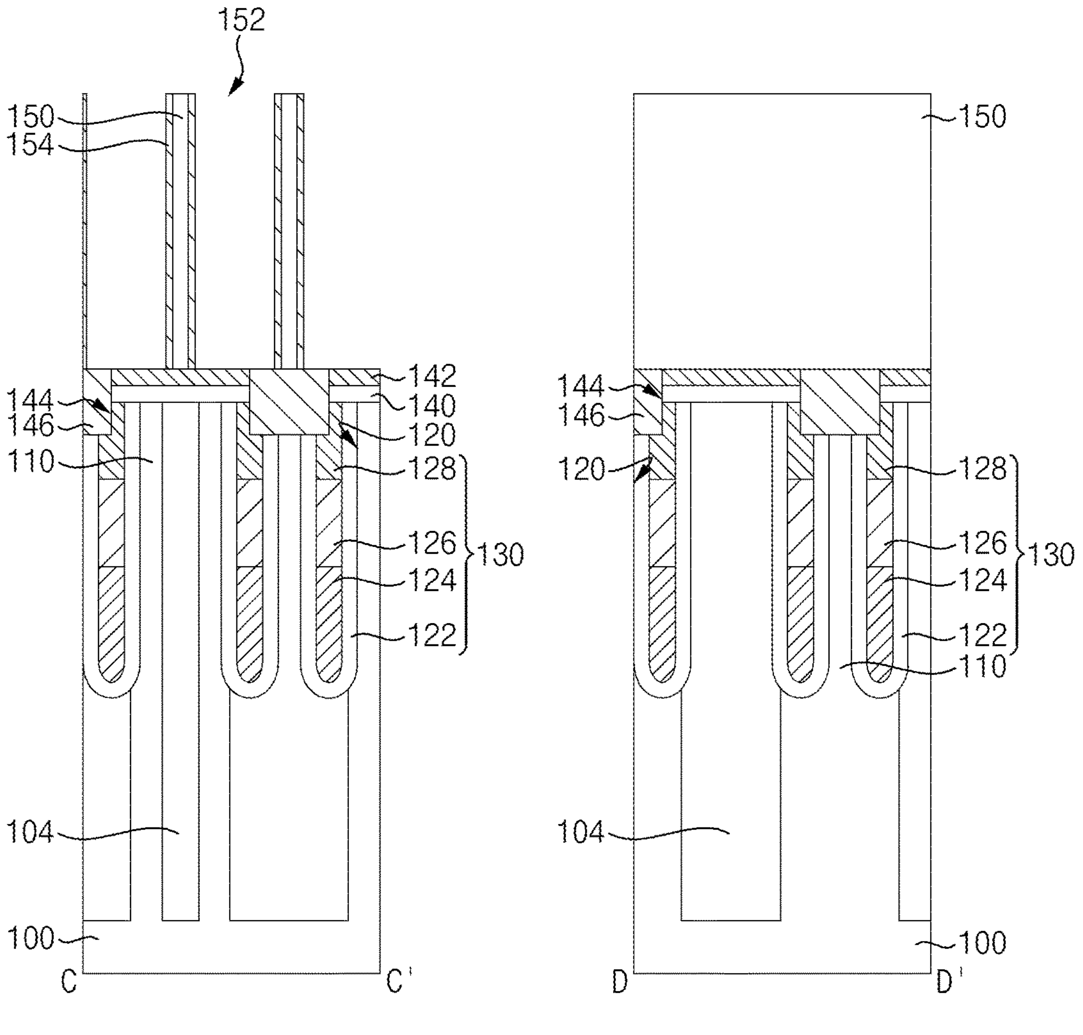

Referring to FIGS. 22 to 24, a second sacrificial mold layer 150 may be formed on the first sacrificial mold layer pattern 146 and the second buffer layer 142. The second sacrificial mold layer 150 may include an insulation material. In example embodiments, the second sacrificial mold layer 150 may include, e.g., silicon oxide, SiC, or SiC.

A portion of the second sacrificial mold layer 150 may be etched to form preliminary first contact holes 152. First one of the preliminary first contact holes 152 may be formed to face the first edge portions of the active patterns 110 and the upper surface of the gate structure 130 adjacent thereto. Second one of the preliminary first contact holes 152 may be formed to face the second edge portions of the active patterns 110 and the upper surface of the gate structure 130 adjacent thereto. The second buffer layer 142 and the first sacrificial mold layer pattern 146 may be exposed by the bottom of the preliminary first contact hole 152.

A capping spacer 154 may be formed on a sidewall of the preliminary first contact hole 152. The capping spacer 154 may include silicon nitride and/or silicon oxide. The capping spacer 154 may protect the first contact hole so as not to expand the first contact hole, in subsequent processes.

Figure 25:
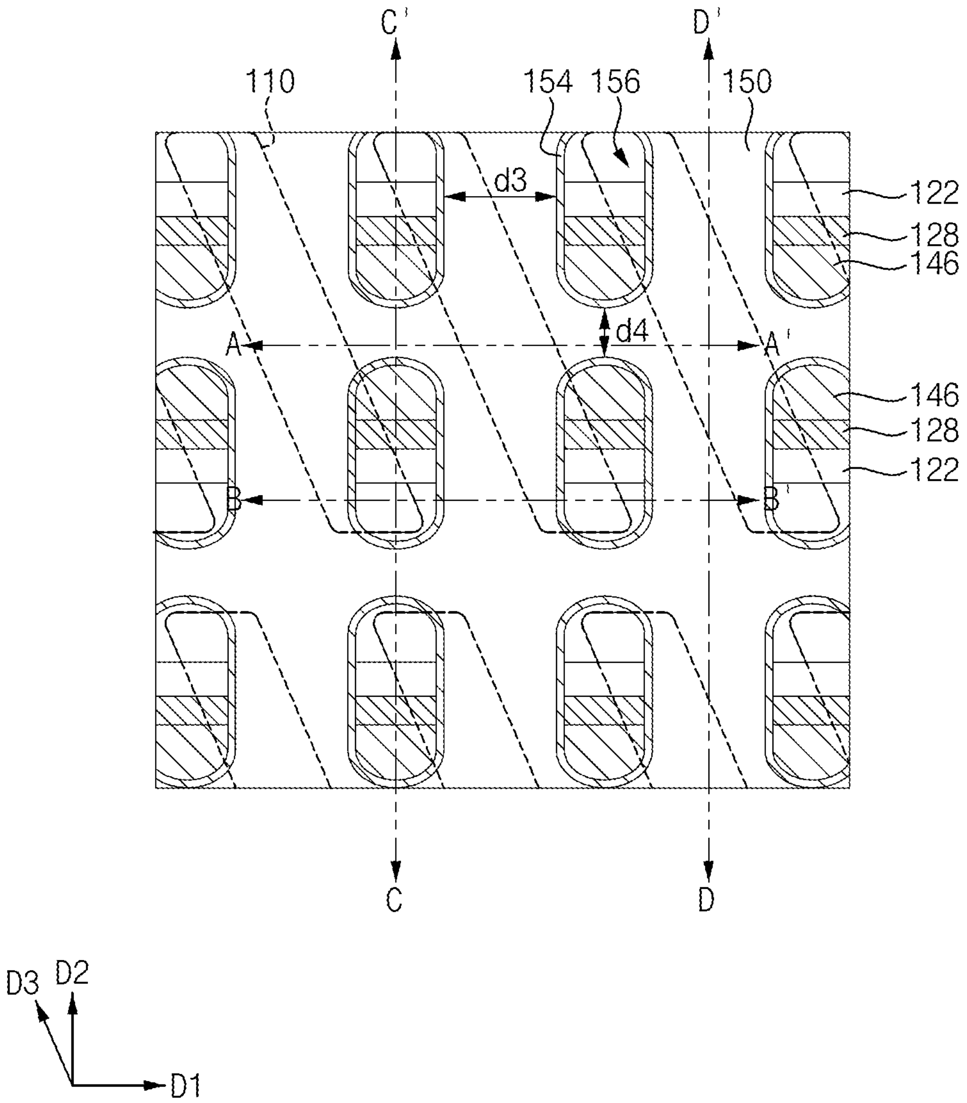
Figure 26:
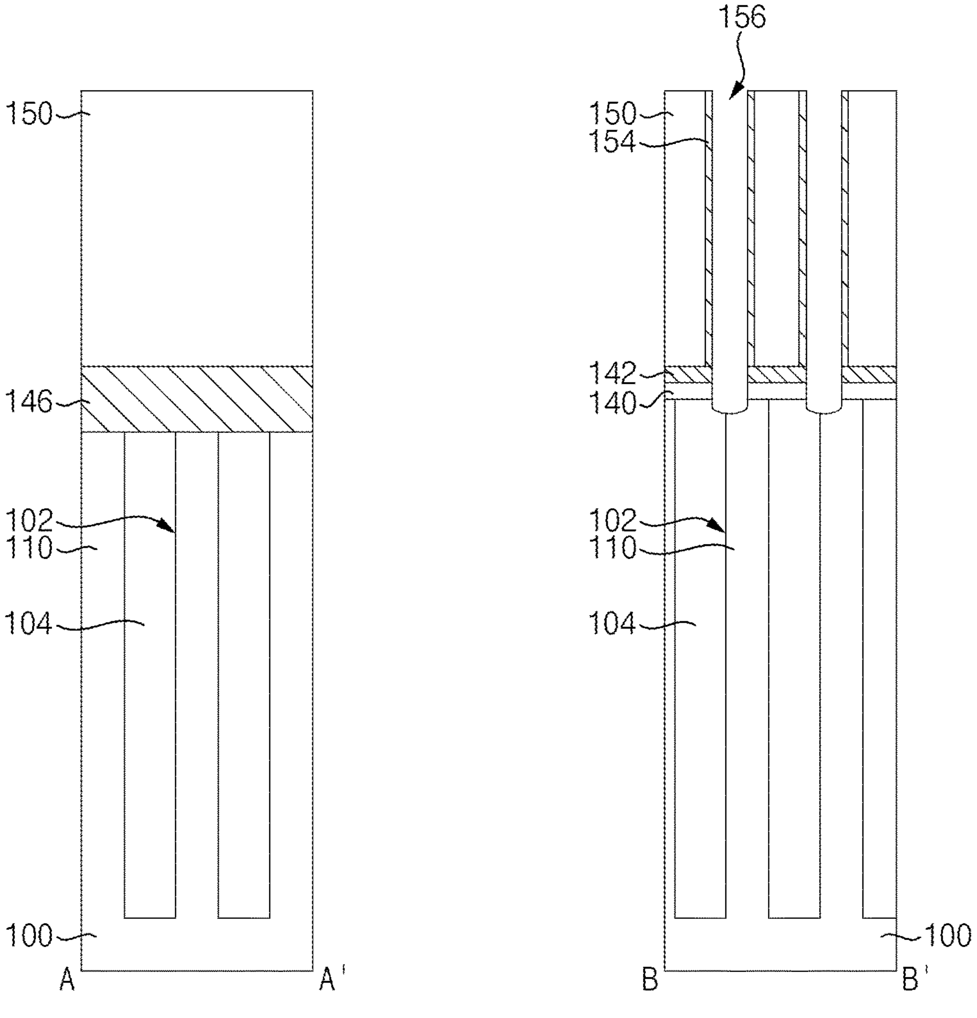
Figure 27:
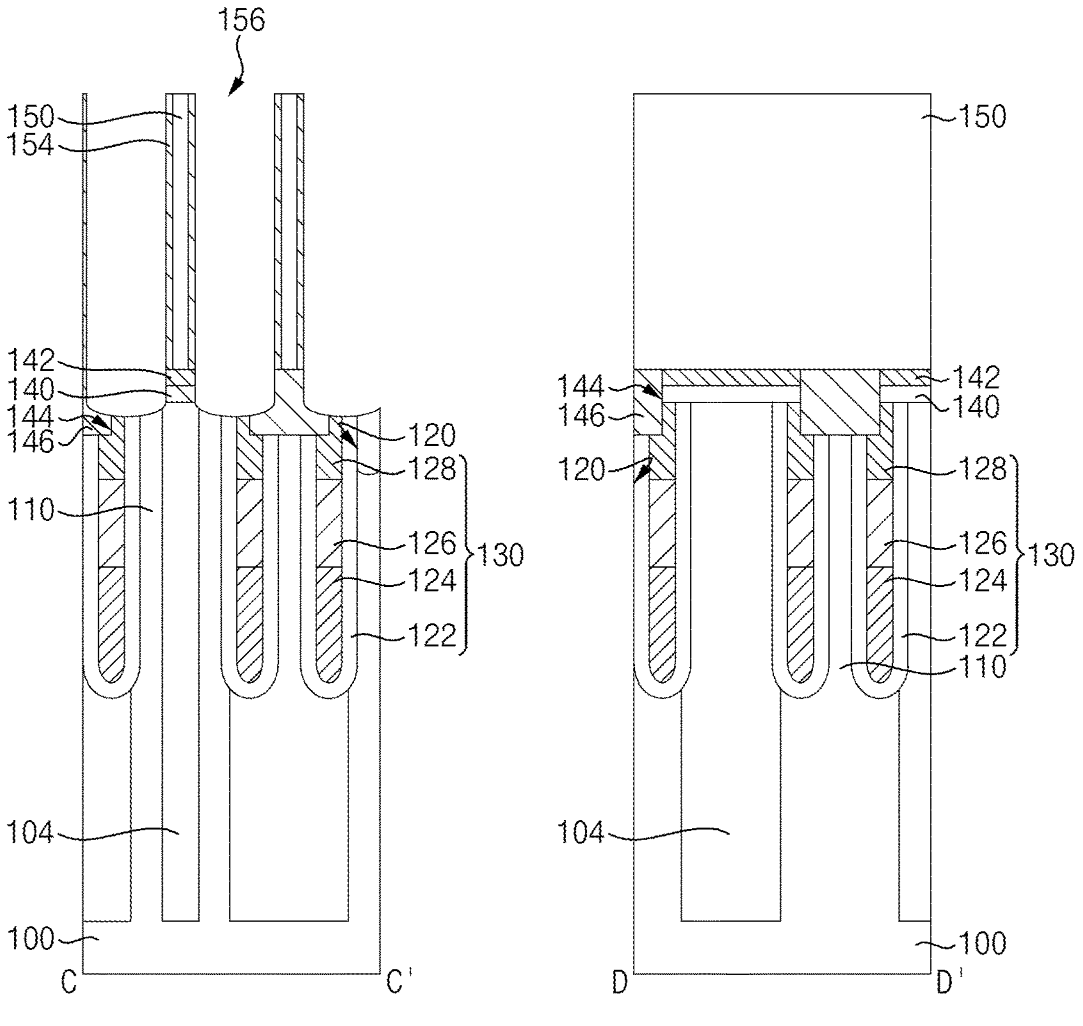

Referring to FIGS. 25 to 27, the second buffer layer 142, the first buffer layer 140, and an upper portion of the first sacrificial mold layer pattern 146 under the preliminary first contact hole 152 may be etched, and then upper portions of the gate insulation pattern 122 and the gate mask 128 in the gate structure 130 and an upper portion of the active pattern 110 may be etched to form a first contact hole 156.

The first edge portion of the active pattern 110 and the upper portions of the gate structure 130 and the first sacrificial mold layer pattern 146 adjacent thereto or the second edge portion of the active pattern 110 and the upper portions of the gate structure 130 and the first sacrificial mold layer pattern 146 adjacent thereto may be exposed by a bottom of each of the first contact holes 156.

The first contact holes 156 may be disposed to be aligned in each of the first and second directions D1 and D2. A third distance d3 between the first contact holes 156 spaced apart in the first direction D1 may be greater than a fourth distance d4 between the first contact holes 156 spaced apart in the second direction D2.

A central portion of one active pattern 110 may be disposed between four first contact holes 156 adjacent to each other in the first and second directions D1 and D2. In example embodiments, the central portion of one active pattern 110 may be disposed at a contact position between a first virtual line passing through a center of a space between the four first contact holes 156 in the first direction D1 and a second virtual line passing through a center of a space between the four first contact holes 156 in the second direction D2.

After this, a cleaning process may be performed. A native oxide layer formed on the bottom of the first contact holes 156 may be removed by the cleaning process. When the cleaning process is performed, the capping spacer 154 may be partially or completely removed. As the capping spacer 154 is formed, an expansion of a sidewall of the first contact hole 156 may be prevented during the cleaning process.

Figure 28:
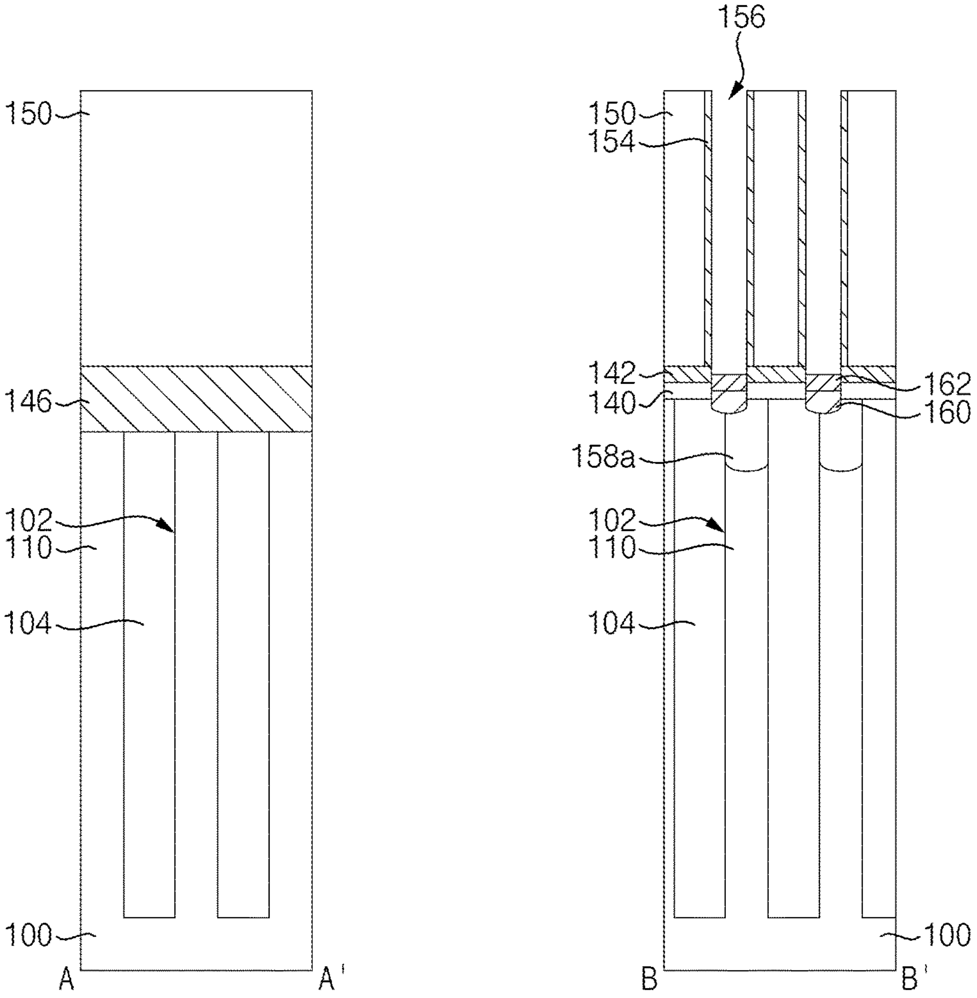
Figure 29:
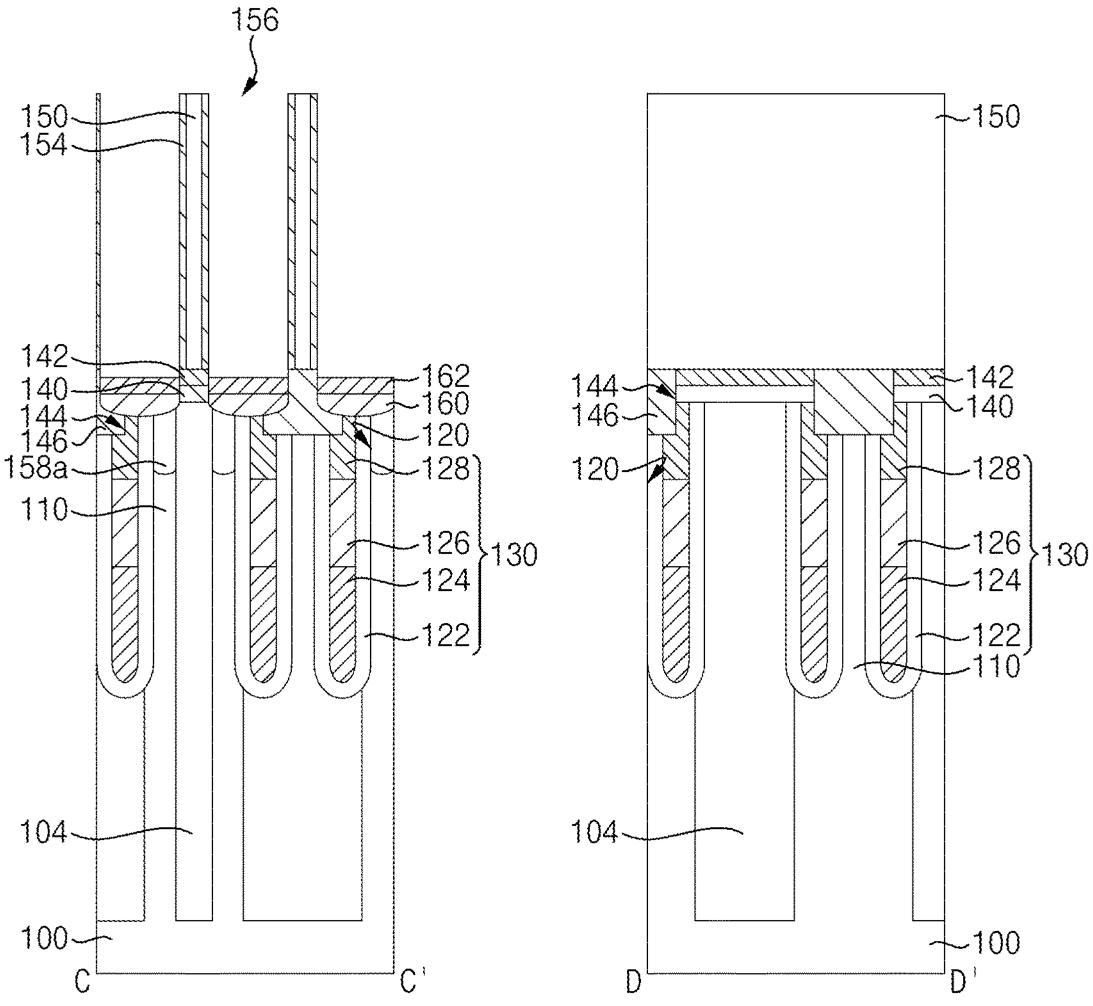

Referring to FIGS. 28 and 29, the first silicon layer 160 doped with impurities may be formed on the bottom of the first contact hole 156. In example embodiments, the first silicon layer 160 may be formed by a selective epitaxial growth process. In this case, the first silicon layer 160 may be formed only on the upper surface of the active pattern 110 exposed by the first contact hole 156.

In some example embodiments, a silicon layer may be deposited, and then the silicon layer may be etched by an etch-back process to form the first silicon layer 160. The first silicon layer 160 may be formed to increase an area of silicon contacting a first metal layer, in a subsequent silicidation process. In some example embodiments, the process of forming the first silicon layer may be omitted.

The first metal layer may be formed on the first silicon layer 160, and then a heat treatment of the first metal layer may be performed to form the first metal silicide pattern 162 on the bottom of the first contact hole 156. The first metal silicide pattern 162 may be formed by reacting the first silicon layer 160 and the first metal layer with each other.

In example embodiments, the first metal silicide pattern 162 may have an upper surface lower than an upper surface of the second buffer layer 142. An upper surface of the first silicon layer 160 may be lower than an upper surface of the first buffer layer 140.

Meanwhile, impurities doped in the first silicon layer 160 may diffuse into the active pattern 110 to form a first impurity region 158*a* at an upper portion of the active pattern 110.

Figure 30:
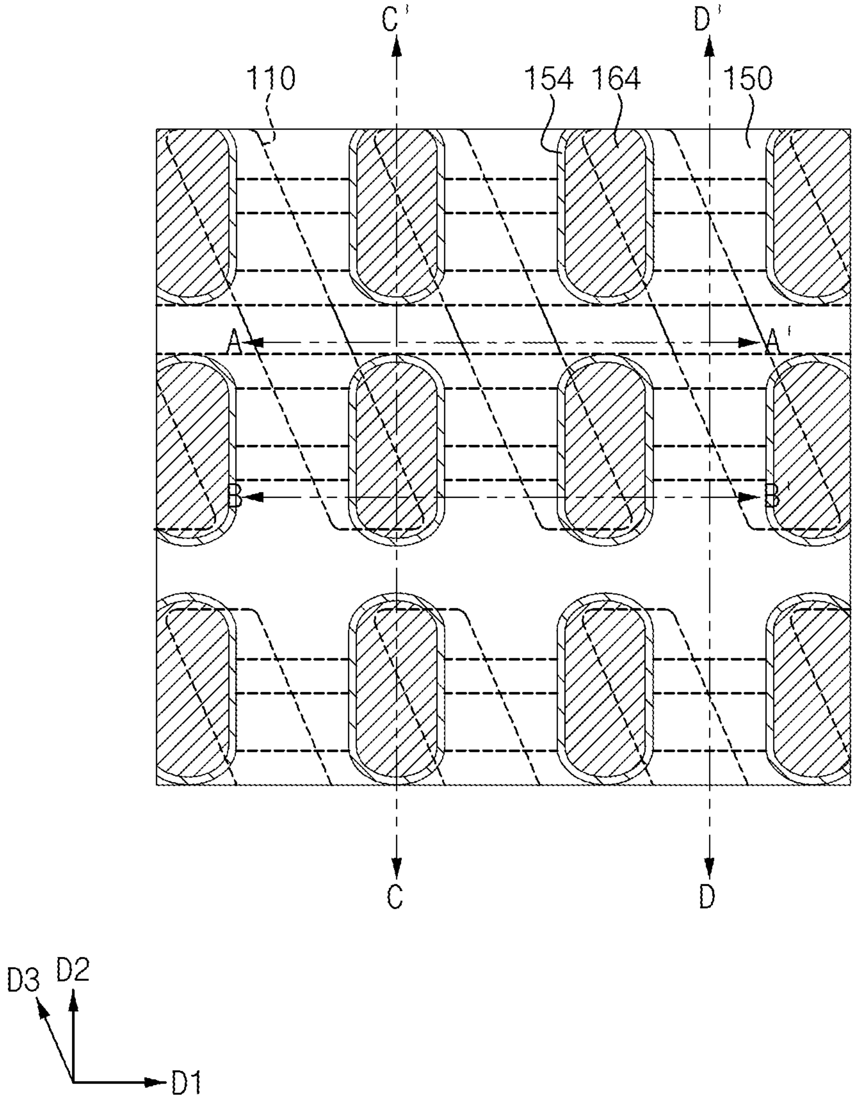
Figure 31:
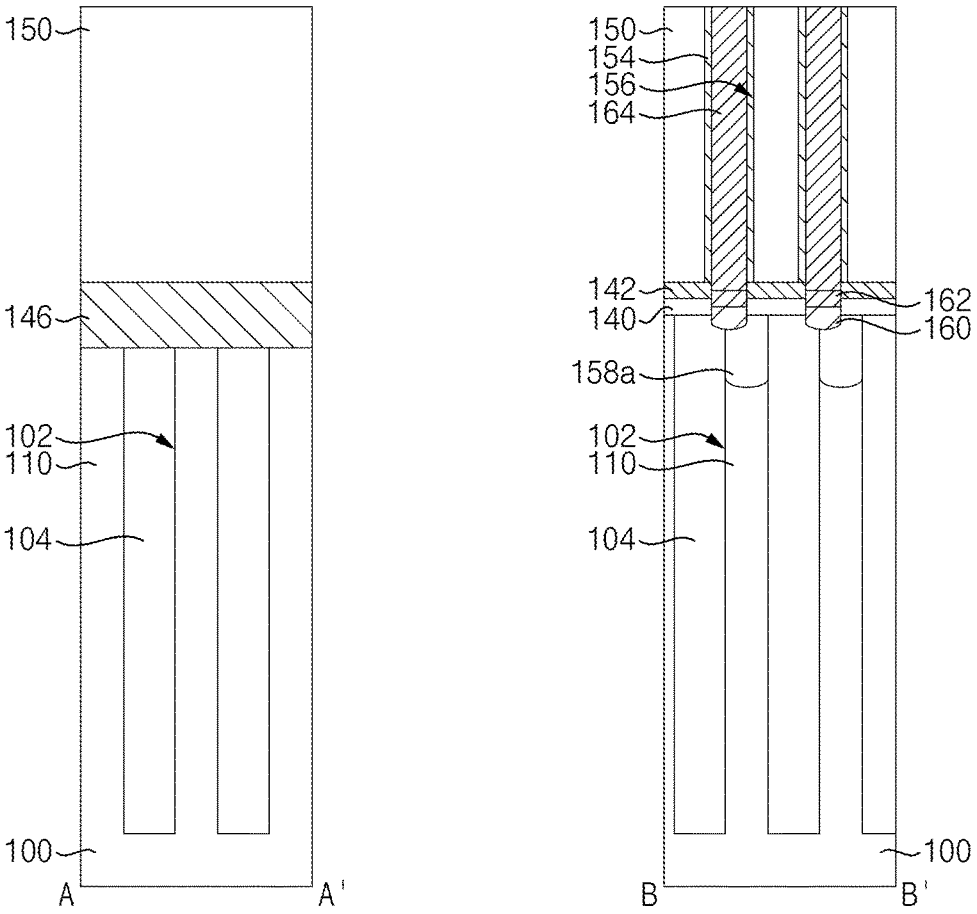
Figure 32:
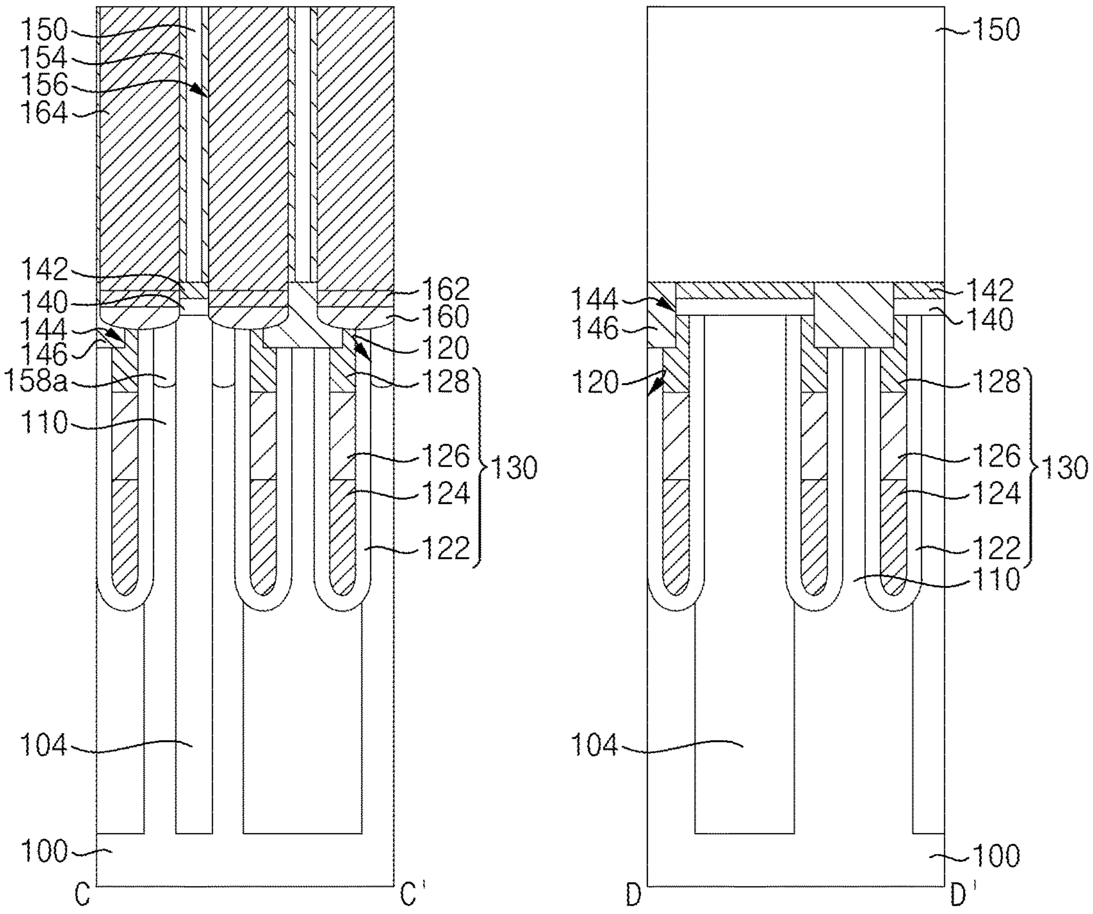

Referring to FIGS. 30 to 32, a metal layer may be formed on the first metal silicide pattern 162 and the second sacrificial mold layer 150 to fill the first contact hole 156. The metal layer may be planarized until an upper surface of the second sacrificial mold layer 150 may be exposed to form the first contact plug 164 in the first contact hole 156. In example embodiments, the first contact plug 164 may include a first metal pattern. The first metal pattern may include, e.g., tungsten.

The first metal silicide pattern 162 may be positioned lower than the upper surface of the second buffer layer 142, and thus a bottom of the first contact plug 164 may be positioned lower than the upper surface of the second buffer layer 142.

In example embodiments, the first contact plug 164 may include one metal material. In this case, since only one metal material is disposed at a level higher than the second buffer layer 142, subsequent processes may be easily performed.

Figure 33:
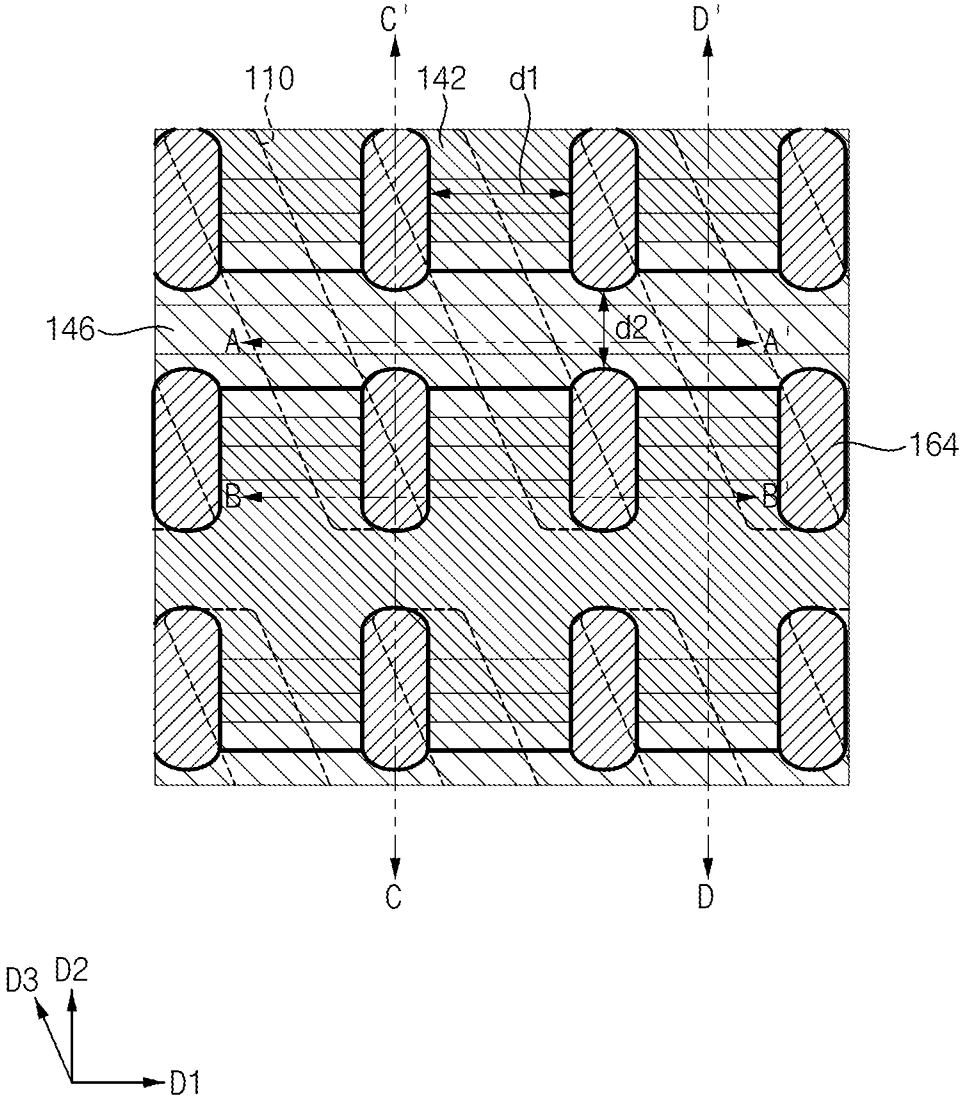
Figure 34:
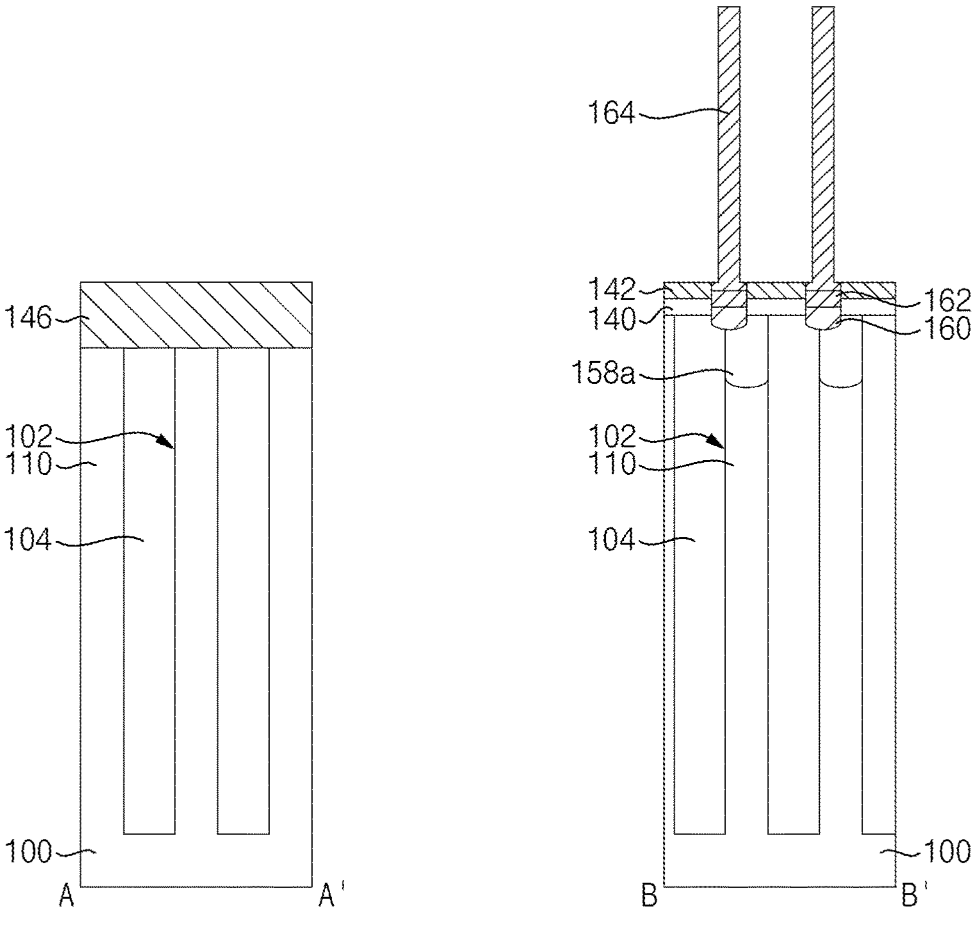
Figure 35:
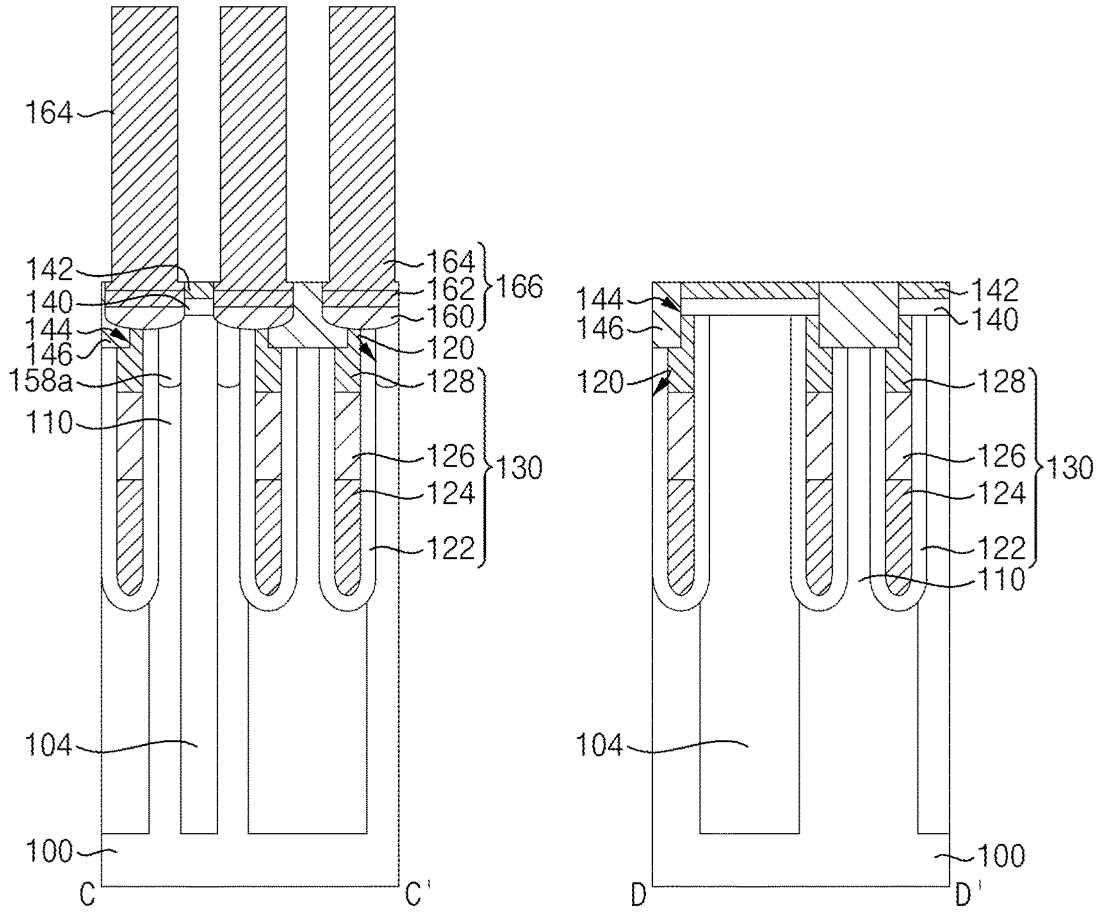

Referring to FIGS. 33 to 35, the second sacrificial mold layer 150 may be removed. After that, the capping spacer 154 may be removed. Thus, the sidewall and upper surface of the first contact plug 164 may be exposed.

The exposed sidewall and upper surface of the first contact plug 164 may be partially etched by a predetermined thickness, so that a width (e.g., a diameter) of the first contact plug 164 may be adjusted. In addition, a distance between the first contact plugs 164 may be adjusted. When the etching process is performed, lower and upper widths of the first contact plug 164 may be different from each other. The sidewall of the first contact plug 164 may have a bent shape at a level of the upper surface of the second buffer layer 142. A portion higher than the second buffer layer 142 in the first contact plug 164 may have a width less than a portion lower than the second buffer layer 142 in the first contact plug 164.

In some example embodiments, a partially etching process of the exposed sidewall and upper surface of the first contact plug 164 may not be performed. In this case, as shown in FIG. 4, upper and lower widths of the first contact plug 164 may be substantially the same. A sidewall of the first contact plug 164 may not have a bent shape at a level of an upper surface of the second buffer layer.

Neighboring first contact plugs 164 may be arranged in each of the first direction D1 and the second direction D2. A space between the first contact plugs 164 in the first direction D1 may be a first distance d1, and a space between the second contact plugs in the second direction D2 may be a second distance d2 less than the first distance d1.

A stacked structure including the first silicon layer 160, the first metal silicide pattern 162 and the first contact plug 164 may serve as the first contact structure 166.

Figure 36:
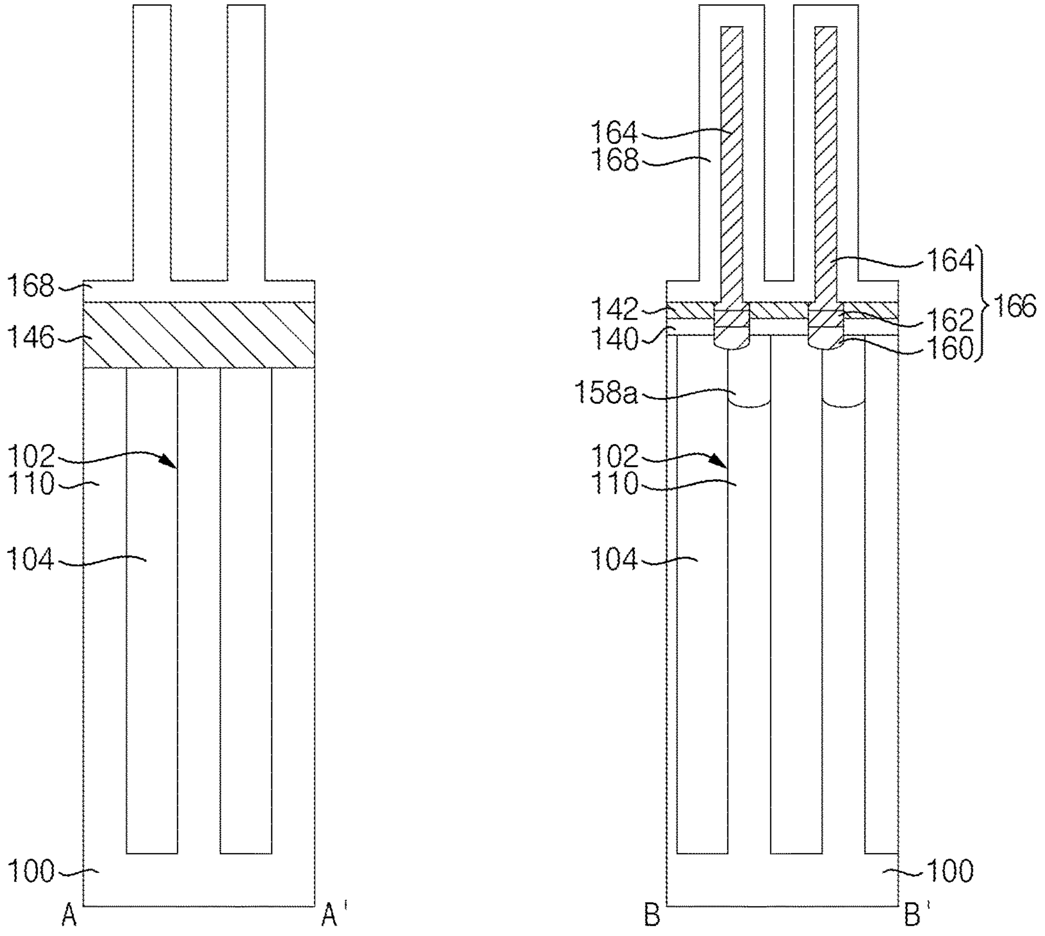
Figure 37:
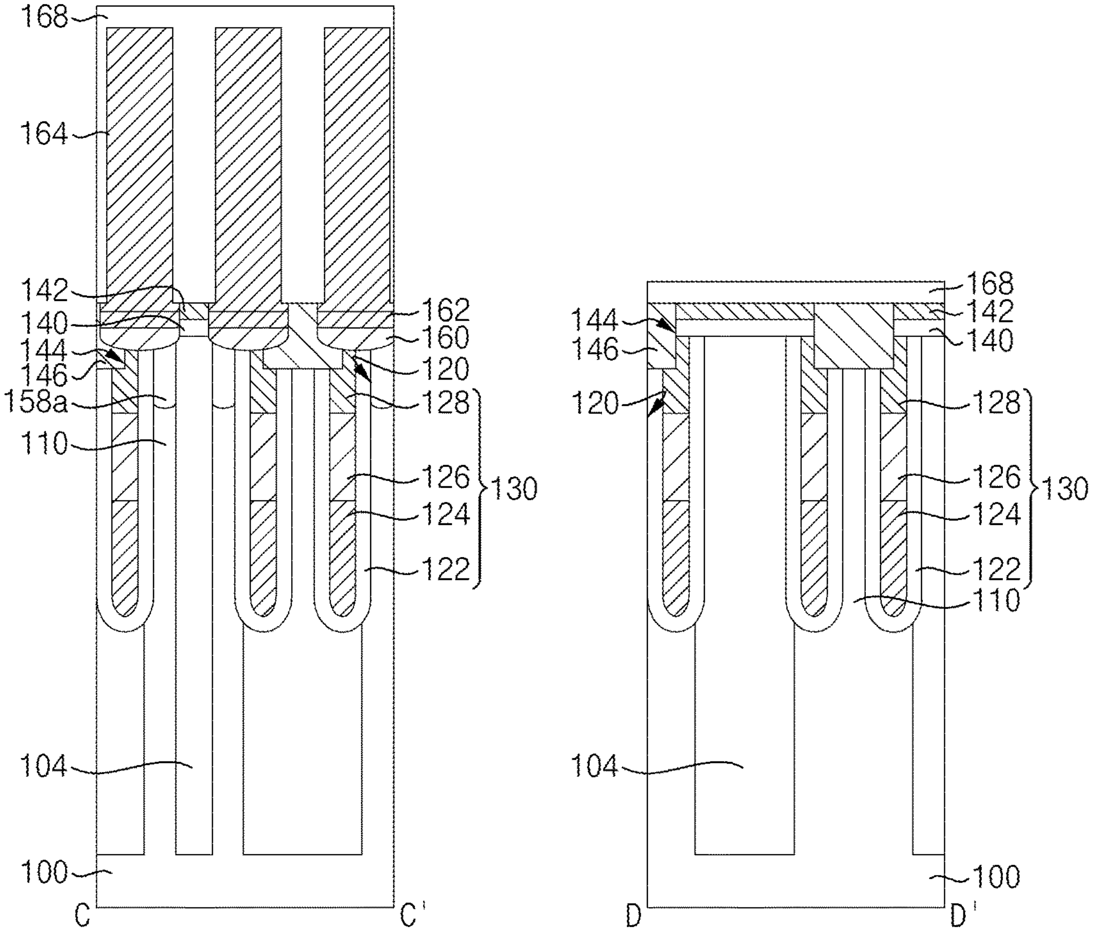

Referring to FIGS. 36 and 37, an insulation spacer layer 168 may be conformally formed to cover the surfaces of the first contact plugs 164 and the second buffer layer 142 and the first sacrificial mold layer pattern 146 between the first contact plugs 164.

The insulation spacer layer 168 may be formed so as not to completely fill the space having the first distance d1 between the first contact plugs 164 in the first direction D1. However, the insulation spacer layer 168 may be formed to completely fill the space having the second distance d2 between the first contact plugs 164 in the second direction D2.

Accordingly, the insulation spacer layer 168 may surround sidewalls of the first contact plugs 164. The insulation spacer layer 168 may have a connected shape in the second direction D2 while filling the space having the second distance d2 between the first contact plugs 164 in the second direction D2. In addition, an opening extending in the second direction D2 and having a line shape may be formed between the first contact plugs 164 in the first direction D1 by the insulation spacer layer 168.

A deposition thickness of the insulation spacer layer 168 may be greater than ½ of the second distance d2 and less than ½ of the first distance d1. The opening may be a region for forming a bit line structure in subsequent processes.

Insulation materials of the insulation spacer layer 168 and the number of stacked layers included in the insulation spacer layer 168 may not be limited. In example embodiments, the insulation spacer layer 168 may include a single insulation material. In some example embodiments, the insulation spacer layer 168 may be formed by laterally stacking a plurality of insulation materials. In some example embodiments, an insulation spacer may include air. In example embodiments, the insulation spacer layer 168 may include, e.g., silicon oxide, SiOCN, SiN, or the like.

Figure 38:
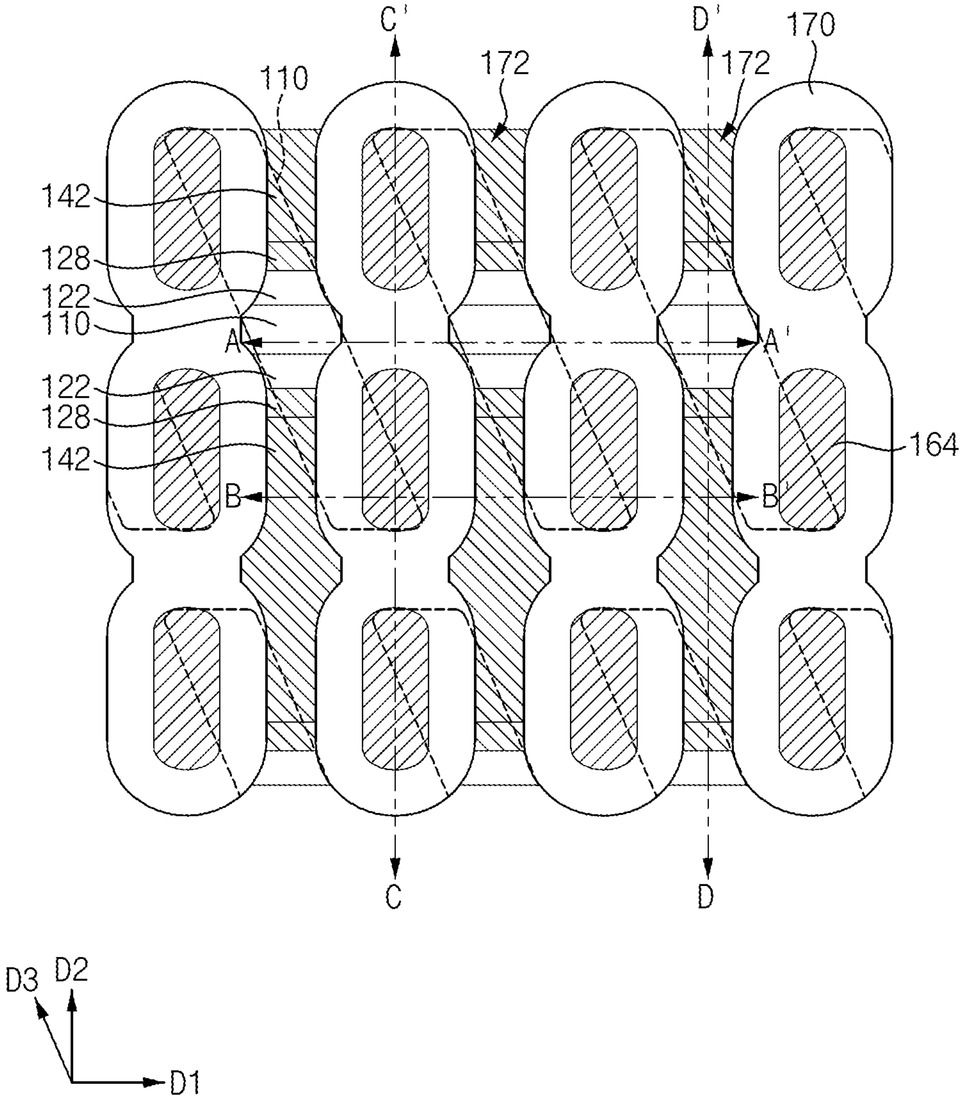
Figure 39:
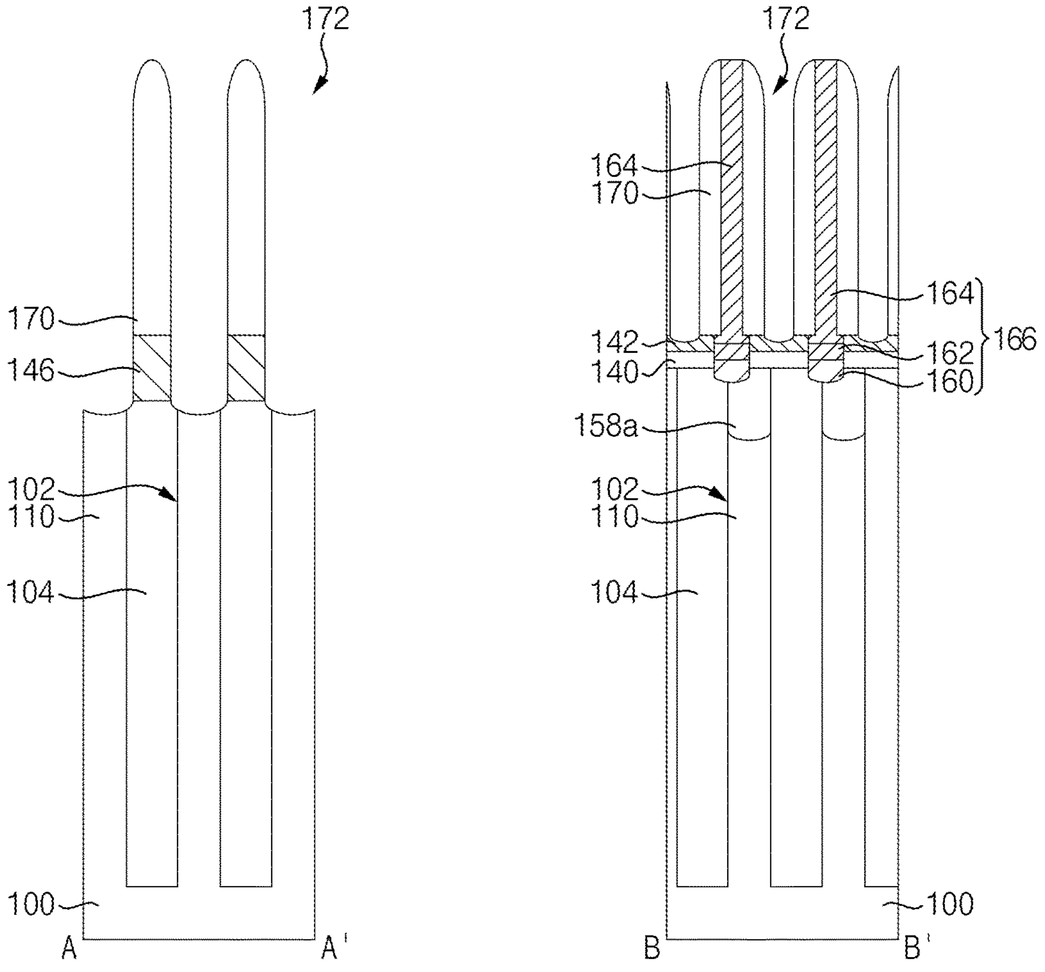
Figure 40:
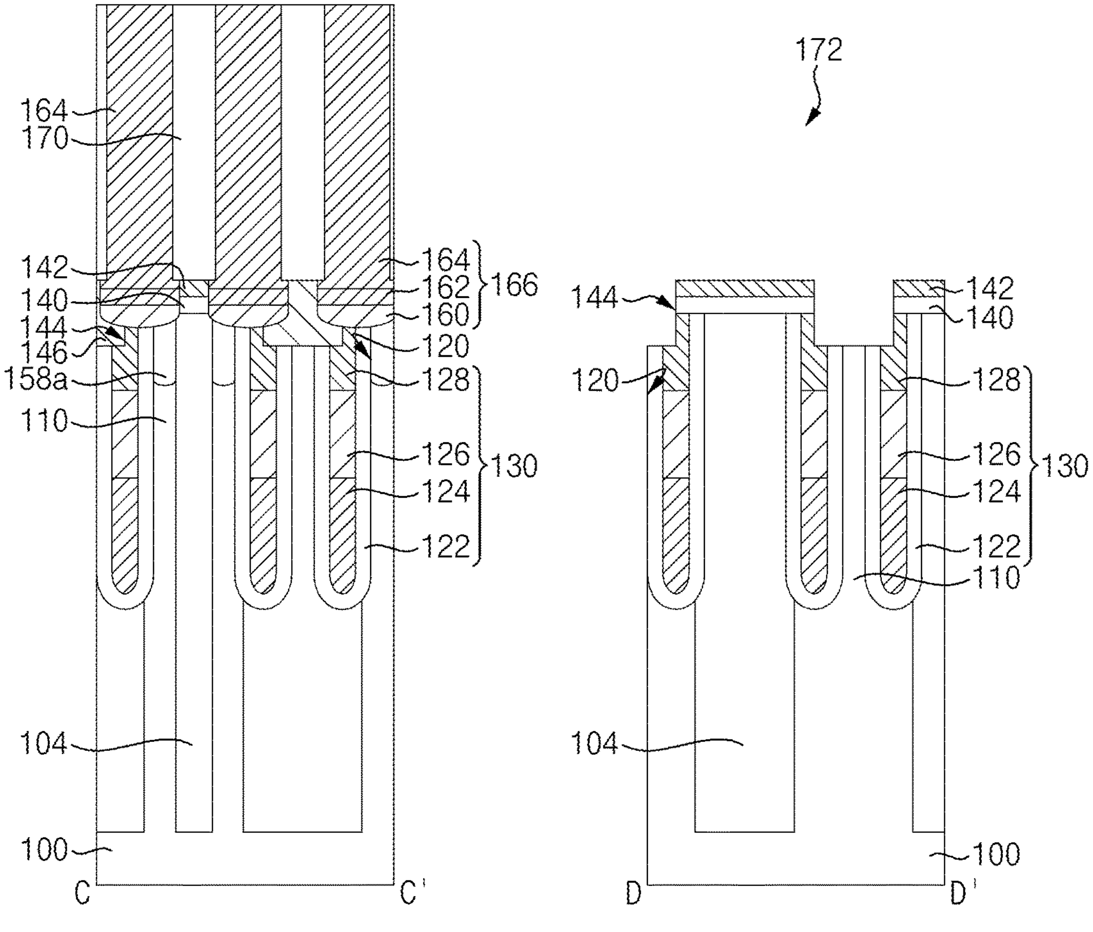

Referring to FIGS. 38 to 40, the insulation spacer layer 168 may be anisotropically etched to form an insulation spacer 170 on sidewalls of the first contact plugs 164.

Subsequently, the first sacrificial mold layer pattern 146 exposed by the bottom of the opening extending in the second direction D2 between the insulation spacers 170 may be selectively anisotropically etched, so that the central portion of the active pattern 110, and upper portions of the gate mask 128 and the gate insulation pattern 122 adjacent thereto may be exposed. In the etching process, the second buffer layer 142 may not be etched.

Accordingly, the first opening 172 extending in the second direction D2 may be formed between the insulation spacers 170. The central portion of the active pattern 110, the second buffer layer 142, the gate mask 128, and the gate insulation pattern 122 may be exposed by the bottom of the first opening 172.

In this case, the first opening 172 may not have a sidewall having a straight line shape extending in the second direction D2. The sidewall of the first opening 172 may have a wave shape.

In example embodiments, the first opening 172 may include first portions having a first width W1 and second portions having a width greater than the first width W1. In the first opening 172, the first portion and the second portion may be alternately and repeatedly disposed in the second direction D2. In the first opening 172, a portion where the central portion of the active pattern 110 is exposed may have a width greater than the first width. The central portions of the active patterns 110 may be exposed by at least portion of the second portions.

The width of the second portion of the first opening 172 may vary according to the thickness and shape of the insulation spacer layer 168 filling the space between the first contact plugs 164 in the second direction D2.

In the plan view, the second portion of the first opening 172 may include a portion having a gradually increasing width, a portion having a widest width, and a portion having a gradually decreasing width. In example embodiments, the portion having the widest width in the second portion of the first opening 172 may not include a cusp.

In some example embodiments, when the insulation spacer layer 168 is conformally formed, as shown in FIG. 6, the portion having the widest width in the second portion of the first opening 172 may include a cusp P.

In some example embodiments, the width of the first opening 172 may be adjusted by wet etching the insulation spacer layer 168 to a partial thickness.

After this, a cleaning process may be additionally performed.

Figure 41:
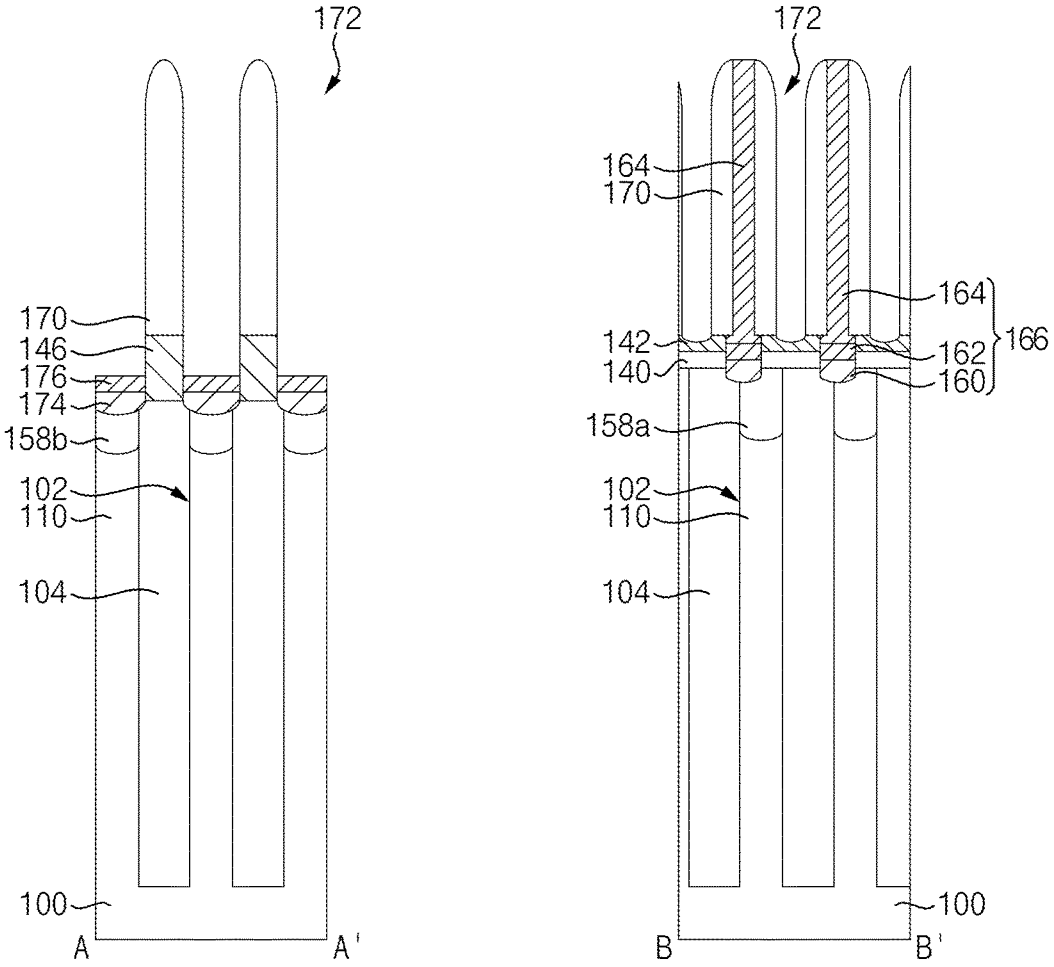
Figure 42:
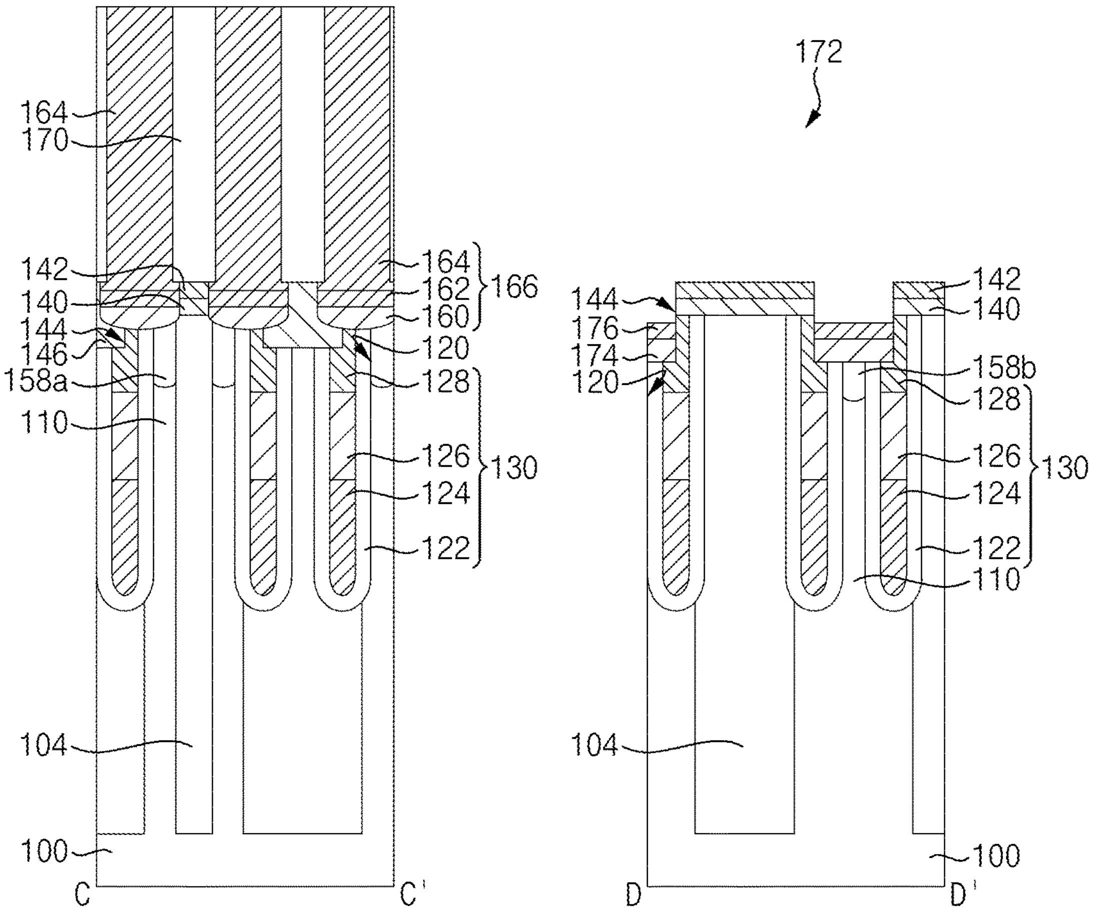

Referring to FIGS. 41 and 42, a second silicon layer 174 doped with impurities may be formed on the upper surface of the active pattern 110 exposed by the bottom of the first opening 172. The impurities may be N-type impurities.

In example embodiments, the second silicon layer 174 may be formed by a selective epitaxial growth process. In this case, the second silicon layer 174 may be formed only on an exposed upper surface of the active pattern 110.

In some example embodiments, a polysilicon layer may be deposited, and then the polysilicon layer may be etched by an etch-back process to form the second silicon layer 174.

The process for forming the second silicon layer 174 may be performed to increase an area of silicon contacting a second metal layer, in a subsequent silicidation process. In some example embodiments, the process for forming the second silicon layer 174 may be omitted.

The second metal layer may be formed on the second silicon layer 174, and then a heat treatment of the second metal layer may be performed to form a second metal silicide pattern 176 on the bottom of the first opening 172. The second metal silicide pattern 176 may be formed by reacting the second silicon layer 174 and the second metal layer with each other.

Meanwhile, impurities doped in the second silicon layer 174 may diffuse into the active pattern 110 to form a second impurity region 158*b* on the active pattern 110.

Figure 43:
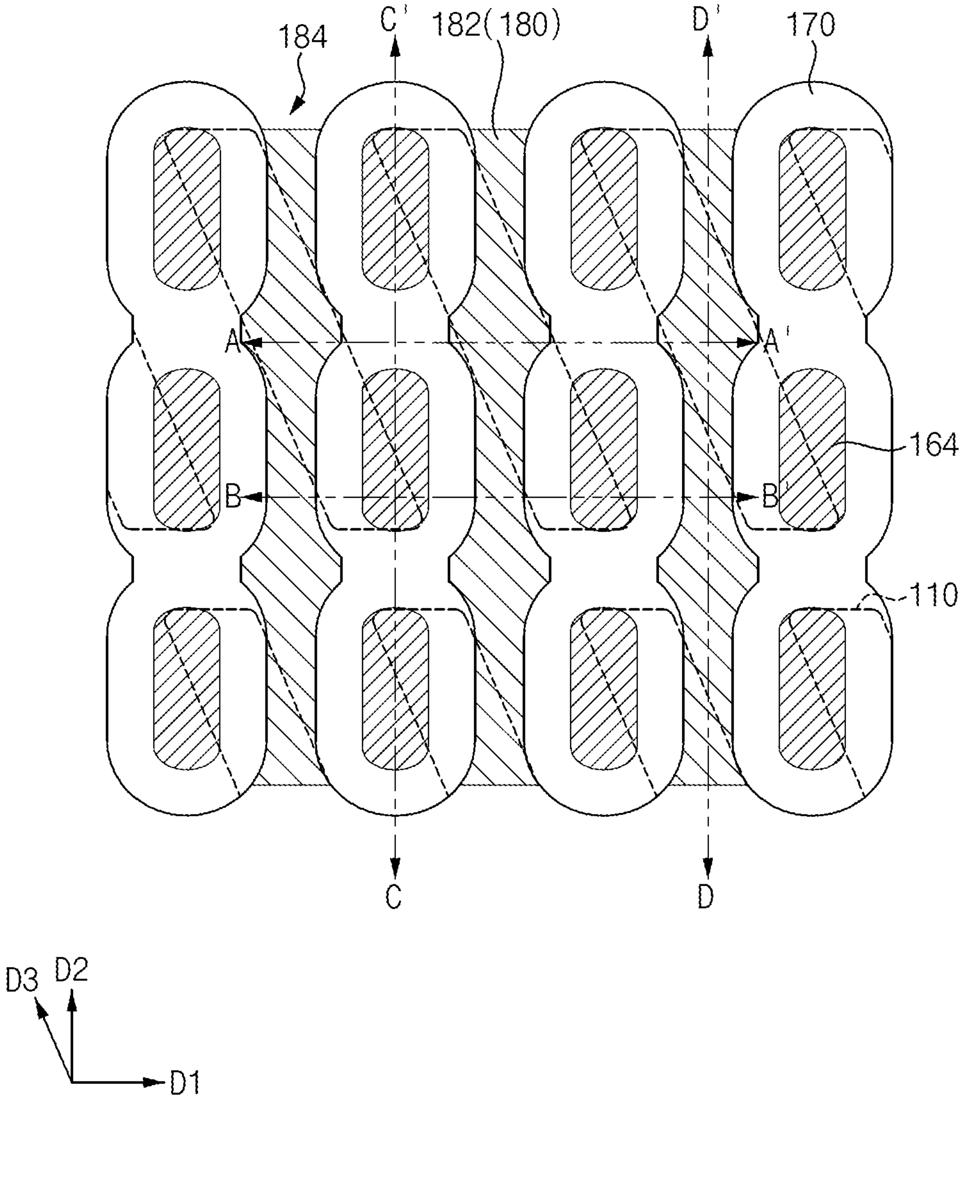
Figure 44:
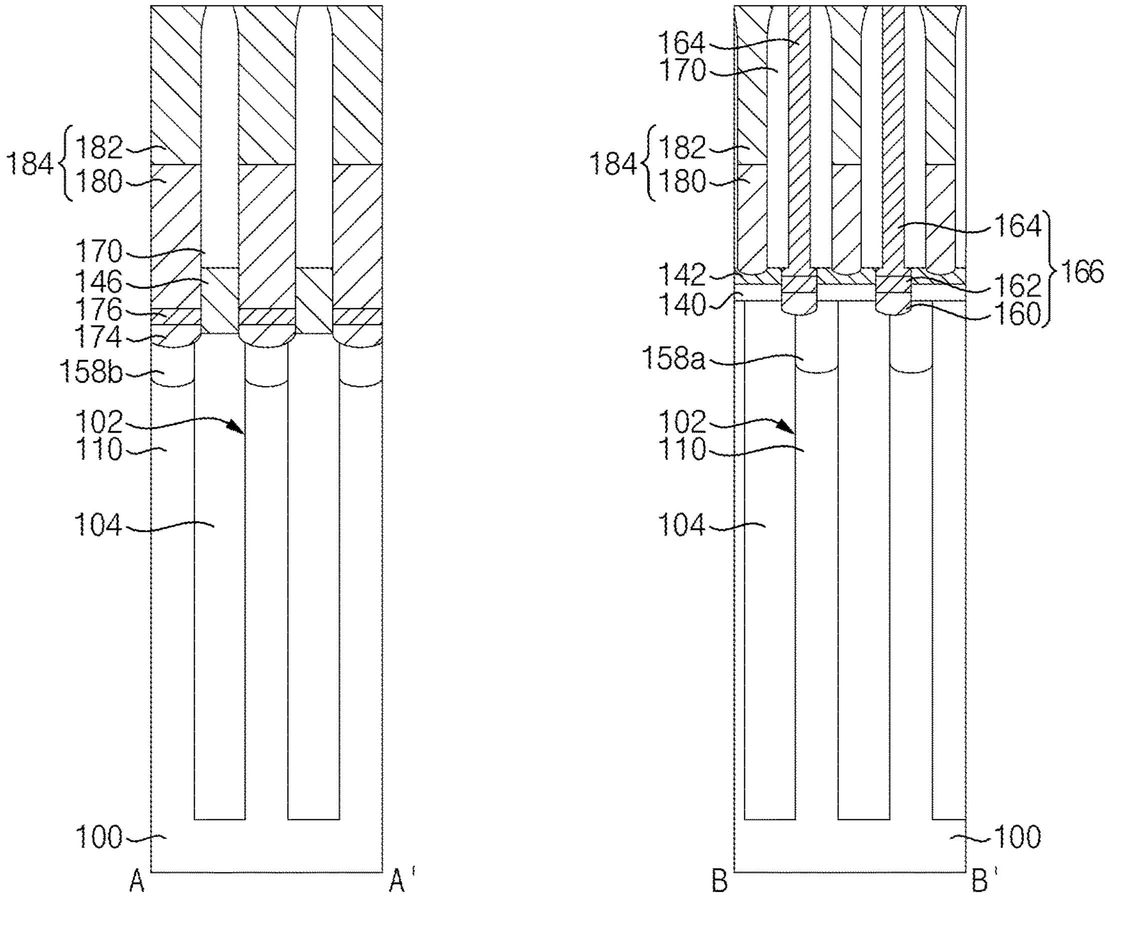
Figure 45:
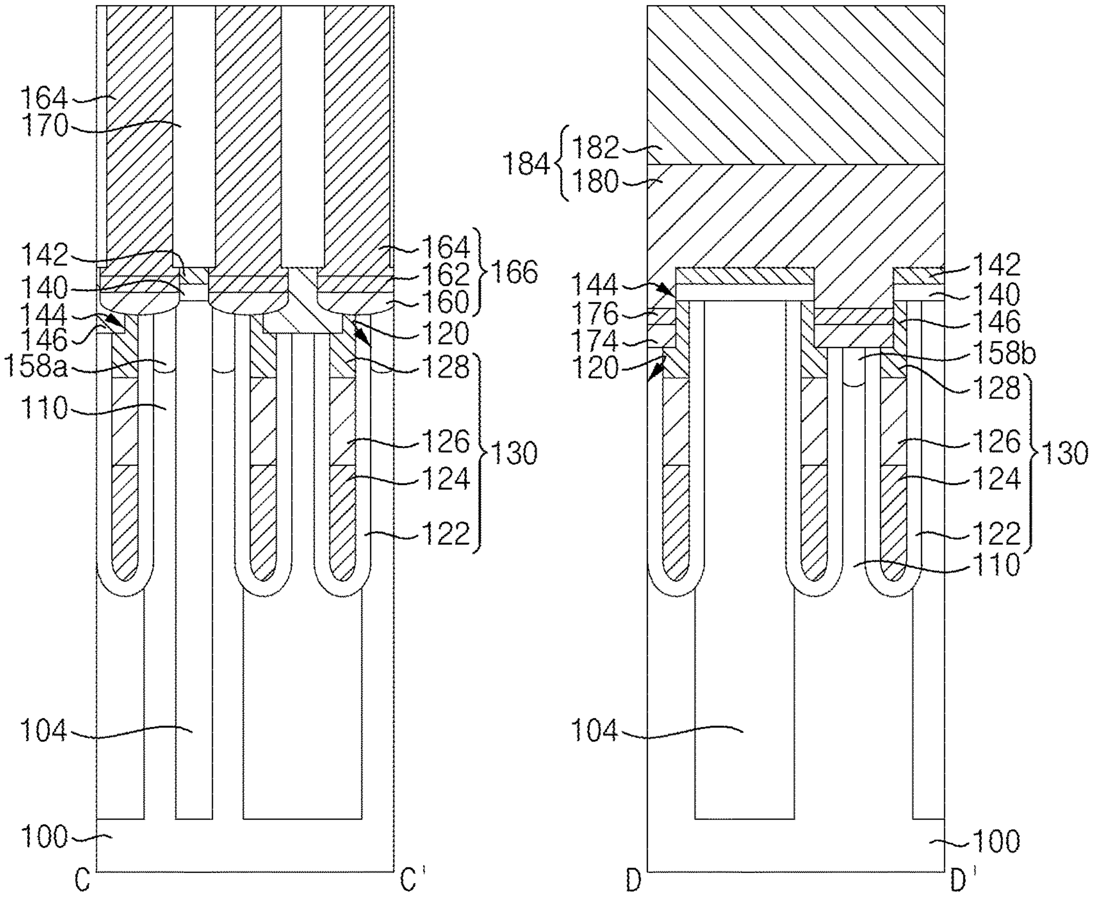

Referring to FIGS. 43 to 45, a first conductive layer may be formed on the insulation spacer 170 and the first contact plug 164 to fill the first opening 172. The first conductive layer may include a metal. In example embodiments, the first conductive layer may include tungsten.

The first conductive layer may be etched back to form a bit line pattern 180 filling at least a lower portion of the first opening 172. The bit line pattern 180 may include a third portion, the bottom of which may contact the central portion of the active pattern 110, and a fourth portion, the bottom of which may contact the second buffer layer 142.

A first capping layer may be formed on the bit line pattern 180 and the insulation spacer 170 to fill a remaining space of the first opening 172. The first capping layer may include, e.g., silicon nitride. The first capping layer may be planarized until upper surfaces of the insulation spacer 170 and the first contact plug 164 may be exposed to form a first capping layer pattern 182 on the bit line pattern 180 filling the first opening 172.

Accordingly, a bit line structure 184 in which the bit line pattern 180 and the first capping layer pattern 182 are stacked may be formed. An upper surface of the bit line structure 184 may be substantially coplanar with upper surfaces of the insulation spacer 170 and the first contact plug 164.

A sidewall profile of the bit line structure 184 may be substantially the same as a sidewall profile of the first opening 172. Accordingly, in the bit line structure 184, the first portion having the first width W1 and the second portion having the width greater than the first width may be alternately and repeatedly disposed. A portion of the lower surface of the second portion of the bit line structure 184 may contact the central portion of the active pattern 110.

In the plan view, a second portion of the bit line structure 184 may include a portion having a gradually increasing width, a portion having a widest width, and a portion having a gradually decreasing width. In example embodiments, the portion having the widest width in the second portion of the bit line structure 184 may not include a cusp.

In some example embodiments, when the insulation spacer layer 168 is conformally formed, as shown in FIG. 6, the portion having the widest width in the second portion of the bit line structure 184 may include a cusp P1.

As described above, the bit line structure 184 may be formed by a damascene process. Therefore, a patterning process including direct photolithography of the conductive layer may not be performed when forming the bit line structure 184. Accordingly, patterning defects of the bit line structure 184 may be decreased.

The first opening 172 for forming the bit line structure 184 may be self-aligned by the insulation spacer 170. A separate photo process for forming the first opening 172 may not be performed. Therefore, the first opening 172 may be formed by a simple process.

According to change the shape of the sidewall of the first opening 172, the bit line structure 184 may be formed to have various sidewall shapes and various line widths.

Figure 46:
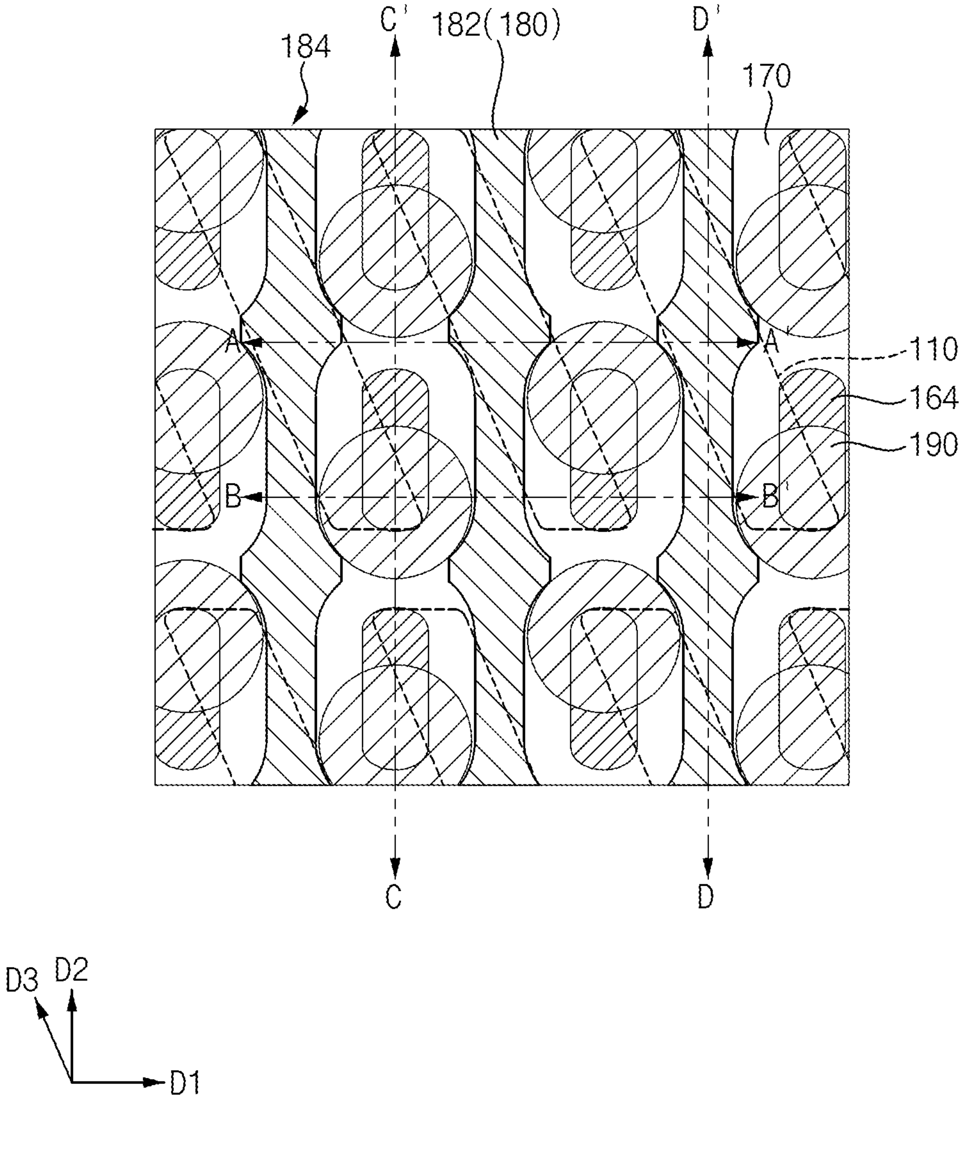
Figure 47:
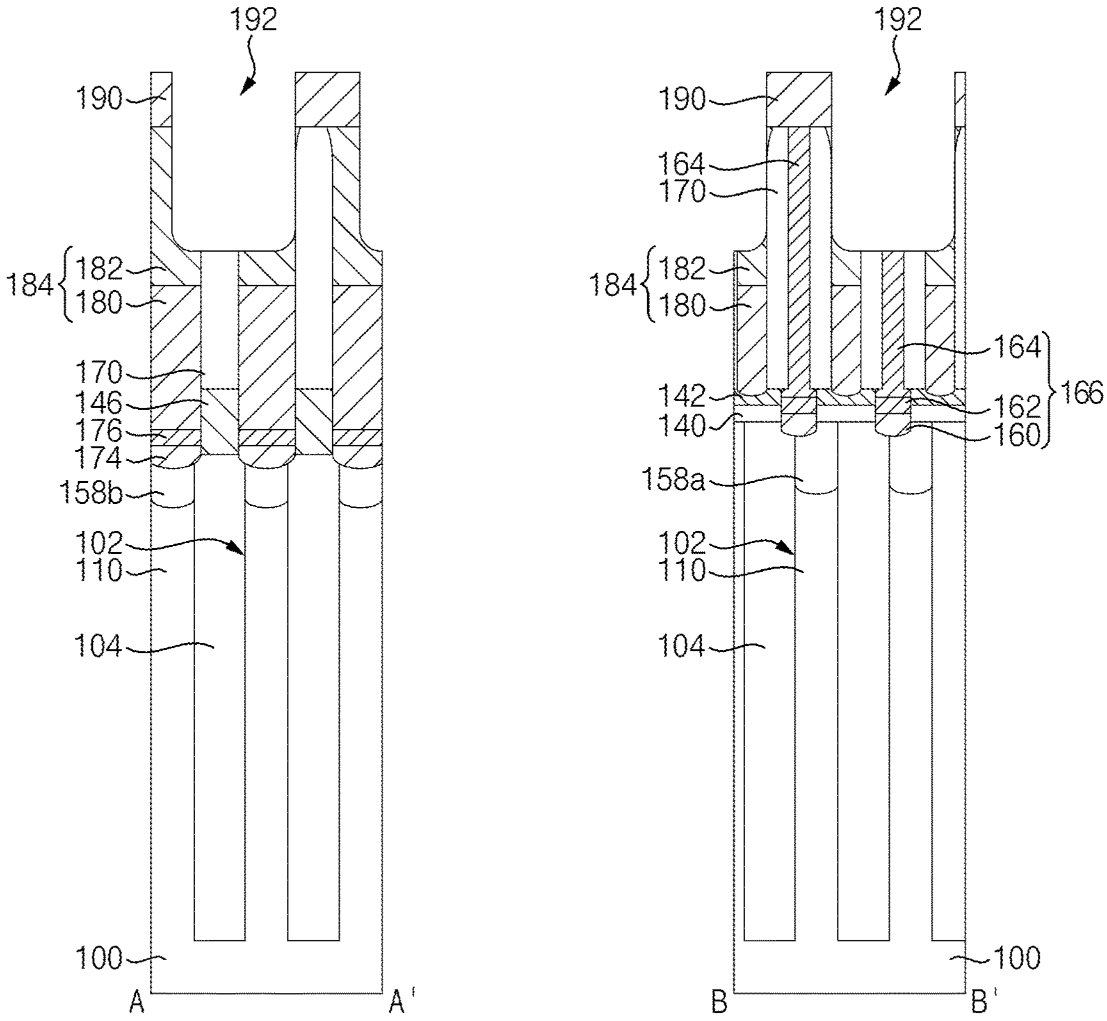
Figure 48:
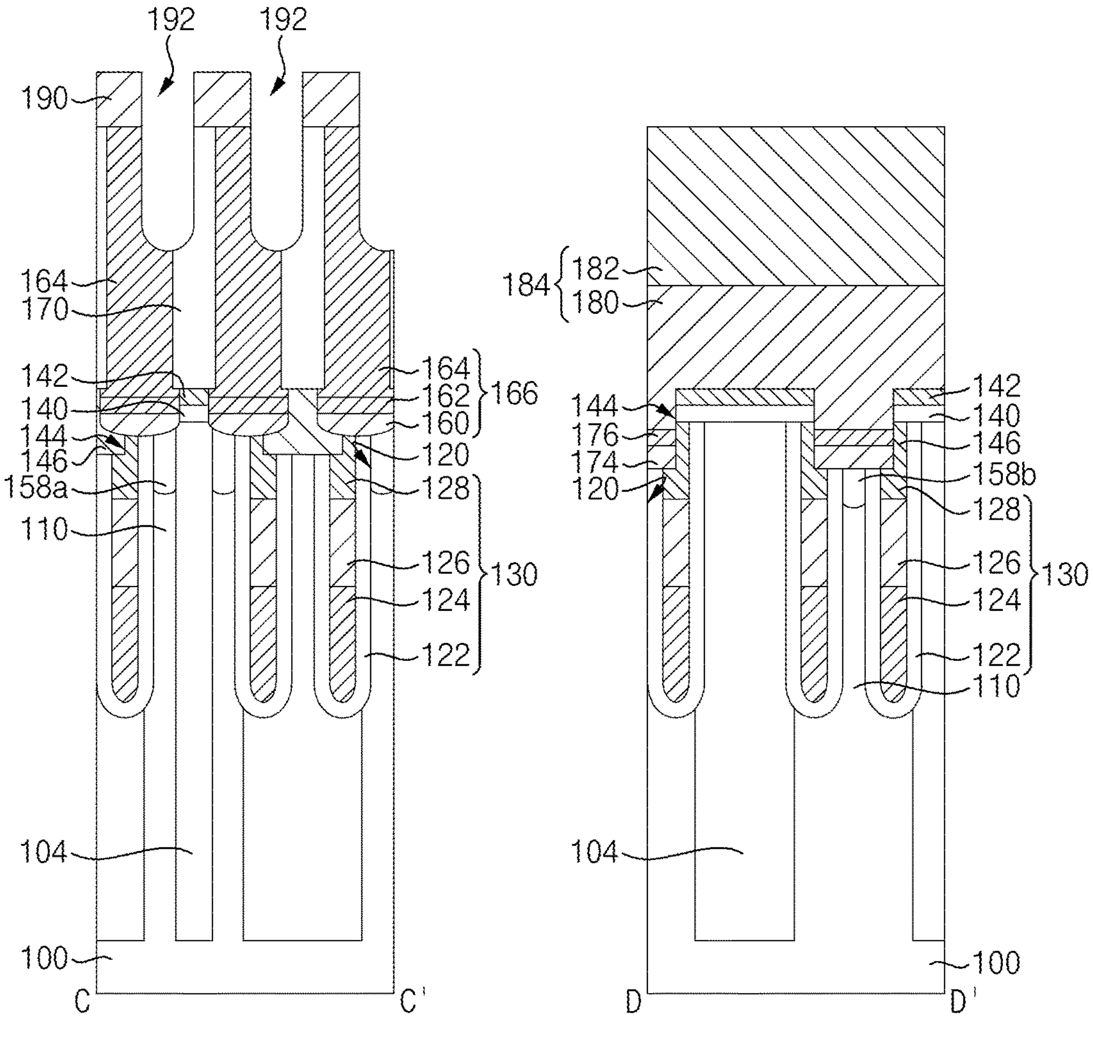

Referring to FIGS. 46 to 48, a second conductive layer may be formed on the bit line structure 184, the insulation spacer 170 and the first contact plug 164. The second conductive layer may include a metal. The second conductive layer may include, e.g., tungsten.

Portions of the second conductive layer, and the first contact plug 164, the insulation spacer 170 and the first capping layer pattern 182 thereunder may be etched to form landing pad patterns 190 contacting upper surfaced of the first contact plug 164, respectively. A second opening 192 may be formed between the landing pad patterns 190.

A bottom of the second opening 192 may be lower than an uppermost surface of the first contact plug 164. Therefore, a bridge defect in which the landing pad pattern 190 and the first contact plug 164 adjacent to the landing pad pattern 190 in a lateral direction connected to each other may be decreased.

As the upper portion of the first contact plug 164 is partially etched, an upper width of the first contact plug 164 may be less than a lower width of the first contact plug 164.

In example embodiments, the landing pad patterns 190 may be arranged in a honeycomb structure disposed at each vertex of the connected hexagon and at the center of the hexagon.

Figure 49:
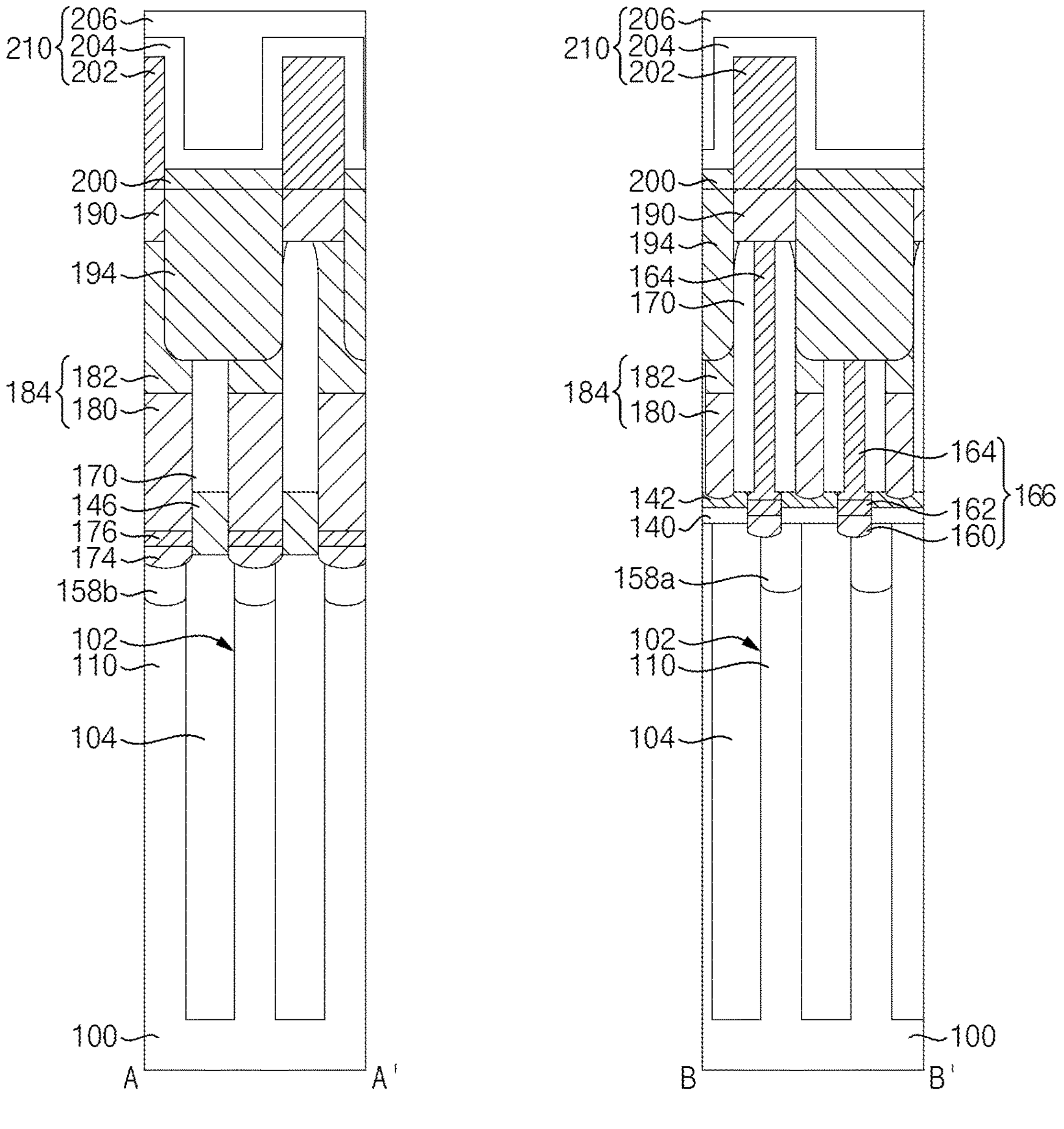
Figure 50:
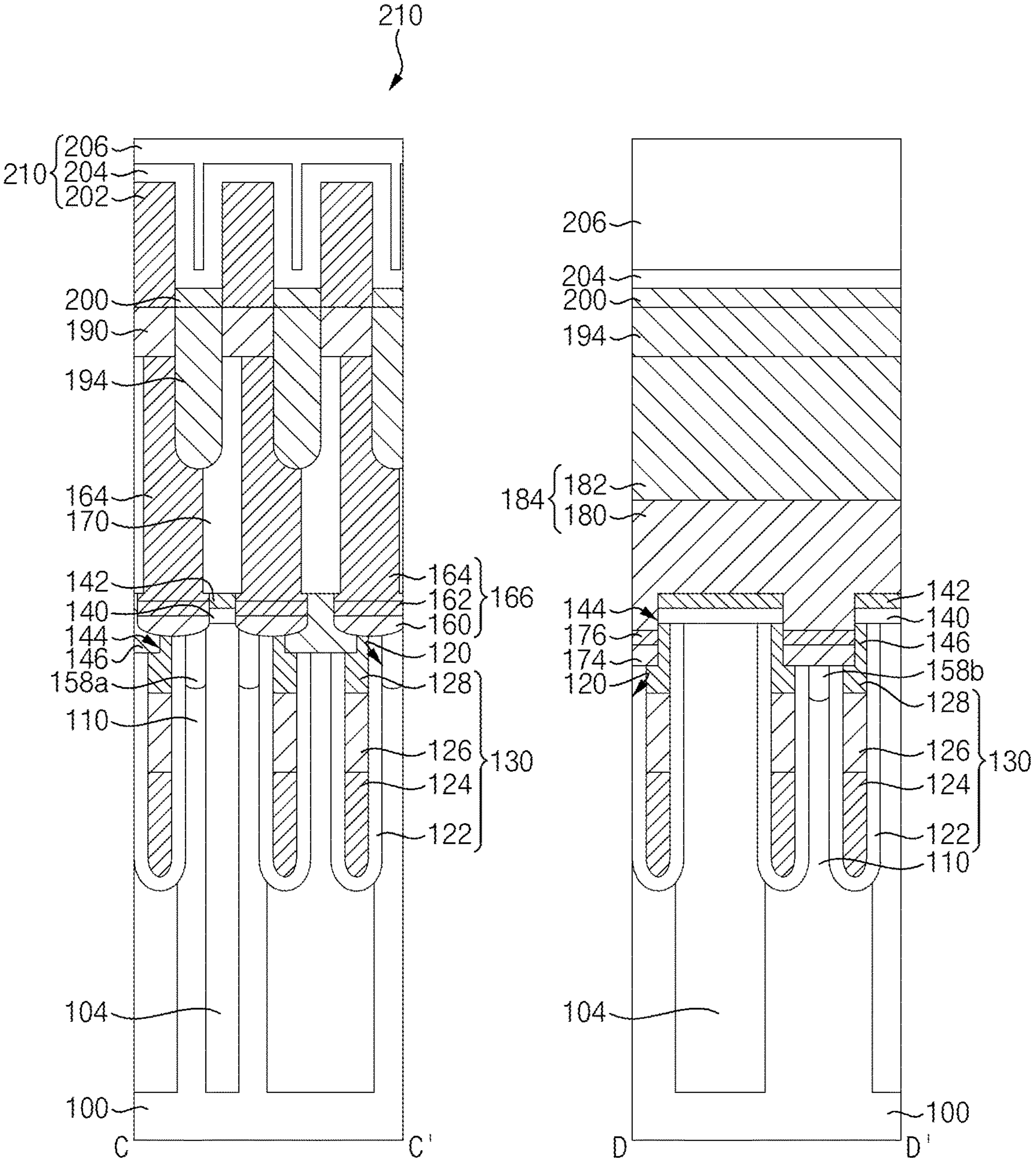

Referring to FIGS. 49 and 50, an upper insulation pattern 194 may be formed to fill the second opening 192.

An etch stop layer 200 may be formed on the landing pad pattern 190 and the upper insulation pattern 194. The etch stop layer 200 may include, e.g., silicon nitride.

A capacitor 210 passing through the etch stop layer 200 may be formed on the landing pad pattern 190. The capacitor 210 may include a lower electrode 202, a dielectric layer 204 and an upper electrode 206. The lower electrode 202 may contact the landing pad pattern 190. Accordingly, the lower electrode 202 may be disposed in the honeycomb structure. In example embodiments, the lower electrode 202 may have a pillar shape or a cylinder shape.

Figure 51:
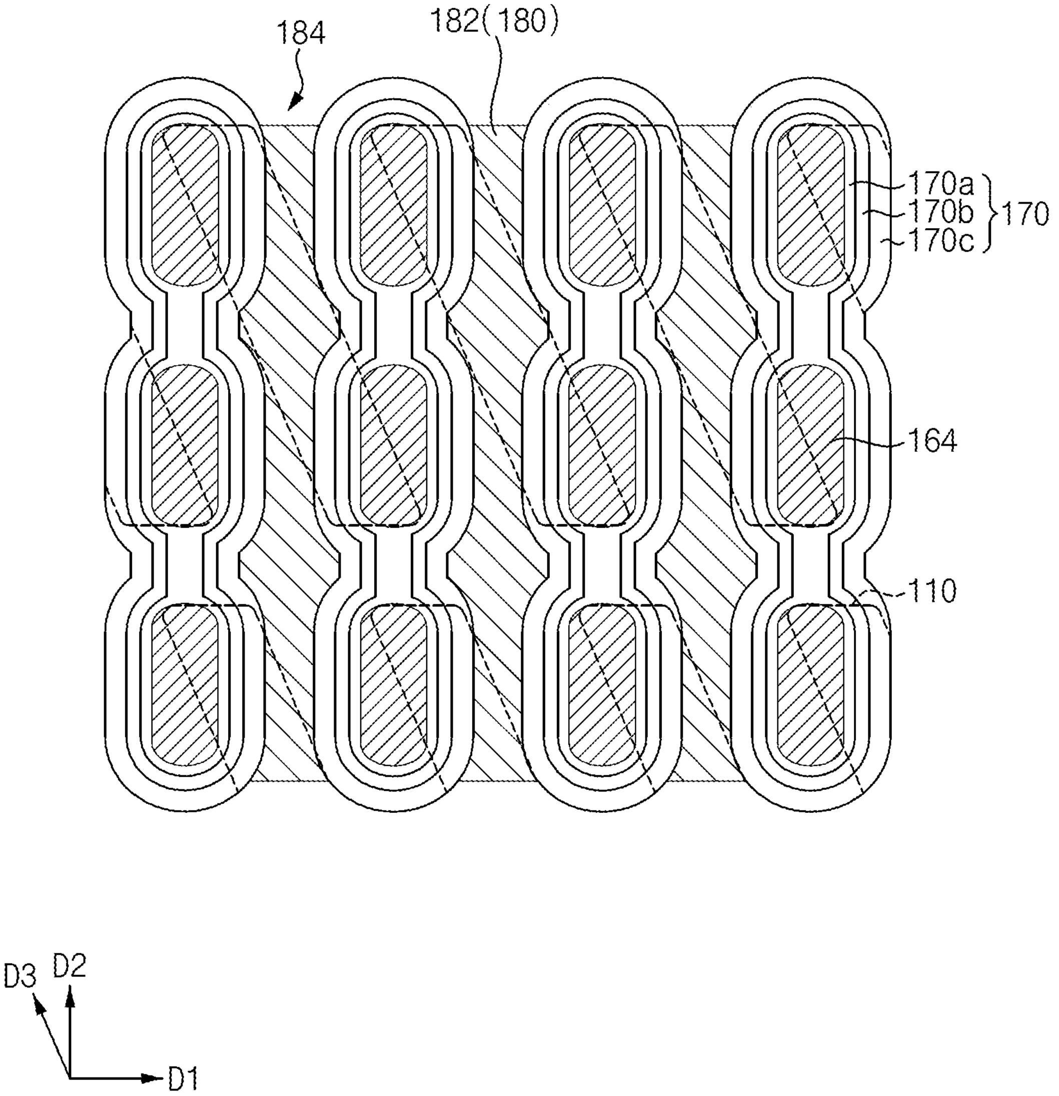
FIG. 51 is a plan view illustrating a semiconductor device according to example embodiments.

FIG. 51 is a plan view illustrating a semiconductor device according to example embodiments.

The semiconductor device shown in FIG. 51 is the same as the semiconductor device described with reference to FIGS. 1 to 5 except for an insulation spacer.

Referring to FIG. 51, the insulation spacer 170 may include a first insulation spacer 170*a*, a second insulation spacer 170*b*, and a third insulation spacer 170*c* sequentially stacked on a sidewall of the first contact plug 164. Insulation spacers contacting each other in the first to third insulation spacers may include different insulation materials. In example embodiments, each of the first to third insulation spacers 170*a*, 170*b*, and 170*c* may include silicon oxide, silicon nitride, SiOCN, or air.

Figure 52:
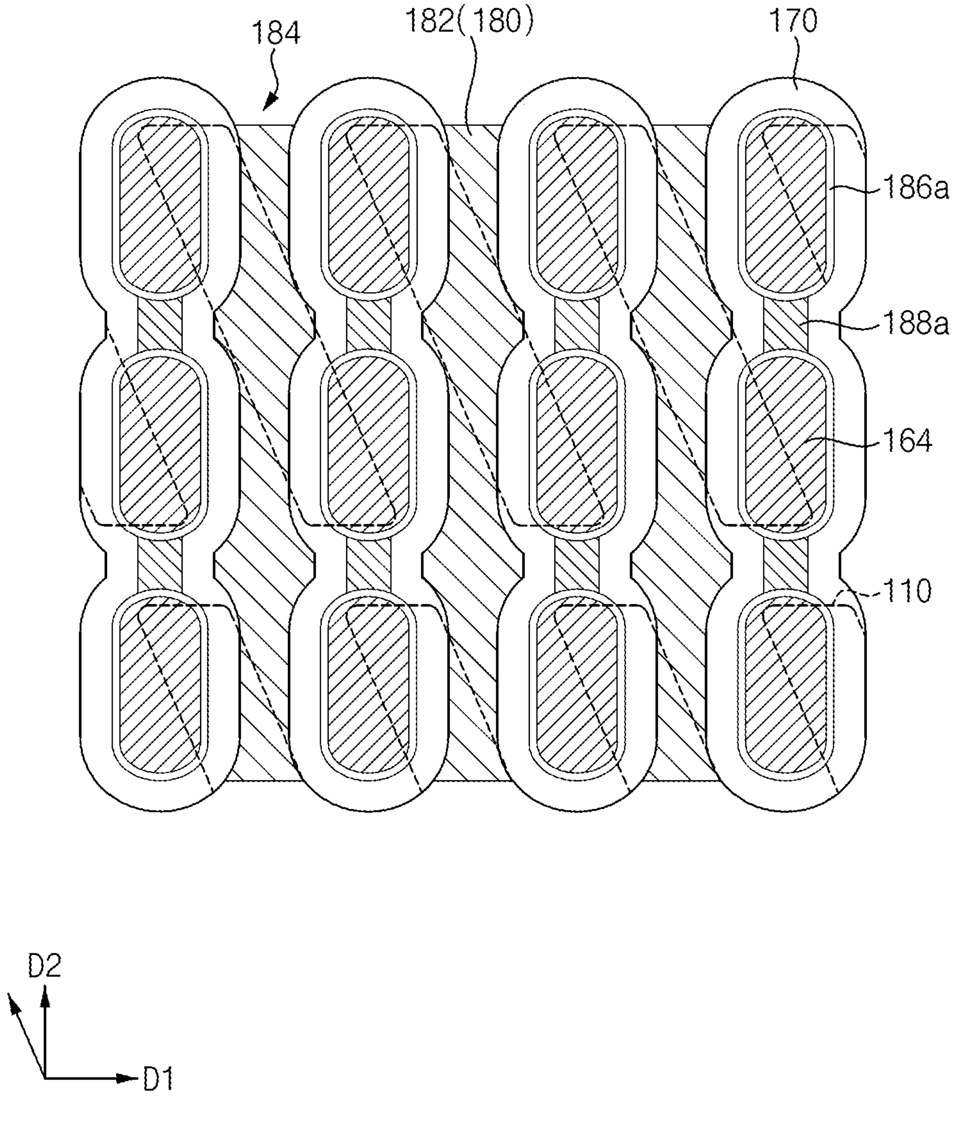
FIG. 52 is a plan view illustrating a semiconductor device according to example embodiments.

FIG. 52 is a plan view illustrating a semiconductor device according to example embodiments.

The semiconductor device shown in FIG. 52 is the same as the semiconductor device described with reference to FIGS. 1 to 5 except for further including an insulation structure.

Referring to FIG. 52, an insulation structure 188*a* may be further formed to connect sidewalls of the first contact plugs 164 spaced apart from each other in the second direction D2. That is, the insulation structure 188*a* may be disposed between the first contact plugs 164 in the second direction D2. The first contact plug 164 and the insulation structure 188*a* may be alternately and repeatedly disposed in the second direction, and may be connected to each other. A line structure including the first contact plugs 164 and the insulation structures 188*a* connected to each other may extend in the second direction D2.

The insulation structure 188*a* may include, e.g., silicon nitride. In this case, a protective insulation layer pattern 186*a* may surround a sidewall of the first contact plug 164.

The insulation spacer 170 may be formed on a sidewall of the line structure in which the first contact plugs 164 and the insulation structures 188*a* are connected to each other.

A bit line structure 184 may be formed in the first opening between the insulation spacers 170.

As the insulation structure 188*a* is formed, contact defects between adjacent bit line structures 184 may be decreased.

Figure 53:
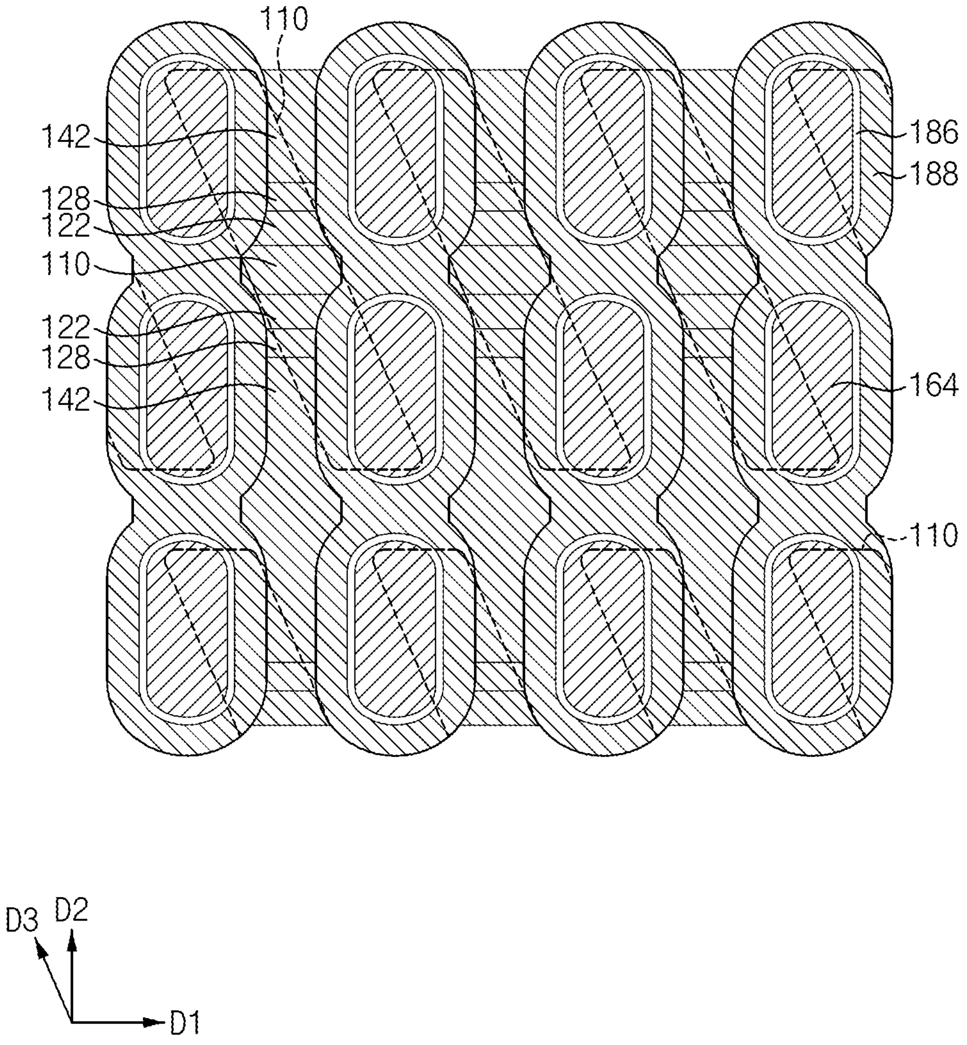
FIGS. 53 to 55 are plan views illustrating stages in a method of manufacturing a semiconductor device according to example embodiments.
Figure 54:
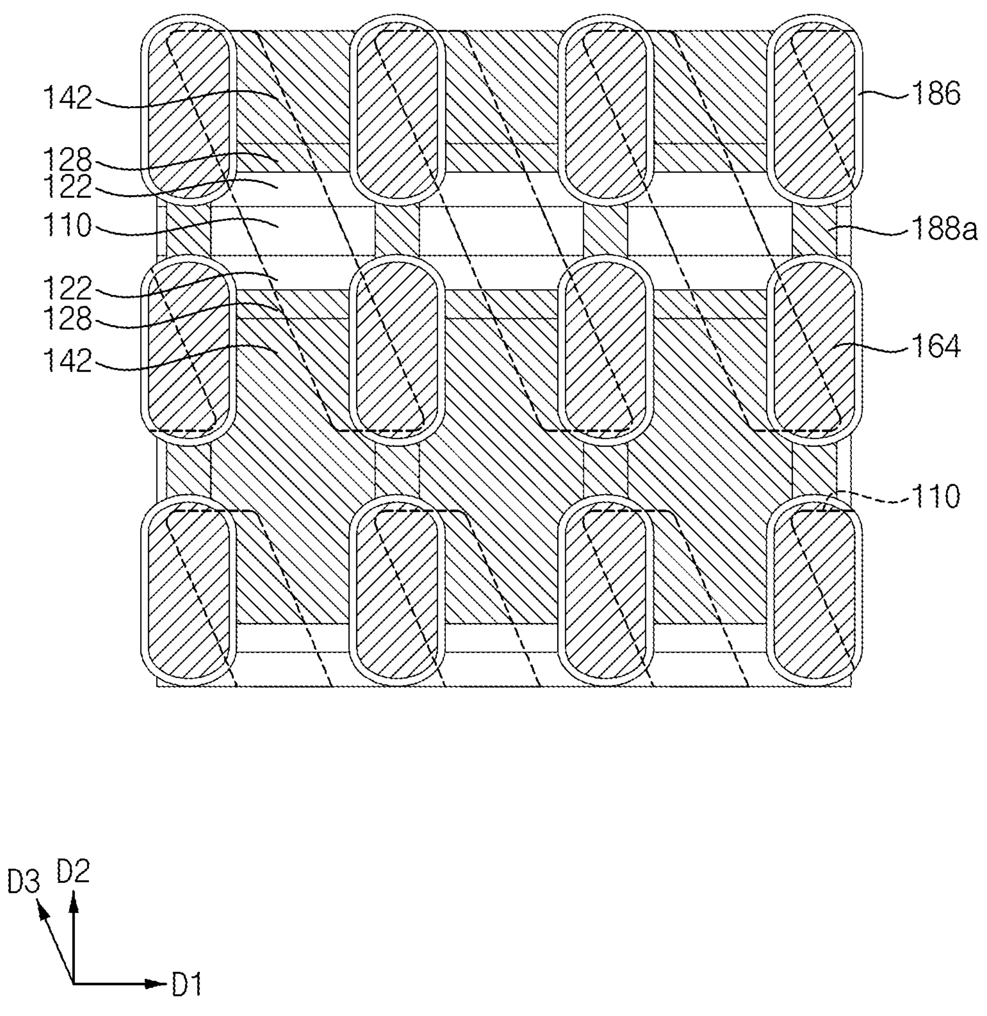
Figure 55:
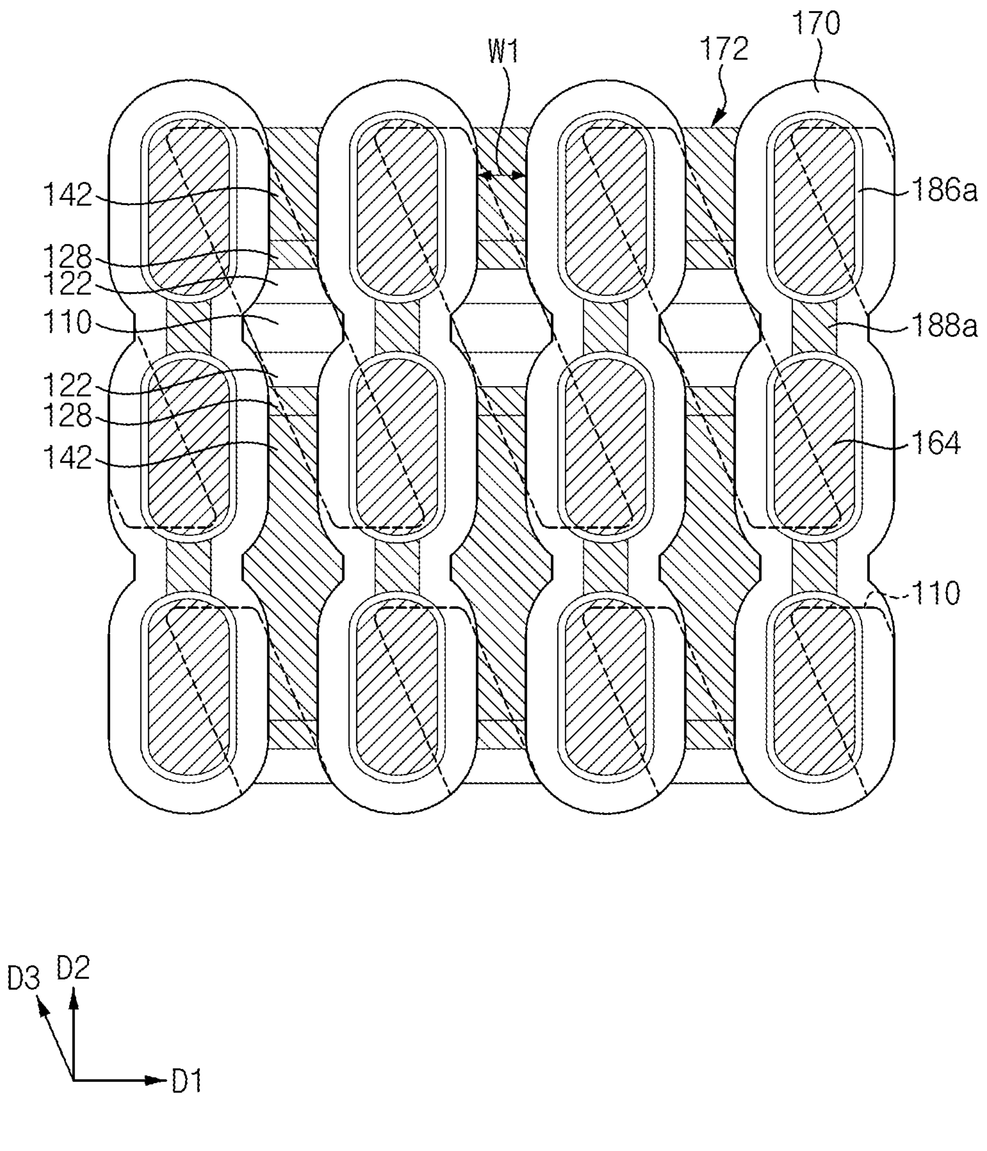

FIGS. 53 to 55 are plan views illustrating a method of manufacturing a semiconductor device according to example embodiments.

A method of manufacturing a semiconductor device described below may be the same as that described with reference to FIGS. 10 to 50 except for forming an insulation structure.

Referring to FIG. 53, first, the same process as described with reference to FIGS. 10 to 35 is performed. Thereafter, a protective insulation layer 186 may be conformally formed to cover surfaces of the first contact plugs 164, and the second buffer layer 142 and the first sacrificial mold layer pattern 146 between the first contact plugs 164. In example embodiments, the protective insulation layer 186 may include silicon oxide.

A preliminary insulation layer 188 may be conformally formed on the protective insulation layer 186. The preliminary insulation layer 188 may be formed so as not to completely fill a space between the first contact plugs 164 spaced apart in the first direction D1. However, the preliminary insulation layer 188 may be formed to completely fill a space between the first contact plugs 164 spaced apart in the second direction D2.

Therefore, the preliminary insulation layer 188 may surround the sidewall of the first contact plug 164. The preliminary insulation layer 188 may fill the space between the first contact plugs 164 in the second direction D2 so that the preliminary insulation layer 188 may have a shape connected to each other in the second direction D2. In addition, an opening having a line shape extending in the second direction D2 may formed between the first contact plugs 164 in the first direction D1 by the preliminary insulation layer 188.

A deposition thickness of the preliminary insulation layer 188 may be greater than ½ of a second distance between the first contact plugs 164 in the second direction D2, and the deposition thickness of the preliminary insulation layer 188 may be less than ½ of a first distance between the first contact plugs 164 in the first direction D1.

A thickness in the first direction D1 of the preliminary insulation layer 188 deposited on the sidewall of the first contact plug 164 may be less than a thickness in the first direction D1 of the preliminary insulation layer 188 filling the space between the first contact plugs 164 in the second direction D2.

In example embodiments, the preliminary insulation layer 188 may include, e.g., silicon nitride.

Referring to FIG. 54, the preliminary insulation layer 188 on the sidewall of the first contact plug 164 in the first direction D1 may be isotropically etched. The isotropic etching may be performed by wet etching process using, e.g., phosphoric acid as etchants. When the isotropic etching process is performed, the preliminary insulation layer 188 filling the space between the first contact plugs 164 in the second direction D2 may remain. The insulation structure 188*a* may connect sidewalls of the first contact plugs 164 adjacent to each other in the second direction D2. A line structure in which the first contact plug 164 and the insulation structure 188*a* are alternately and repeatedly disposed in the second direction D2 may have a shape extending in the second direction D2. An opening having a line shape extending in the second direction D2 may be formed between the line structures.

Referring to FIG. 55, an insulation spacer layer may be conformally formed on the line structure.

In example embodiments, the insulation spacer layer may include, e.g., silicon oxide. The insulation spacer layer may include a material the same as a material of the protective insulation layer, and thus the insulation spacer layer and the protective insulation layer may be treated as one layer.

The insulation spacer layer and the protective insulation layer may be anisotropically etched to form protective insulation layer patterns 186*a* and insulation spacers 170 on sidewalls of the first contact plugs 164.

Subsequently, the first sacrificial mold layer pattern 146 exposed by the bottom of the opening extending in the second direction D2 between the insulation spacers 170 may be selectively and anisotropically etched so as to expose the central portion of the active pattern 110 and upper portions of the gate mask 128 and the gate insulation pattern 122 adjacent the central portion of the active pattern 110. In the etching process, the second buffer layer 142 may not be etched.

Accordingly, a first opening 172 extending in the first direction D1 may be formed between the insulation spacers 170. The central portion of the active pattern 110, the second buffer layer 142, the gate mask 128 and the gate insulation pattern 122 may be exposed by the bottom of the first opening 172.

In example embodiments, the first opening 172 may include first portions having a first width W1 and second portions having a width greater than the first width W1. In the first opening 172, the first portion and the second portion may be alternately and repeatedly disposed.

As the insulation spacer 170 may be formed on the sidewall of the line structure extending in the second direction D2, a cusp may not be included in the sidewall of the second portion of the first opening 172 between the insulation spacers 170.

Thereafter, the same process as described with reference to FIGS. 41 to 50 may be performed to form a semiconductor device.

By way of summation and review, example embodiments provide a highly integrated semiconductor device. That is, in the semiconductor device according to example embodiments, the first contact structures may be electrically connected to at least of both edge portions of each of active patterns, respectively. The first contact structures may be disposed so as to be aligned in each of the first and second directions, and may be spaced apart from each other in each of the first direction and second directions. In addition, the bit line structure may be disposed in the opening extending in the second direction while exposing central portions of the active patterns. The bit line structure may be formed by a damascene process. Accordingly, the first contact structures and the bit line structure may be formed by a simple process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

active patterns on the substrate and spaced apart from each other to define active pattern rows in a first direction parallel to an upper surface of the substrate, the active pattern rows being spaced apart from each other in a second direction perpendicular to the first direction, and the active patterns extending in a third direction oblique with respect to the first direction and aligned in the third direction;

gate structures in recesses of the active patterns, each of the gate structures extending in the first direction;

first contact plugs electrically connected to opposite edge portions of each of the active patterns, respectively, the first contact plugs being spaced apart from each other in each of the first and second directions and aligned in each of the first and second directions;

first insulation spacers surrounding sidewalls of the first contact plugs, the first insulation spacers filling spaces between the first contact plugs in the second direction;

a bit line structure filling an opening extending in the second direction between the first insulation spacers, the bit line structure contacting central portions of the active patterns, wherein the bit line structure includes first portions having a first width and second portions having a second width greater than the first width, the first portions and the second portions being alternately and repeatedly arranged in the second direction; and a capacitor electrically connected to each of the first contact plugs.

2. The semiconductor device as claimed in claim 1, wherein the active patterns in each of the active pattern rows are aligned in the first direction.

3. The semiconductor device as claimed in claim 1, wherein:

the first contact plugs arranged in the second direction contact edges of different active patterns, respectively, and one of the first contact plugs contacting an upper edge of a corresponding one of the active patterns and another of the first contact plugs contacting a lower edge of a corresponding one of the active patterns are alternately and repeatedly arranged in the second direction.

4. The semiconductor device as claimed in claim 1, wherein a width of an upper surface of each of the first contact plugs in the second direction is greater than a width of an upper surface of each of the first contact plugs in the first direction.

5. The semiconductor device as claimed in claim 1, wherein a distance between adjacent ones of the first contact plugs in the first direction is greater than a distance between adjacent one of the first contact plugs in the second direction.

6. The semiconductor device as claimed in claim 1, wherein lower surfaces of the second portions of the bit line structure contact the central portions of the active patterns.

7. The semiconductor device as claimed in claim 1, wherein each of the second portions of the bit line structure includes a portion having a gradually increasing width, a portion having a widest width, and a portion having a gradually decreasing width.

8. The semiconductor device as claimed in claim 1, further comprising:

an isolation layer in an isolation trench between the active patterns;

a first buffer layer on the active patterns and the isolation layer;

a second buffer layer on the first buffer layer; and a sacrificial mold layer pattern passing through the first buffer layer and the second buffer layer, the sacrificial mold layer pattern contacting the isolation layer.

9. The semiconductor device as claimed in claim 8, wherein:

the first contact plugs pass through the first buffer layer, the second buffer layer, and the sacrificial mold layer pattern, and a width of a first contact plug that is positioned higher than the second buffer layer is different from a width of a second first contact plug that is positioned lower than the second buffer layer.

10. The semiconductor device as claimed in claim 1, further comprising a silicon pattern and a metal silicide pattern between each of the first contact plugs and a corresponding one of the active patterns.

11. The semiconductor device as claimed in claim 1, wherein two of the gate structures are spaced apart from each other and are arranged on a corresponding one of the active patterns.

12. The semiconductor device as claimed in claim 11, further comprising a dummy gate structure between the active pattern rows.

13. A semiconductor device, comprising:

a substrate;

active patterns on the substrate and spaced apart from each other to define active pattern rows in a first direction parallel to an upper surface of the substrate, the active pattern rows being spaced apart from each other in a second direction perpendicular to the first direction, and central portions of ones of the active patterns included in different ones of the active pattern rows being aligned in the second direction;

gate structures in recesses of the active patterns, each of the gate structures extending in the first direction;

first contact plugs electrically connected to opposite edge portions of the active patterns, respectively, the first contact plugs being spaced apart from each other in each of the first and second directions and aligned in each of the first and second directions;

first insulation spacers surrounding sidewalls of the first contact plugs, the first insulation spacers filling spaces between adjacent ones of the first contact plugs in the second direction;

a bit line structure filling an opening extending in the second direction between the first insulation spacers, the bit line structure contacting the central portions of the active patterns, the bit line structure including first portions having a first width and second portions having a second width greater than the first width, and the first portions and the second portions being arranged alternately and repeatedly in the second direction;

a landing pad pattern on an upper surface of each of the first contact plugs; and a capacitor on the landing pad pattern.

14. The semiconductor device as claimed in claim 13, wherein ones of the second portions of the bit line structure that face the first insulation spacer fill a space between adjacent ones of the first contact plugs in the second direction.

15. The semiconductor device as claimed in claim 13, wherein the first insulation spacers include at least one insulation material.

16. The semiconductor device as claimed in claim 13, wherein a spacing between ones of the gate structures that are on neighboring ones of the active patterns in a same one of the active pattern rows are different from a spacing between ones of the gate structures that are on neighboring ones of the active patterns in different neighboring ones of the active pattern rows.

17. A semiconductor device, comprising:

active patterns on a substrate;

first contact plugs electrically connected to at least portions of opposite edge portions of each of the active patterns, respectively, the first contact plugs being spaced apart from each other in each of a first direction and a second direction and aligned in each of the first direction and the second direction;

first insulation spacers surrounding sidewalls of the first contact plugs, the first insulation spacers filling spaces between the first contact plugs in the second direction;

a bit line structure filling an opening extending in the second direction between the first insulation spacers, the bit line structure including first portions having a first width and second portions having a second width greater than the first width, the first portions and the second portions being alternately and repeatedly arranged in the second direction, and the second portions of the bit line structure contacting central portions of the active patterns; and a capacitor electrically connected to each of the first contact plugs.

18. The semiconductor device as claimed in claim 17, wherein:

the bit line structure includes a bit line pattern and a capping layer pattern stacked on the bit line pattern, and an uppermost surface of the bit line structure is coplanar with uppermost surfaces of the first contact plugs.

19. The semiconductor device as claimed in claim 17, wherein each of the second portions of the bit line structure includes a portion having a gradually increasing width, a portion having a widest width, and a portion having a gradually decreasing width.

* * * * *